(12) United States Patent
Kanda et al.

(10) Patent No.: US 6,451,448 B1
(45) Date of Patent: Sep. 17, 2002

(54) SURFACE TREATED METALLIC MATERIALS AND MANUFACTURING METHOD THEREOF

(75) Inventors: Yuichi Kanda; Sin-ei Satoh; Shigenari Ohtake; Takeshi Suzuki; Hiroyuki Natume, all of Aizuwakamatsu (JP)

(73) Assignee: Mitsubishi Shindoh Co. Ltd., Tokyo (JP)

( * ) Notice: Subject to any disclaimer, the term of this patent is extended or adjusted under 35 U.S.C. 154(b) by 0 days.

(21) Appl. No.: 09/470,725

(22) Filed: Dec. 22, 1999

(51) Int. Cl.⁷ .......................... B32B 15/01; H01L 23/28
(52) U.S. Cl. .................. 428/612; 428/601; 428/613; 428/620; 428/626; 428/674; 428/687
(58) Field of Search .................. 428/612, 601, 428/613, 620, 626, 674, 687

(56) References Cited

U.S. PATENT DOCUMENTS

| | | | |
|---|---|---|---|
| 5,403,672 A | * | 4/1995 | Urasaki et al. |
| 5,492,595 A | * | 2/1996 | Carano et al. |
| 5,517,758 A | * | 5/1996 | Nakamura |
| 5,827,604 A | * | 10/1998 | Uno et al. |
| 5,861,076 A | * | 1/1999 | Adlam et al. |
| 5,976,762 A | * | 11/1999 | Takayanagi |
| 6,248,401 B1 | * | 1/2001 | Chiang et al. |
| 6,242,079 B1 | * | 6/2001 | Mikado et al. |

* cited by examiner

Primary Examiner—Deborah Jones
Assistant Examiner—Jason Savage
(74) Attorney, Agent, or Firm—Kolisch Hartwell Dickinson McCormack & Heuser

(57) ABSTRACT

A surface treated metallic material according to the present invention comprises a metallic substrate and a metallic compound layer formed thereon, wherein the entire surface of the metallic compound layer is covered with minute, upright, scaly protrusions. The width in the major axial direction of the scaly protrusions is between 0.05~0.5 $\mu$m and the thickness between 0.01~0.1 $\mu$m, and the thickness of the metallic compound layer is between 0.1~1.0 $\mu$m. The metallic compound layer incorporates one, or two or more of, the materials selected from the group consisting of chromium oxide, chromium hydroxide, niobium oxide, niobium hydroxide, rhodium oxide, rhodium hydroxide, vanadium oxide, vanadium hydroxide, palladium oxide, palladium hydroxide, nickel oxide, and nickel hydroxide. By using surface treated metallic materials of this type, bonding strength to a resin layer can be improved.

14 Claims, 46 Drawing Sheets

TREATMENT WITH SOLUTION CONTAINING STRONTIUM SULFATE (WORKING EXAMPLE 1)

×1000

TREATMENT WITH SOLUTION CONTAINING NO STRONTIUM SULFATE (COMPARATIVE EXAMPLE 1)

×1000

BLACK OXIDE FINISH TREATED ITEM
(COMPARATIVE EXAMPLE 2)

×1000

(1) LESS THAN 0.1 μm
(PLATING FILM IRREGULARITIES)

RESIN ADHESION POOR (2) 0.1 μm ~ 0.2 μm

RESIN ADHESION GOOD (3) 0.2 μm ~0.3 μm

RESIN ADHESION GOOD (4) 0.3 μm ~0.4 μm

RESIN ADHESION GOOD (5) 0.4 μm ~0.5 μm

RESIN ADHESION FAIRLY GOOD (6) 0.5 μm AND ABOVE

RESIN ADHESION POOR
(PLATING FILM PEEL)

SURFACE TREATED METALLIC MATERIALS AND MANUFACTURING METHOD THEREOF

BACKGROUND OF THE INVENTION

1. Field of the Invention

The present invention relates to surface treated metallic materials and a manufacturing method thereof, used in electronic and electrical components, which offers improved adhesion between a substrate such as an electronic or electrical component in which at least the surface is metallic, and a resin, wherein the improved adhesion is achieved by forming on the surface of the substrate a metallic compound layer comprising a mesh of minute cracks, or a scaly or squamate metallic compound layer formed from a plurality of upright protrusions.

2. Description of the Related Art

In electronic and electrical components such as lead frames, printed circuit boards, and fixed configurations of semiconductor elements and radiators, many bonding interfaces exist between metals and resins, and this type of bonding interface has been prone to peeling. Particularly in those cases where thermosetting resins such as epoxy resins and polyimide resins or thermoplastic resins with high molding temperatures are used, because the entire component needs to be exposed to high temperatures of 200~300° C. in order to mold the resin, if the adhesion between the resin and the metallic surface is poor then water adsorbed into the surface of the metal can expand aiding the separation of the resin from the metallic surface, and the resin may crack and air bubbles called blisters form, which not only lowers the corrosion resistance of the inner component, but can also damage the elemental structure inside the component. Consequently, improving the adhesion between metal and resin is extremely important in the production of reliable electronic and electrical components.

Using mechanical means to form holes in, or roughen the surface of the metal is an effective technique for improving the adhesion between metal and resin, but this type of mechanical processing is very expensive. Consequently, a variety of experiments have been conducted into surface treatments of particularly the metal surface in order to improve resin adhesion.

One such surface treatment is known as "black oxide finish", and can only be used on copper and copper alloys. In order to create a black oxide finish, a metallic component of copper or a copper alloy is immersed in a strongly alkali solution and boiled, which generates minute fibrous deposits uniformly across the surface of the metallic component, making the surface appear velvet-like. The fibrous deposits are cuprous oxide, and forming a resin layer on to the thus treated metallic surface produces greater bonding strength than that observed in the case of untreated metal.

However the treated surface obtained through black oxide finish treatment lacks durability, and the bonding strength with resin decreases over time, or on heat treatment. Furthermore, if the resin used is a particularly hard resin such as PEEK (polyether ether ketone) then the fibrous deposits on the treated surface are broken down leading to peeling of the resin layer. Because of these problems, black oxide finish treatment can not be used on valuable precision components or when high levels of reliability are required.

Other treatment methods also exist for improving the adhesion of the metal and resin. For example in Japanese Patent Application, First Publication No. Hei-9-209167 a technique is disclosed whereby in order to increase the adhesion between a metallic parent material and a molded resin, the parent material is first immersed in a solution incorporating hexavalent chromic acid, resulting in the formation of a thin oxide film incorporating trivalent chromium on the parent material surface. The plating solution disclosed in the documentation comprised for example 1~10% $CrO_3$ and 0.1~1% of sulfuric acid or nitric acid, and a copper plate was immersed in the plating solution at 20~50° C. for a period of 10~60 seconds, without passing any current through the solution, to form the oxide film. It was disclosed in the documentation that if the immersion time was greater than 60 seconds then the oxide film became too thick. Further experiments by the inventors of the present invention revealed that the oxide film formed under the above conditions had a smooth surface.

Furthermore in Japanese Patent Application, First Publication No. Hei-9-172125 a technique is disclosed whereby in order to improve the adhesion between a lead frame and a resin package, a chromium/zinc mixture in which the zinc:chromium ratio was greater than approximately 4:1 was formed on the surface of the lead frame. The thickness of the mixture film should preferably be 10~1000 angstroms, with layers of thickness 40~80 angstroms (0.04~0.08 $\mu$m) being most desirable. The treatment solution detailed in the documentation incorporates hydroxide ions, 0.07~7 g/l zinc ions, and 0.1~100 g/l of a hexavalent chromium salt, and the lead frame is electroplated in this solution to generate the surface film. Further experiments by the inventors of the present invention revealed that a film of thickness 0.04~0.08 $\mu$m formed under the above conditions was quite fine and had a smooth surface, and did not display very good bonding strength to resin.

SUMMARY OF THE INVENTION

Following much research into surface treatment methods for metallic plates the inventors of the present invention discovered that the addition of a strontium salt to a chrome plating solution resulted in the formation of a layer with a previously unknown, unusual surface structure. The layer is thicker than either of the two films described above and has a fine mesh pattern of cracks on the surface. Common sense would suggest that when such cracks are formed the sections surrounding the cracks would peel away like scales, but the experiments by the inventors showed that the cracked surface was resistant to peeling from the metal surface, and moreover displayed a large increase in bonding strength on binding to a resin.

The present invention is based on the above findings, and aims to provide surface treated metallic materials and electronic and electrical components which display good adhesion to resin.

In order to achieve the above aim, a surface treated metallic material according to the present invention comprises a substrate in which at least the surface thereof is made of metal, and a metallic compound layer which is formed on at least a portion of the substrate surface, wherein a mesh pattern of minute cracks is formed across the entire surface of the metallic compound layer.

With the present invention, because the surface of the metallic compound layer positioned between the metallic substrate and the resin adhesive layer is formed of a fine mesh of cracks, a portion of the resin adhesive layer flows down into the cracks creating an anchoring effect and binding the two layers strongly together. Consequently, it is possible to markedly improve the bonding strength between the metallic compound layer and the resin adhesive layer.

Furthermore, in a manufacturing method of a surface treated metallic material according to the present invention, a substrate in which at least the surface thereof is made of metal is brought in contact with a plating solution incorporating a strontium salt and either one, or two or more of, the materials selected from the group consisting of chromic acid, niobic acid, rhodic acid, vanadic acid, palladic acid, nickelic acid, and the various salts thereof, and where by subsequently passing a current through the plating solution and making the surface of the substrate the cathode, a metallic compound layer, the entire surface of which is covered by a mesh of minute cracks, is formed on the surface of the substrate.

Moreover, an electronic or electrical component according to the present invention is provided with a surface treated metallic material, which comprises a substrate in which at least the surface thereof is made of metal, and a metallic compound layer which is formed on at least a portion of the substrate surface and in which a mesh pattern of fine cracks is formed across the entire surface thereof, and with a resin layer which is formed on top of the metallic compound layer.

The inventors also discovered that by using a plating solution incorporating one, or two or more of, the materials selected from the group consisting of chromic acid, niobic acid, rhodic acid, vanadic acid, palladic acid, nickelic acid, and the various salts thereof, and then carrying out electroplating at a higher cathode current density than normal, a plurality of upright protrusions in a scale like pattern were formed on the surface of the layer generated. Common sense would suggest that when such scaly protrusions are formed the protrusions would peel away like scales, but the experiments by the inventors showed that the scaly protrusions were resistant to peeling from the metal surface, and moreover displayed a large increase in bonding strength on binding to a resin.

A second surface treated metallic material according to the present invention comprises a substrate in which at least the surface thereof is made of metal, and a metallic compound layer which is formed on at least a portion of the substrate surface, wherein a scale like pattern of a plurality of upright protrusions is formed on the surface of the metallic compound layer.

With such a surface treated metallic material, because the surface of the metallic compound layer positioned between the metallic substrate and the resin adhesive layer is formed of fine scale like protrusions, a portion of the resin adhesive layer flows down inside the scale like protrusions creating an anchoring effect and binding the two layers strongly together. Consequently, it is possible to markedly improve the bonding strength between the metallic compound layer and the resin adhesive layer.

Moreover the second surface treated metallic material according to the present invention can also be formed comprising a substrate in which at least the surface thereof is made of copper or a copper alloy, a chromium compound layer which is formed on at least a portion of the substrate surface, and an intermediate layer incorporating copper and chromium which is formed between the chromium compound layer and the substrate, wherein a scale like pattern of a plurality of upright protrusions of the chromium compound is formed on the surface of the chromium compound layer.

In a manufacturing method of the second surface treated metallic material according to the present invention, a substrate in which at least the surface thereof is made of metal is brought in contact with a plating solution incorporating one, or two or more of, the materials selected from the group consisting of chromic acid, niobic acid, rhodic acid, vanadic acid, palladic acid, and the various salts thereof, and by passing a current of cathode current density of 2~20 A/dm$^2$ through the plating solution and making the surface of the substrate the cathode, a metallic compound layer, the entire surface of which is covered by a mesh of fine scale like protrusions, is formed on the surface of the substrate.

Furthermore, in another manufacturing method, a substrate in which at least the surface thereof is made of metal is brought in contact with a plating solution incorporating nickelic acid, and by passing a current of cathode current density of 0.01~10 A/dm$^2$ through the plating solution and making the surface of the substrate the cathode, a metallic compound layer, the entire surface of which is covered by a mesh of fine scale like protrusions, is formed on the surface of the substrate.

Another electronic or electrical component according to the present invention is provided with a surface treated metallic material, comprising a substrate in which at least the surface thereof is made of metal, and a metallic compound layer which is formed on at least a portion of the substrate surface and in which a scale like pattern of a plurality of upright protrusions is formed across the surface thereof, and with a resin layer which is formed on top of said metallic compound layer.

DESCRIPTION OF THE PREFERRED EMBODIMENTS

As follows is a detailed description of embodiments of the present invention.

[Embodiments which Utilize a Metallic Compound Layer Comprising Minute Cracks]

Figure 1:
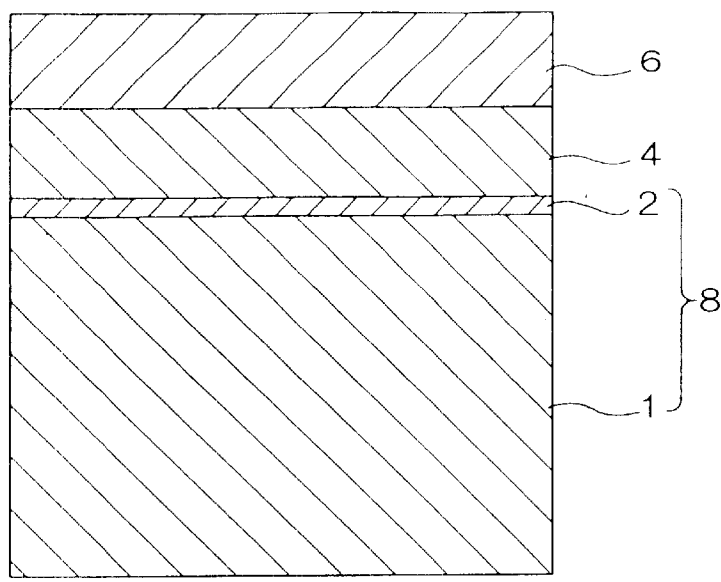
FIG. 1 is a cross-sectional view showing a metallic laminate as an embodiment of a surface treated metallic material according to the present invention.

FIG. 1 shows a cross-sectional view of a metallic laminate used in printed circuit boards as an embodiment of a surface treated metallic material according to the present invention. The metallic laminate comprises a surface treated metallic material 8, which is made up of a metallic substrate 1 and a metallic compound layer 2 which is formed on the surface of the metallic substrate 1 by plating, and a metallic foil 6 which is adhered to the top of the surface treated metallic material 8 via a resin adhesive layer 4. The main characteristic of the present invention is the metallic compound layer 2.

Figure 6:
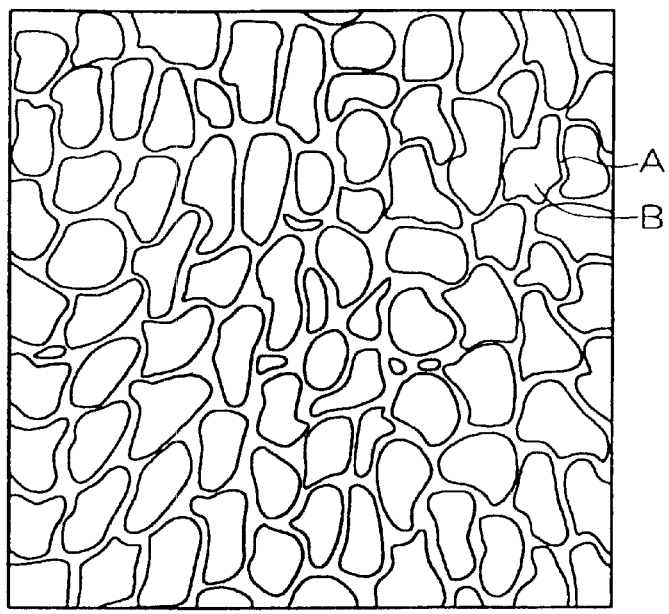
FIG. 6 is a plan view showing an enlarged schematic representation of an example of the surface conditions of a metallic compound layer of a surface treated metallic material according to the present invention.
Figure 7:
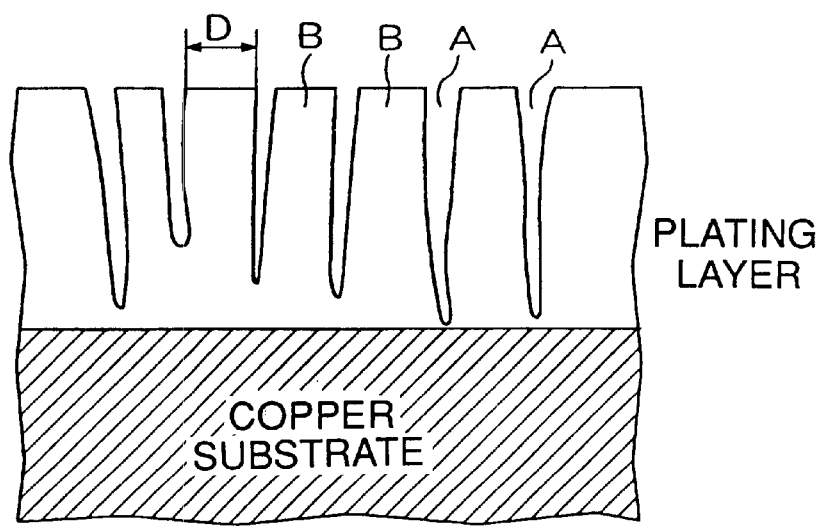
FIG. 7 is a cross-sectional view showing an enlarged schematic representation of an example of the surface conditions of a metallic compound layer of a surface treated metallic material according to the present invention.

The metallic compound layer 2 of this embodiment is a layer of uniform thickness in which the entire surface thereof is covered in a mesh pattern (or tortoise shell pattern) of minute cracks (or fissures, grooves, channels). FIGS. 6 and 7 are a plan view and a cross-sectional view respectively which show the typical appearance of the cracks, with each crack A spreading out in a mesh pattern and encircling insular sections B, where the size (the diameter in the plane of the surface) of the insular sections B, although varying, remains approximately constant. Furthermore, it is preferable that the majority of each crack A (greater than 90% for example) does not penetrate through the metallic compound layer 2 formed by plating, and hence does not reach the metallic substrate 1. If large quantities of the cracks A penetrate through the metallic compound layer 2 then the likelihood increases of each insular section B of the metallic compound layer 2 peeling away from the metallic substrate, resulting in a relative decrease in the adhesive strength of the resin adhesive layer 4.

The formation in this manner of a plurality of minute cracks A, means a portion of the resin adhesive layer 4 will flow into the cracks A creating an anchoring effect and strengthening the adhesion to the metallic compound layer 2. Moreover, because the cracks A do not penetrate through the metallic compound layer 2, the insular sections B which become adhered to the resin adhesive layer 4 will not peel away individually from the metallic substrate 1, ensuring that the anchoring effect is realized at the maximum possible strength. Moreover in addition to the anchoring effect, metallic compound layers 2 of the composition described below display naturally very good adhesion between the metallic compound layer 2 and the resin adhesive layer 4, as well as between the metallic compound layer 2 and the metallic substrate 1, meaning an even greater overall bonding strength is possible.

The average diameter of the insular sections B enclosed by the mesh pattern of cracks A is not necessarily limited to any particular value, but diameters of less than 20 µm are preferable, with values between 1~15 µm being more desirable, and values between 3~10 µm the most suitable. At diameters of less than 1 µm it becomes difficult to significantly improve the adhesive strength of the resin adhesive layer, while at diameters greater than 20 µm the insular sections B are more likely to peel off the metallic substrate 1. The average value for the diameter of the insular sections B is calculated by drawing a straight line of fixed length across the electron microscope photograph, taking all those insular sections B which are intersected by the straight line, and then measuring and averaging the maximum width across the insular sections in a direction parallel with the straight line. The length of the straight line used was set at 5 mm (hereunder the average diameter of the insular sections is referred to as the mesh average diameter).

The thickness of the metallic compound layer 2 is not necessarily limited to any particular value, but values between 0.1~3 $\mu$m are preferable, with values between 0.1~1 $\mu$m being more desirable, and thickness values between 0.2~0.5 $\mu$m being most suitable. At metallic compound layer 2 thickness values less than 0.1 $\mu$m the cracks formed are of insufficient depth and it becomes difficult to significantly improve the adhesive strength of the resin adhesive layer, whereas at thickness values greater than 3 $\mu$m the cracks become rough and overly deep and the likelihood increases of the insular sections B peeling away from the metallic substrate 1. To some extent, the thickness of the metallic compound layer 2 and the average diameter of the insular sections display a positive correlation.

The material of the metallic compound layer 2 should preferably incorporate one, or alternatively two or more of the group consisting of chromium oxide, chromium hydroxide, niobium oxide, niobium hydroxide, rhodium oxide, rhodium hydroxide, vanadium oxide, vanadium hydroxide, palladium oxide, palladium hydroxide, nickel oxide, and nickel hydroxide, to which has been added a small quantity of strontium. It is assumed that the oxides and hydroxides which can be used for the metallic compound layer 2 are actually a mix of the two compounds in an indeterminate ratio.

The composition of the oxides and hydroxides should preferably be one of the following.

| | | |
|---|---|---|
| chromium oxide: | $Cr_{1-5}O_{1-12}$ | chromium hydroxide: $Cr(OH)_{1-6}$ |
| niobium oxide: | $Nb_{1-2}O_{1-5}$ | niobium hydroxide: $Nb(OH)_{2-5}$ |
| rhodium oxide: | $Rh_{1-2}O_{1-3}$ | rhodium hydroxide: $Rh(OH)_{1-4}$ |
| vanadium oxide: | $V_{1-8}O_{1-15}$ | vanadium hydroxide: $V(OH)_{1-5}$ |
| palladium oxide: | $PdO_{1-12}$ | |
| palladium hydroxide: | $Pd(OH)_2$ or $Pd(OH)_4$ | |
| nickel oxide: | $Ni_{1-2.0}O_{1.0-3.0}$ | |
| nickel hydroxide: | $Ni(OH)_{1-3}$ | |

The amount of metal oxide and metal hydroxide incorporated into the metallic compound layer 2 should preferably be in the range 30~70% by weight of the entire layer, with values between 40~50 wt % being even more desirable. The amount of strontium incorporated should preferably be in the range 0.01~1 wt %, with values between 0.1~0.5 wt % being even more desirable. It is assumed that strontium will be incorporated as an oxide. If the amount of strontium incorporated falls below 0.01 wt % then the desired cracks do not form, whereas at concentrations greater than 1 wt % abnormalities appear in the appearance of the micro cracks.

From both cost and ease of formation considerations, metallic compound layers 2 incorporating a chromium oxide and a very small amount of strontium are particularly desirable. Commercially available black chrome plating solutions such as "Econo Chrome BK", a brand name of Meltech Corporation; "B-400", a brand name of Ebara U. G. Light Corporation; and the "M&T Chrome BC" series, a brand name of Atotech Japan Corporation can be used as the chromium oxide, with a strontium salt then being added to form the metallic compound layer 2. Strontium salts are not incorporated in normal black chrome plating solutions.

From an industrial view point, particularly suitable materials for the metallic substrate 1 are as follows (this list includes trademarks): pure copper, 36~52 Ni—Fe alloy (particularly 42 alloy), OFC (C1020) alloy, phosphor deoxidation copper, C194 (TAMAC194) alloy, TAMAC4 alloy, TAMAC2 alloy, MSP1 alloy, OMCL1 alloy, TAMAC15 alloy, C151 alloy, brass (such as Cu—Zn alloy C2600), phosphor bronze (such as C5191), tough pitch copper, and stainless steel. Phosphor bronze has an electric conductivity of only 17~18%, but offers the benefits of being easy to draw or press. Typically materials with electric conductivity ratios EC of greater than 60% relative to pure copper are preferable.

Furthermore, other preferred materials for the metallic substrate 1 include compositions of oxygen free copper or phosphor deoxidation copper containing 0.005~0.05% phosphorus to which have been added a total of 0.01~2.5 wt % of one, or a combination of two or more of the elements from the group consisting of iron, chromium, nickel, silver, zinc, tin, aluminium, lead, magnesium, terbium, zirconium, boron, and titanium. Being particularly strong, metallic substrates 1 of this type of composition are useful in the miniaturization of and reduction in thickness of electronic and electrical components, and the ease of the surface treatment is another advantage.

There are no particular restrictions on the material used for the resin adhesive layer 4, although typical examples of resins used with electronic and electrical components include polyimide resins (adhesives), epoxy resins (adhesives), polyether ether ketone (PEEK), phenol type resins, and polyester resins. Of these, polyimide resins and epoxy resins are particularly widely used, and indeed adhere well to items of the present invention. There are no restrictions on the thickness of the resin adhesive layer 4, but in the case of metallic laminates used in applications such as printed circuit boards, typical thickness values are between 0.01~3.2 mm.

The metallic foil 6 is partially dissolved by a technique such as etching and becomes the wiring sections of the printed circuit. Typically, copper or a copper alloy is used for the metallic foil, although other metals may also be used. Copper alloys such as those described above for the metallic substrate 1 are suitable.

Next is a description of a manufacturing method of the metallic compound layer 2. To form the metallic compound layer 2, a substrate 1 in which at least the surface thereof is made of metal is brought in contact with a plating solution incorporating a strontium salt and either one, or two or more of, the materials selected from the group consisting of chromic acid, niobic acid, vanadic acid, rhodic acid, palladic acid, nickelic acid, and the various salts thereof, and a current is passed between the cathode at the surface of the substrate 1 and an anode immersed in the plating solution. By so doing, a metallic compound layer 2 of an oxide and/or a hydroxide which comprises as the main constituent chromic acid, niobic acid, vanadic acid, rhodic acid, palladic acid or nickelic acid is deposited on the surface of the substrate 1, and by halting the electric current at a point where a suitable layer thickness has been achieved and then washing the metallic substrate 1, a surface treated metallic material 8 is obtained.

Figure 8:
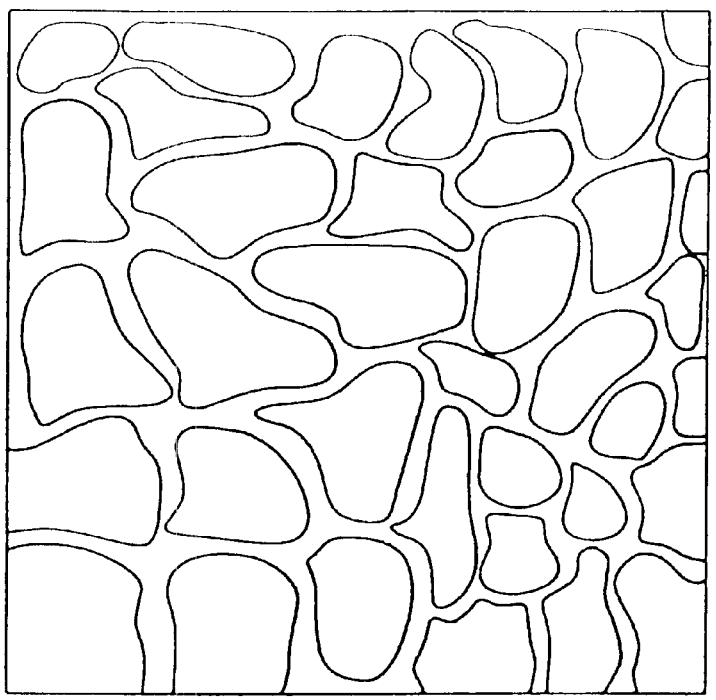
FIG. 8 is a plan view showing an enlarged schematic representation of an example of the surface conditions of a metallic compound layer obtained using a plating solution containing no strontium salt.
Figure 9:
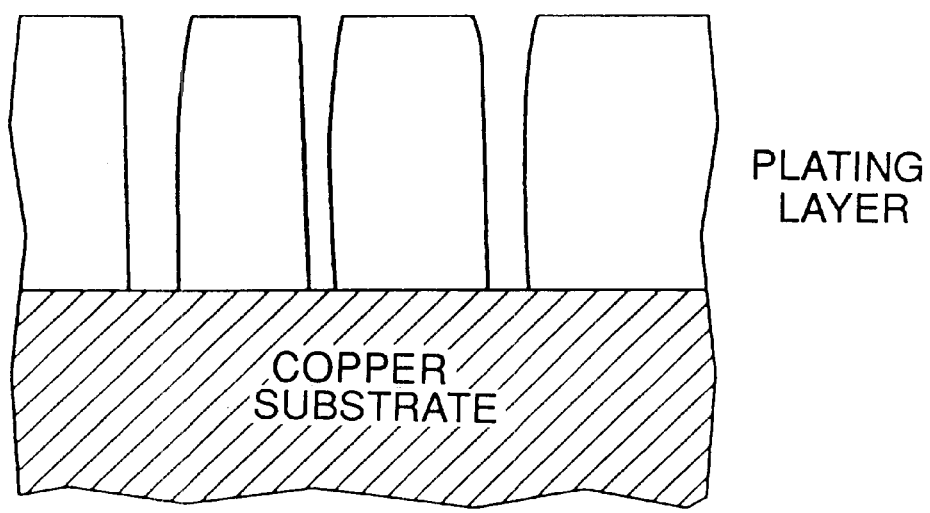
FIG. 9 is a cross-sectional view showing an enlarged schematic representation of an example of the surface conditions of a metallic compound layer obtained using a plating solution containing no strontium salt.

The addition of a strontium salt to the plating solution is a new technique discovered by the inventors which enables the generation, on the surface of the deposited metallic compound layer 2, of minute cracks which fulfill the conditions described above. If a metallic compound layer is generated with plating techniques using the plating solution described above but without the addition of a strontium salt, then as shown in FIG. 8, if a considerably thick metallic compound layer is formed then cracks do appear in the metallic compound layer, but the cracks thus formed are far more coarse, and far deeper than those obtained with the present invention, and have a tendency to penetrate right through the metallic compound layer to the metallic substrate, as shown in FIG. 9. Consequently the insular sections peel away easily, making the large increase in resin adhesion observed with the present invention unobtainable. Moreover, an additional problem arises in that because the cracks are large and plating solution can sometimes remain inside the cracks, when the product is heated to form the resin layer there is an increased likelihood of gas being generated resulting in the formation of blisters. Hence, by adding a strontium salt to the plating solution it is possible to form a thin metallic compound layer 2 with minute cracks which is very effective in increasing adhesive strength.

Because the metallic compound layer 2 is formed by electroplating there are no particular restrictions on the material for the metallic substrate 1 provided at least the surface of the substrate is made of a metal such as nickel, iron, aluminium, titanium, copper, or an alloy thereof. The internal portion of the substrate can be made of a non-conductive material such as a resin or a ceramic. In contrast, with techniques such as black oxide finishing, the surface of the substrate undergoes a chemical reaction, thus limiting the types of substrate which can be used. The fact that there are no restrictions on the type of substrate is another advantage of the present invention.

Specific examples of the composition of the plating solution are as follows. Note however, that the plating solution is in no way limited to the examples shown.

[Chromium Oxide Plating Solution]

1. Anhydrous Chromic Acid: 400 g/l
   acetic acid (99%): 50 ml/l
   sodium dichromate: 40 g/l
   boric acid: 0.5 g/l
   sodium nitrate: 2 g/l
   sodium silicofluoride: 5 g/l
   strontium sulfate: 0.5 g/l
2. "EconoChrome BK" (brand name of Meltech Corporation): 450 g/l
   strontium sulfate: 0.5 g/l
3. anhydrous chromic acid: 400 g/l
   acetic acid (99%): 50 ml/l
   sodium dichromate: 40 g/l
   strontium sulfate: 0.5 g/l
4. "M&T Chrome BC-35J" (brand name of Atotech Japan Corporation): 450 g/l
   "M&T Chrome BC-37J" (also from Atotech Japan): 15 ml/l
   "M&T Chrome BC-39J" (also from Atotech Japan): 8 ml/l
   "M&T Chrome BC-40J" (also from Atotech Japan): 10 ml/l
   barium carbonate: 10 g/l
   strontium sulfate: 0.5 g/l Furthermore, preferred plating conditions are as follows.
   cathode current density: 5~50 A/dm$^2$ with values between 10~12 A/dm$^2$ being even more desirable
   plating temperature: 20~25° C., room temperature
   stirring: yes The plating time period will vary depending on the other parameters, but is usually in the order of 180 seconds. If the cathode current density or the plating temperature deviate outside the aforementioned ranges then changes will also occur in the formation appearance of the cracks.

Plating solutions for forming niobium oxide (hydroxide), rhodium oxide (hydroxide), vanadium oxide (hydroxide), palladium oxide (hydroxide), or nickel oxide are generated by replacing the chromic acid (or salt thereof) of each of the aforementioned plating solutions 1~4 with niobic acid (or salt thereof), rhodic acid (or salt thereof), vanadic acid (or salt thereof), palladic acid (or salt thereof), or nickelic acid (or salt thereof) respectively. The plating conditions remain the same. Furthermore if required, a number of different acids can be selected from the group consisting of chromic acid, niobic acid, rhodic acid, vanadic acid, palladic acid and nickelic acid, and then mixed together appropriately.

The metallic compound layer immediately following formation using a chromium oxide plating solution, can strictly speaking be considered to be of a three layer construction comprising in order from closest to the metallic substrate 1, an extremely thin layer of an alloy between the metal of the substrate and chromium, an extremely thin layer of metallic chromium, and a layer of a compound $Cr(OH)_{1.1\sim2.1}O_{2.0\sim3.0}$ of indeterminate ratio incorporating chromium hydroxide and chromium oxide. It is thought that similar layered structures are formed in the cases of niobium, rhodium, palladium and nickel. In all cases if the outermost layer of the metallic compound layer incorporates hydroxyl groups, then during heating in the formation of the resin adhesive layer 4 there is the possibility of steam generation resulting in the formation of blisters and other problems. Consequently, it is preferable to carry out a dehydration treatment by preheating the metallic compound layer following the plating step and converting any hydroxides to oxides.

An example of the conditions for the dehydration treatment would involve heating the metallic substrate 1 and the covering metallic compound layer 2 at a temperature of 70~90° C. for a period of 4~6 hours. At temperatures lower than 70° C. insufficient dehydration occurs, whereas at temperatures greater than 90° C. there is a danger of exposed portions of the surface of the metallic substrate 1 becoming discolored. By conducting the heating under reduced pressure it is possible to reduce the heating time period.

In those cases where the metallic compound layer 2 is to be formed on only one portion of the surface of the metallic substrate 1, those sections of the surface of the metallic substrate 1 which are not to be plated can be masked during the plating process with standard masking agents, or alternatively, the metallic compound layer 2 can be formed across the entire surface of the metallic substrate 1 and then subsequently partially etched using an aqueous solution of any of the common acids.

Because there are large numbers of minute cracks on the metallic compound layer 2, the cracks should preferably be first immersed in ethyl alcohol containing a silane coupling agent, and then following subsequent drying, masked using resist techniques, for example. Etching should then be carried out using a conventional etching apparatus, or the aforementioned etching solution.

With a metallic laminate of the above construction, because the surface of the metallic compound layer 2 is formed of a mesh of minute cracks, a portion of the resin adhesive layer 4 flows down into the cracks creating an anchoring effect and binding the two layers strongly together. Moreover in addition to the anchoring effect, because metallic compound layers 2 of the composition described above display naturally very good adhesion to the resin adhesive layer 4, it is possible to increase markedly the bonding strength between the metallic compound layer 2 and the resin adhesive layer 4.

Moreover in addition to markedly increasing the bonding strength of the resin layer 4, metallic compound layers 2 of the above construction will not cause blisters in the resin adhesive layer 4 due to the low amounts of moisture adsorption. Furthermore, during the formation of the resin adhesive layer 4, depending on the material of the resin adhesive layer 4, the metallic compound layer can be exposed to temperatures as high as 400° C., and the fact that the physical properties of the metallic compound layer 2 do not vary even at these high temperatures is indicative of the superior heat resistance of the layer.

Figure 2:
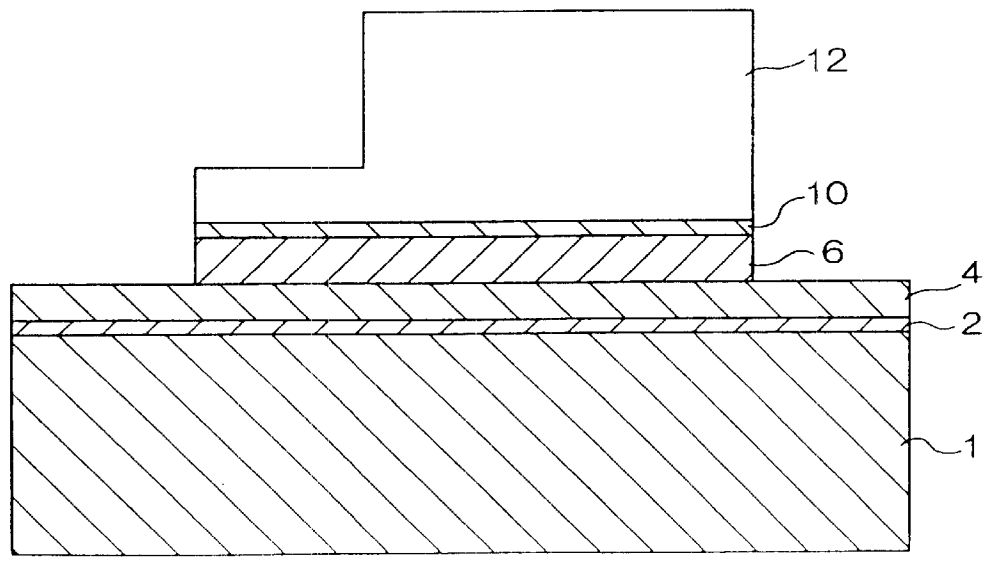
FIG. 2 is a cross-sectional view showing an example of an electrical element which utilizes the aforementioned metallic laminate.

A specific example of the laminated substrate of FIG. 1 is shown in FIG. 2. In FIG. 2, a metallic foil 6 has undergone partial etching to form a circuit pattern, and a power transistor 12 is fixed via a solder layer 10 to a portion of the metallic foil 6 which makes up the circuit pattern.

Figure 3:
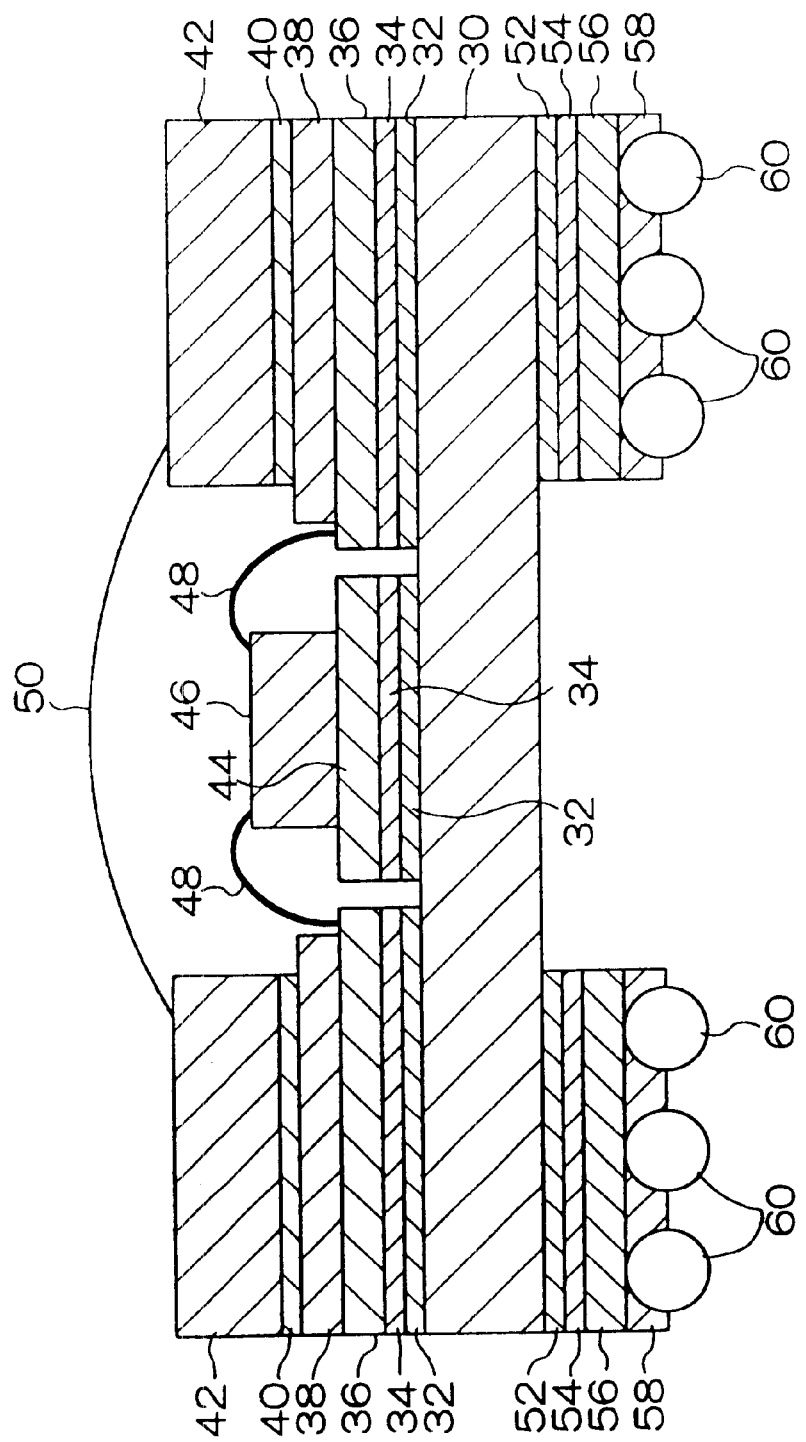
FIG. 3 is a cross-sectional view showing a semiconductor element as another embodiment of an electronic or electrical component of the present invention.

FIG. 3 is a cross-sectional view showing a double sided semiconductor element (ball grid array (BGA)) as another embodiment of an electronic or electrical component according to the present invention. Numeral 30 refers to a metallic substrate made of the same material as the aforementioned metallic substrate 1, and a metallic compound layer 32 made of the same material as the metallic compound layer 2, and a resin adhesive layer 34 made of the same material as the resin adhesive layer 4 are formed sequentially on the upper surface of the metallic substrate 30, with leads 36, 44 made of the same material as the metallic foil 6 being formed on the top of the resin adhesive layer 34. The metallic compound layer 32, the resin adhesive layer 34 and the leads 36, 44 are etched to create a predetermined wiring pattern.

A semiconductor chip 46, made of silicon for example, is fixed to the top of the centrally located lead 44, and each of the terminals of the semiconductor chip 46 is wire bonded to one of the leads 36 with a fine bonding wire 48 made of a material such as gold. Furthermore, a solder resist 38 is formed on top of each lead 36, with a square frame stiffener 42 made of resin fixed to the top of the solder resist 38 via a resin adhesive layer 40. By filling the area inside the stiffener 42 with a potting resin (sealing resin) 50, the semiconductor chip 46 is sealed.

In addition a metallic compound layer 52 made of the same material as the metallic compound layer 2, and a resin adhesive layer 54 made of the same material as the resin adhesive layer 4 are also formed sequentially on the lower surface of the metallic substrate 30, with leads 56 made of the same material as the metallic foil 6 being formed on the lower surface of the resin adhesive layer 54. The metallic compound layer 52, the resin adhesive layer 54 and the leads 56 are etched to create a predetermined wiring pattern.

Furthermore, a solder resist 58 which has holes in predetermined locations is formed on the lower surface of the leads 56, and a series of solder balls 60 are formed in locations corresponding with the holes. Each of the solder balls 60 is connected to a terminal of the semiconductor chip 46 via the leads 56, 36 and the bonding wires 48. The leads 56, 36 are connected by wiring not shown in the diagram, which penetrates through the thickness of the substrate.

In the embodiment of FIG. 3, by forming metallic compound layers 32, 52 which comprise minute cracks, the bonding strength of the resin adhesive layers 34, 54 can be increased, making it possible to improve the reliability of the semiconductor element.

Figure 4:
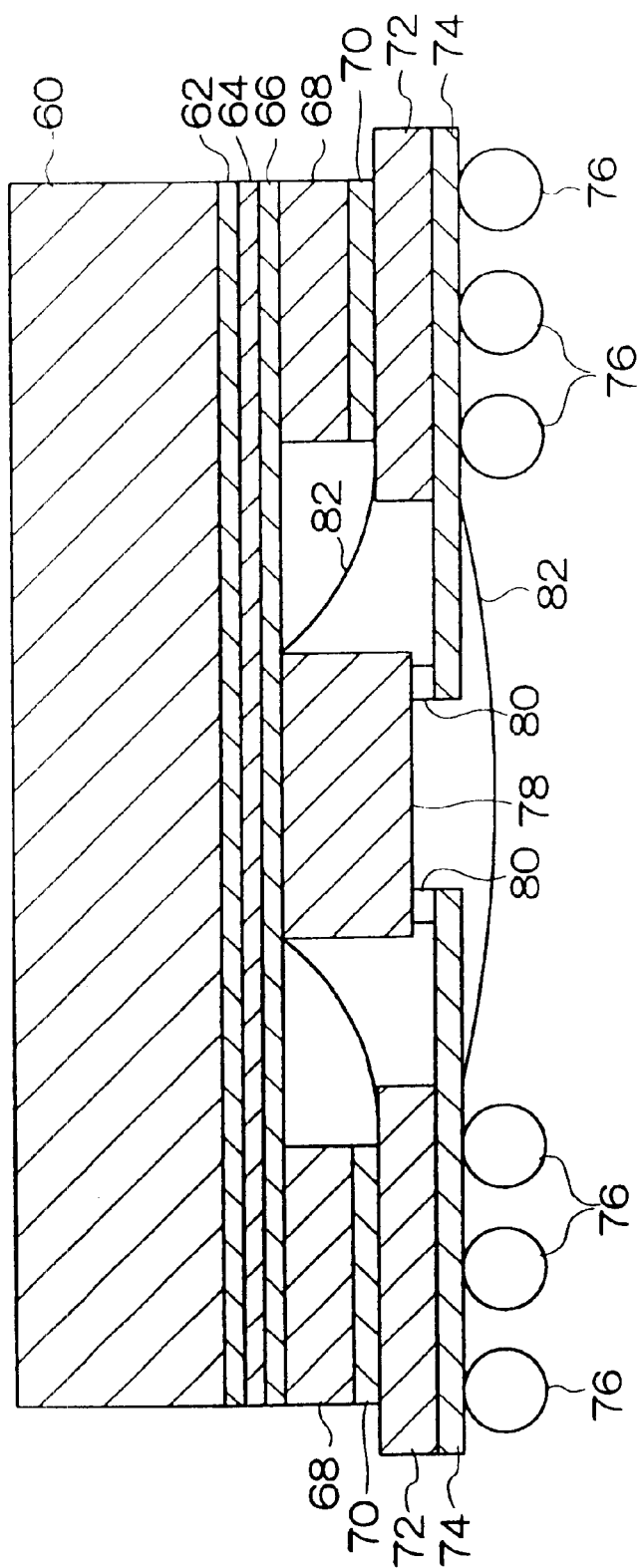
FIG. 4 is a cross-sectional view showing a semiconductor element as yet another embodiment of an electronic or electrical component of the present invention.

FIG. 4 is a cross-sectional view showing a semiconductor element of single sided construction (ball grid array (BGA)) as yet another embodiment of an electronic or electrical component according to the present invention. Numeral 60 refers to a metallic substrate made of the same material as the aforementioned metallic substrate 1, and a metallic compound layer 62 made of the same material as the metallic compound layer 2, and a resin adhesive layer 64 made of the same material as the resin adhesive layer 4 are formed sequentially on the lower surface of the metallic substrate 60, with a metallic layer 66 made of the same material as the metallic foil 6 being formed on the lower surface of the resin adhesive layer 64. A semiconductor chip 78 is soldered to the central area of the lower surface of the metallic foil 66, a resin stiffener 68 is bonded to the external perimeter of the metallic foil 66, and a TAB tape 72 is bonded with an adhesive 70 to the lower surface of the stiffener 68. A plurality of leads 74 made of copper foil are fixed to the lower surface of the TAB tape 72, and a solder ball 76 is formed on each of the leads 74. The inner perimeter tips of the leads 74 are bonded to one of the terminals of the semiconductor chip 78 via bumps 80. Then, by filling the area inside the stiffener 68 with a potting resin (sealing resin) 82, the semiconductor chip 78 is sealed.

In this type of embodiment, as was the case above, by forming a metallic compound layer 62 which comprises minute cracks, the bonding strength of the resin adhesive layer 64 can be increased, making it possible to improve the reliability of the semiconductor element.

Figure 5:
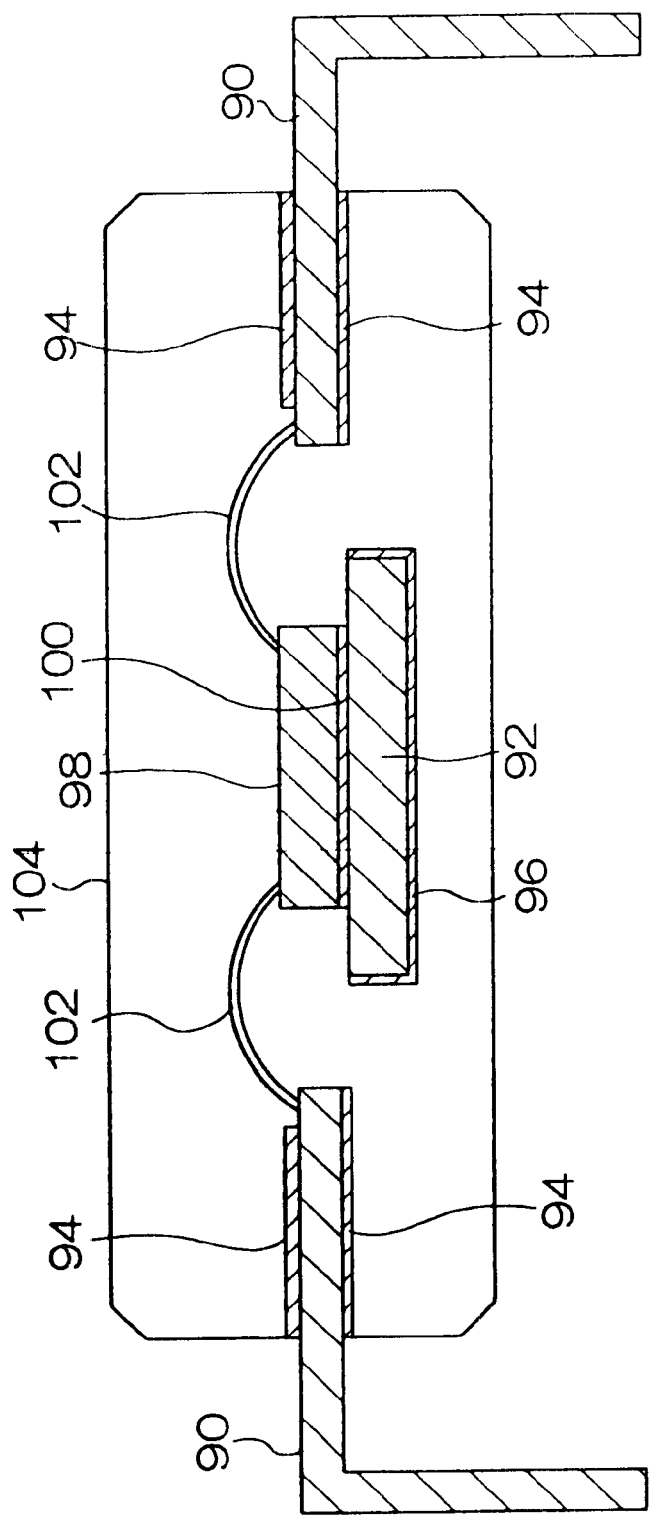
FIG. 5 is a cross-sectional view showing an integrated circuit element as yet another embodiment of an electronic or electrical component of the present invention.

FIG. 5 is a cross-sectional view showing an integrated circuit element (IC, LSI) as yet another embodiment of an electronic or electrical component according to the present invention. Numeral 90 refers to leads made of the same material as the aforementioned metallic substrate 1, and the internal tips of the leads 90 are each covered by a metallic compound layer 94 made of the same material as the metallic compound layer 2. Furthermore, a chip fastening section 92 made of the same material as the leads 90 is located in the area enclosed by the leads 90, with a metallic compound layer 96 of the same material as the metallic compound layer 94 being formed on the lower surface of the chip fastening section 92. A semiconductor chip 98 is fixed via a solder layer 100 to the upper surface of the chip fastening section 92, and a plurality of terminals on the upper surface of the semiconductor chip 98 are connected to the inner perimeter tips of the leads 90 with bonding wire 102. The wire bonded section of each lead 90 is not covered with the metallic compound layer 94. Then, the entire construction is sealed in a resin package 104 leaving only the external terminal portions of the leads 90 exposed.

In semiconductor elements of this type of construction, as was the case above, by forming metallic compound layers 94, 96 which comprise minute cracks on both the inner tips of the leads 90 attached to the resin package 104 and the lower surface of the chip fastening section 92 respectively, the resin adhesion can be increased markedly, making it possible to improve the reliability of the semiconductor element.

Note that the present invention is in no way limited to the embodiments described above, and many other variations are possible. For example the invention can also be applied to items such as the metal base substrates, lead frames, heat spreaders and heat sinks of the various printed circuit boards and circuit substrates, as well as the integrated circuits IC (OFP, SOP, BGA).

[Embodiments which Utilize a Metallic Compound Layer Comprising Scaly Protrusions]

The metallic compound layers 2 of each of the embodiments shown in FIGS. 1~5 could be altered to metallic compound layers which comprise scaly protrusions. Such metallic compound layers are of substantially uniform thickness, and the entire surface thereof is covered with minute scale like protrusions (flat plate like protrusions, thin wafer like protrusions, flake like protrusions, squamate protrusions). The scaly protrusions stand upright, although not necessarily vertically with respect to the surface of the metallic compound layer 2, and the direction of the major axis parallel with the metallic compound layer differs for each scale like protrusion. Because the scaly protrusions stand upright with respect to the surface of the metallic compound layer 2 the resin of the resin adhesive layer 4 flows deeply into the metallic compound layer 2, with the resulting anchoring effect improving the bonding strength markedly. Furthermore, because the scaly protrusions face in substantially random (chaotic, indeterminate) directions, not only is the bonding strength between the metallic compound layer 2 and the resin adhesive layer 4 equally as strong regardless of the direction in which any force is applied, but furthermore the resin can flow more easily down into the metallic compound layer 2.

Figure 28:
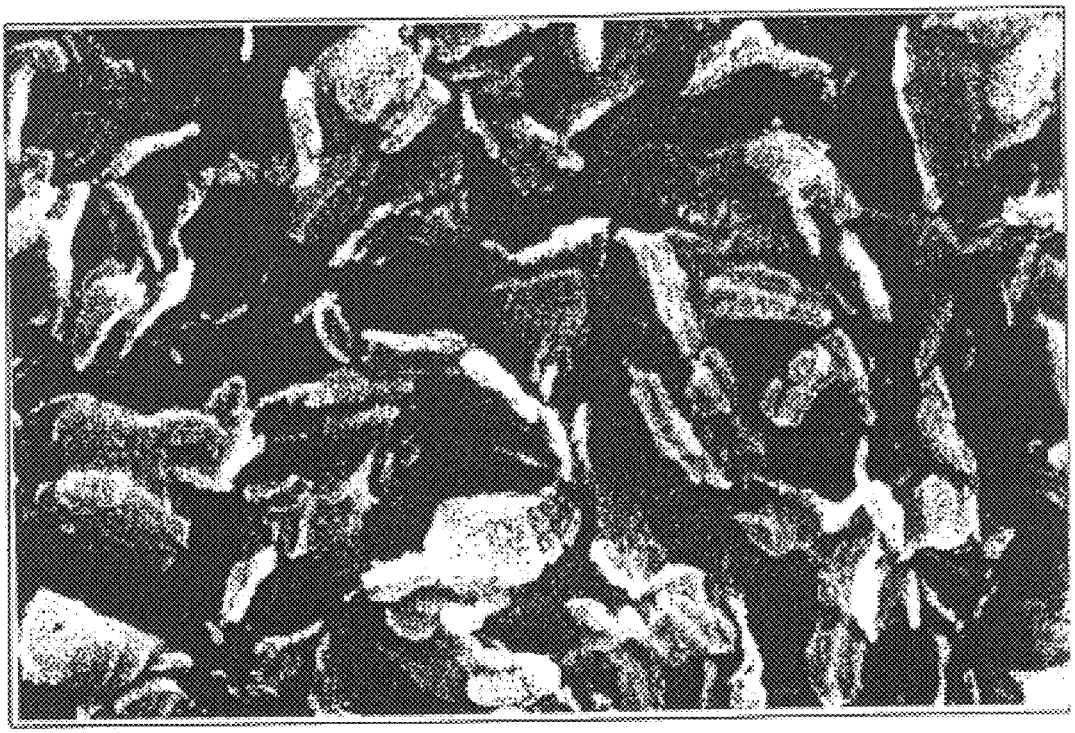
FIG. 28 is an electron microscope photograph (×50,000) showing an example of the surface conditions of a metallic compound layer of a surface treated metallic material according to the present invention.
Figure 29:
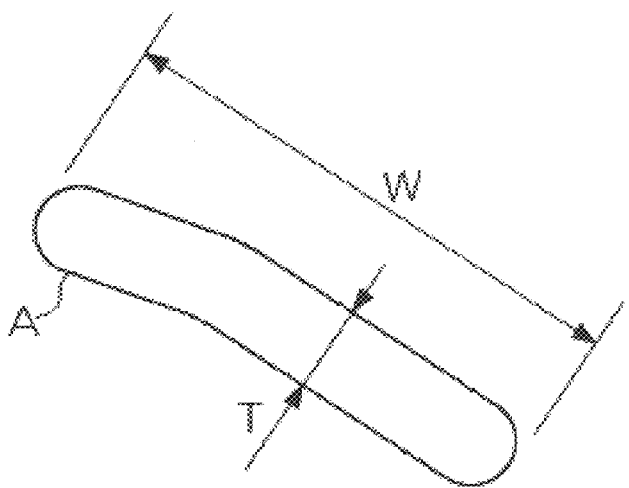
FIG. 29 is a schematic representation of the scaly protrusions on a surface treated metallic material according to the present invention.
Figure 30:
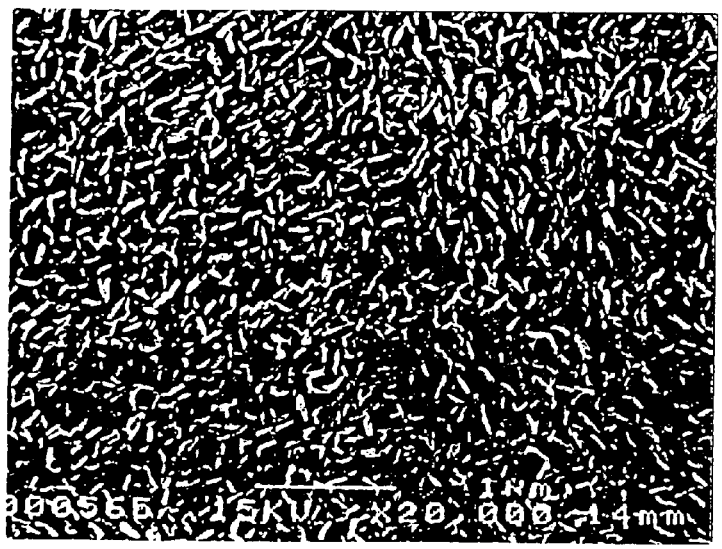
FIGS. 30~34 are electron microscope photographs (×20,000) showing the surface conditions of the metallic compound layers of working examples 12~16.
Figure 31:
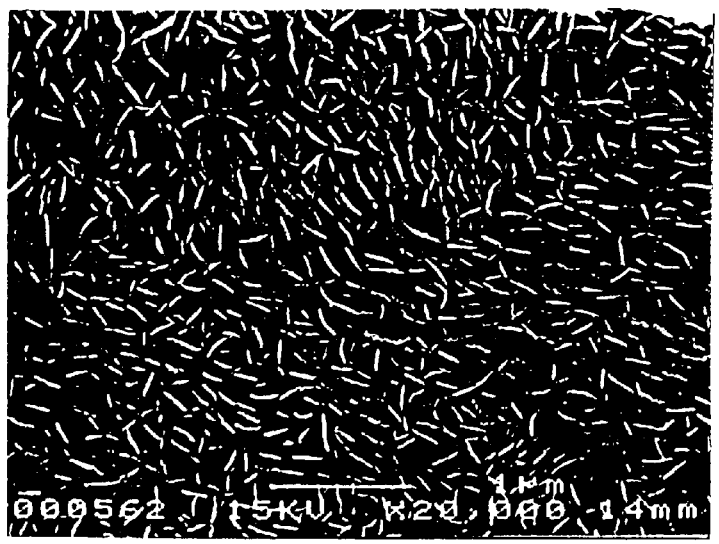
Figure 32:
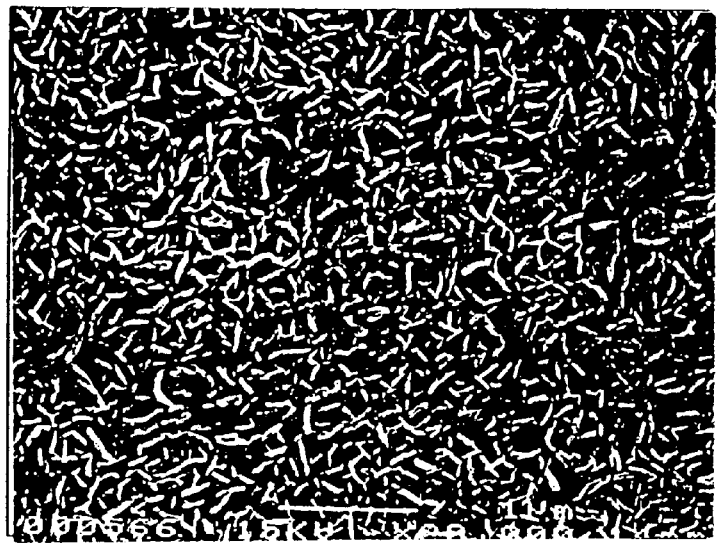
Figure 33:
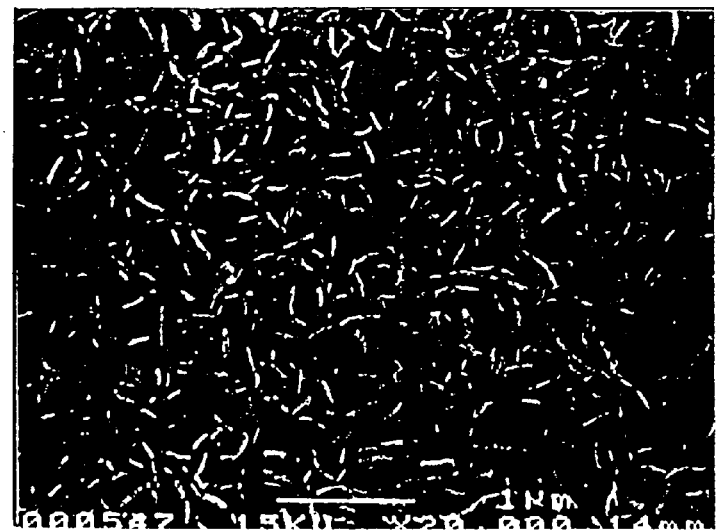
Figure 34:
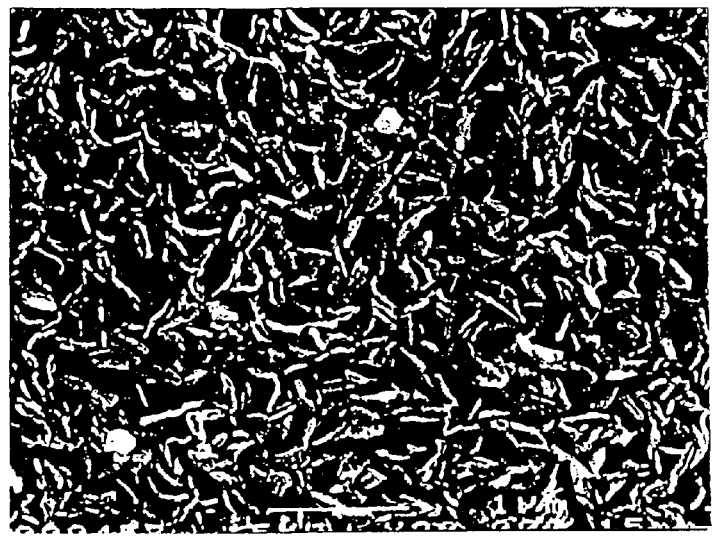

FIGS. 28 and 29 are respectively an electron microscope photograph at magnification 50,000, and a schema showing an enlargement of one section of the electron microscope photograph. Each scaly protrusion A' is a flat protrusion of indeterminate shape which has protruded and grown up from a lower layer structure, and the size of the protrusions, although varying, remains approximately constant. There are no particular restrictions on the size of the scaly protrusion A', but the experiments by the inventors revealed that widths W in the major axial direction of between 0.05~1.5 μm generated good bonding strength to resin, with values between 0.15~0.35 μm being preferable, and widths between 0.2~0.3 μm being the most suitable. At values smaller than 0.05 μm the scaly protrusions become too small and the anchoring effect reduces with an equivalent reduction in the bonding strength of the resin. Furthermore, at values greater than 1.5 μm the danger arises of the scaly protrusions peeling away from the metallic compound layer 2. Similarly, thickness values T of the scaly protrusions A' of between 0.0~0.5 μm generated good bonding strength to resin, with values between 0.02~0.07 μm being preferable, and thickness values between 0.03~0.05 μm being the most suitable. The dimensions of the scaly protrusions quoted here are values obtained by measurements of the electron microscope photographs. If the scaly protrusions are too large, then plating solution can remain inside the protrusions and, when the product is heated to form the resin layer, there is an increased likelihood of gas being generated, resulting in the formation of blisters.

The thickness of the entire metallic compound layer 2 is not restricted with the present invention, but in order to generate scaly protrusions which fall within the dimension ranges described above, overall thickness values should preferably be between 0.05~0.5 μm, with values between 0.1~0.4 being even more desirable, and thickness values between 0.15~0.35 μm being the most suitable. It is thought that to some extent the thickness of the metallic compound layer 2 and the size of the scaly protrusions display a positive correlation. As described below, the metallic compound layer 2 is assumed to have a detailed structure in the lower portions of the layer, and have no openings or air holes which reach down to the surface of the metallic substrate 1.

In those cases where the metallic compound layer 2 is made of a nickel oxide and/or a nickel hydroxide the protrusions can be smaller than in the case of other compounds. Although not a restriction, widths W in the major axial direction of between 0.01~0.5 μm generated good bonding strength to resin, with values between 0.02~0.3 μm being preferable, and widths between 0.02~0.1 μm being the most suitable. Similarly, thickness values T of the scaly protrusions A of between 0.001~0.21 μm generated good bonding strength to resin, with values between 0.003~0.1 μm being preferable, and thickness values between 0.005~0.01 μm being the most suitable. The reasons for these preferred dimension ranges are the same as those described above for other compounds. Furthermore, in order to generate scaly protrusions which fall within the dimension ranges described above, overall thickness values for the entire metallic compound layer 2 should preferably be between 0.01~1.0 μm, with values between 0.03~0.5 being even more desirable, and thickness values between 0.05~0.3 μm being the most suitable.

The formation in this manner of a plurality of minute scaly protrusions, means a portion of the resin adhesive layer 4 will flow in and under the scaly protrusions creating an anchoring effect and strengthening the adhesion to the metallic compound layer 2. Moreover, because the scaly protrusions are formed as part of the metallic compound layer 2, the scaly protrusions which become adhered to the resin adhesive layer 4 will not peel away individually from the metallic substrate 1, ensuring that the anchoring effect is realized at the maximum possible strength. Moreover in addition to the anchoring effect, metallic compound layers 2 of the composition described below display naturally very good adhesion between the metallic compound layer 2 and the resin adhesive layer 4, as well as between the metallic compound layer 2 and the metallic substrate 1, meaning an even greater overall bonding strength is possible.

The thickness of the metallic compound layer 2 is not necessarily limited to any particular value, but values between 0.1~3 μm are preferable, with values between 0.1~1.0 μm being more desirable, and thickness values between 0.2~0.5 μm being most suitable. At metallic compound layer 2 thickness values less than 0.1 μm the scaly protrusions formed are of insufficient depth and it becomes difficult to significantly improve the adhesive strength of the resin adhesive layer, whereas at thickness values greater than 3 μm the scaly protrusions become rough and overly deep and the likelihood increases of the scaly protrusions peeling away from the metallic substrate 1.

The material of the metallic compound layer 2 should preferably incorporate one, or alternatively two or more of the group consisting of chromium oxide, chromium hydroxide, niobium oxide, niobium hydroxide, rhodium oxide, rhodium hydroxide, vanadium oxide, vanadium hydroxide, palladium oxide, palladium hydroxide, nickel oxide, and nickel hydroxide. It is assumed that the oxides and hydroxides which can be used for the metallic compound layer 2 are actually a mix of the two compounds in an indeterminate ratio.

The composition of the oxides and hydroxides should preferably be one of the following.

| | | |
|---|---|---|
| chromium oxide: | $Cr_{1-5}O_{1-12}$ | chromium hydroxide: $Cr(OH)_{1-6}$ |
| niobium oxide: | $Nb_{1-2}O_{1-5}$ | niobium hydroxide: $Nb(OH)_{2-5}$ |
| rhodium oxide: | $Rh_{1-2}O_{1-3}$ | rhodium hydroxide: $Rh(OH)_{1-4}$ |
| vanadium oxide: | $V_{1-8}O_{1-15}$ | vanadium hydroxide: $V(OH)_{1-5}$ |
| palladium oxide: | $PdO_{1-12}$ | |
| palladium hydroxide: | $Pd(OH)_2$ or $Pd(OH)_4$ | |
| nickel oxide: | $Ni_{1.1-2.0}O_{1.0-3.0}$ | |
| nickel hydroxide: | $Ni(OH)_{1-3}$ | |

The amount of metal oxide and metal hydroxide incorporated into the metallic compound layer 2 should preferably be in the range 30~70% by weight of the entire layer, with values between 40~50 wt % being even more desirable.

From both cost and ease of formation considerations, metallic compound layers 2 incorporating a chromium oxide (and chromium hydroxide) are particularly desirable. Commercially available black chrome plating solutions such as "Econo Chrome BK", a brand name of Meltech Corporation; "B-400", a brand name of Ebara U. G. Light Corporation; and the "M&T Chrome BC" series, a brand name of Atotech Japan Corporation can be used as the chromium oxide.

In the case where a chromium compound is used as the metallic compound layer 2 the elemental ratio of oxygen/chromium within the chromium compound layer should preferably be within the range 70:30~30:70, whereas the oxygen/chromium ratio of the chromium compound layer at the bonding interface with the resin layer should preferably be between 90:10~50:50.

If the oxygen/chromium ratio of the chromium compound layer at the metal bonding interface exceeds 70:30, then when the chromium compound layer undergoes etching to generate a wiring pattern, considerable side etching occurs which is undesirable. In contrast, if the oxygen/chromium elemental ratio is less than 30:70 then the time required to carry out the etching of the chromium compound layer becomes undesirably long.

If the oxygen/chromium ratio of the chromium compound layer at the bonding interface with the resin layer is less than 50:50, then the size of the scaly protrusions will be insufficient, and the delamination strength of the chromium compound layer will be undesirably weakened. In contrast if the oxygen/chromium elemental ratio exceeds 90:10 then the chromium compound layer becomes brittle and subsequent processing such as bending, drawing, and press working is likely to result in undesirable deficiencies such as cracking and peeling.

Furthermore, it is even more preferable if within 0.1 μm thickness of the metal bonding interface the atomic fraction of oxygen is between 35~75% and the atomic fraction of chromium between 65~25%, and if within 0.1 μm thickness of the bonding interface with the resin layer the atomic fraction of oxygen is between 45~85% and the atomic fraction of chromium between 55~15%. Other configurations can follow the same pattern as the embodiments described above.

Next is a description of a manufacturing method for the metallic compound layer 2. To form the metallic compound layer 2, a substrate 1 in which at least the surface thereof is made of metal is brought in contact with a plating solution incorporating one, or two or more of, the materials selected from the group consisting of chromic acid, niobic acid, vanadic acid, rhodic acid, palladic acid, nickelic acid, and the various salts thereof, and a current is passed between the cathode at the surface of the substrate 1 and an anode immersed in the plating solution. By so doing, a metallic compound layer 2 of an oxide and/or a hydroxide which comprises as the main constituent chromic acid, niobic acid, vanadic acid, rhodic acid, palladic acid or nickelic acid is deposited on the surface of the substrate 1, and by halting the electric current at a point where a suitable layer thickness has been achieved and then washing the metallic substrate 1, a surface treated metallic material 8 is obtained.

A feature of the manufacturing method of the present invention is that the cathode current density can be increased above normal values during current passage. Normally, a gentle cathode current density is chosen which forms a plating layer in which the surface is comparatively fine, but in the present invention, by setting the cathode current density to a value within the range 2.0~20.0 A/dm² in the case of chromic acid, niobic acid, vanadic acid, rhodic acid, and palladic acid, scaly protrusions are generated. Cathode current densities between 5.0~15.0 A/dm² are even more preferable, with values between 8.0~11.0 A/dm² being the most suitable. It should be noted that the most suitable cathode current density will vary somewhat depending on the composition of the plating solution. In the case of nickelic acid, scaly protrusions can be generated by setting the cathode current density to a value within the range 0.01~10 A/dm². Cathode current densities between 0.05~5.0 A/dm² are even more preferable, with values between 0.1~1.0 A/dm being the most suitable.

There are no particular restrictions on the concentration of the metallic acid and/or salt in the plating solution, but a total concentration of between 300~800 g/l is preferable, with concentrations between 400~600 g/l being even more desirable.

Because the metallic compound layer 2 is formed by electroplating there are no particular restrictions on the material for the metallic substrate 1 provided at least the surface of the substrate is made of a metal such as nickel, iron, aluminium, titanium, copper, or an alloy thereof. Hence, the internal portion of the substrate can be made of a non-conductive material such as a resin or a ceramic. In contrast, with techniques such as black oxide finishing, the surface of the substrate undergoes a chemical reaction, thus limiting the types of substrate which can be used. The fact that there are no restrictions on the type of substrate is another advantage of the present invention.

Specific examples of the composition of the plating solution are as follows. Note however, that the plating solution is in no way limited to the examples shown.

[Chromium Oxide Plating Solution]

1. anhydrous chromic acid: 400 g/l acetic acid (99%): 50 ml/l sodium dichromate: 40 g/l boric acid: 0.5 g/l sodium nitrate: 2 g/l sodium silicofluoride: 5 g/l 2. "EconoChrome BK" (brand name of Meltech Corporation): 450 g/l 3. anhydrous chromic acid: 400 g/l acetic acid (99%): 50 ml/l sodium dichromate: 40 g/l 4. "M&T Chrome BC-35J" (brand name of Atotech Japan Corporation): 450 g/l "M&T Chrome BC-37J" (also from Atotech Japan): 15 ml/l "M&T Chrome BC-39J" (also from Atotech Japan): 8 ml/l "M&T Chrome BC-40J" (also from Atotech Japan): 10 ml/l barium carbonate: 10 g/l Furthermore, preferred plating conditions are as follows.

cathode current density: 5~15 A/dm$^2$ with values between 8~11 A/dm$^2$ being even more desirable plating temperature: 20~25° C., room temperature stirring: yes The plating time period will vary depending on the other parameters, but is usually in the order of 1~15 minutes. If the cathode current density or the plating temperature deviate outside the aforementioned ranges then changes will also occur in the formation appearance of the scaly protrusions.

Plating solutions for forming niobium oxide (hydroxide), rhodium oxide (hydroxide), vanadium oxide (hydroxide), palladium oxide (hydroxide), or nickel oxide are generated by replacing the chromic acid (or salt thereof) of each of the aforementioned plating solutions 1~4 with niobic acid (or salt thereof), rhodic acid (or salt thereof), vanadic acid (or salt thereof), palladic acid (or salt thereof), or nickelic acid (or salt thereof) respectively. The plating conditions remain the same. Furthermore if required, a number of different acids can be selected from the group consisting of chromic acid, niobic acid, rhodic acid, vanadic acid, palladic acid and nickelic acid, and then mixed together appropriately.

The metallic compound layer immediately following formation using a chromium oxide plating solution, can strictly speaking be considered to be of a three layer construction comprising in order from closest to the metallic substrate 1, an extremely thin layer of an alloy between the metal of the substrate (for example, copper or a copper alloy) and chromium, an extremely thin layer of metallic chromium, and a layer of a compound $Cr(OH)_{1.1\sim2.1}O_{2.0\sim3.0}$ of indeterminate ratio incorporating chromium hydroxide and chromium oxide. It is thought that similar layered structures are formed in the cases of niobium, rhodium, palladium and nickel. In all cases if the outermost layer of the metallic compound layer incorporates hydroxyl groups, then during heating in the formation of the resin adhesive layer 4 there is the possibility of steam generation resulting in the formation of blisters and other problems. Consequently, it is preferable to carry out a dehydration treatment by preheating the metallic compound layer following the plating step and converting any hydroxides to oxides.

An example of the conditions for the dehydration treatment would involve heating the metallic substrate 1 and the covering metallic compound layer 2 at a temperature of 70~90° C. for a period of 4~6 hours. At temperatures lower than 70° C. insufficient dehydration occurs, whereas at temperatures greater than 90° C. there is a danger of exposed portions of the surface of the metallic substrate 1 becoming discolored. By conducting the heating under reduced pressure it is possible to reduce the heating time period.

In those cases where the metallic compound layer 2 is to be formed on only one portion of the surface of the metallic substrate 1, those sections of the surface of the metallic substrate 1 which are not to be plated can be masked during the plating process with standard masking agents, or alternatively, the metallic compound layer 2 can be formed across the entire surface of the metallic substrate 1 and then subsequently partially etched using an aqueous solution of any of the common acids.

Because there are large numbers of minute scaly protrusions on the metallic compound layer 2, the scaly protrusions should preferably be first immersed in ethyl alcohol containing a silane coupling agent, and then following subsequent drying, masked using resist techniques, for example. Etching should then be carried out using a conventional etching apparatus, or the aforementioned etching solution.

With a metallic laminate of the above construction, because the surface of the metallic compound layer 2 is formed of upright scaly protrusions, a portion of the resin adhesive layer 4 flows down into and under the scaly protrusions creating an anchoring effect and binding the two layers strongly together. Moreover in addition to the anchoring effect, because metallic compound layers 2 of the composition described above display naturally very good adhesion to the resin adhesive layer 4, it is possible to increase markedly the bonding strength between the metallic compound layer 2 and the resin adhesive layer 4.

Moreover in addition to markedly increasing the bonding strength of the resin layer 4, metallic compound layers 2 of the above construction will not cause blisters in the resin adhesive layer 4 due to the low amounts of moisture adsorption following the dehydration treatment. Furthermore, during the formation of the resin adhesive layer 4, depending on the material of the resin adhesive layer 4, the metallic compound layer can be exposed to temperatures as high as 400° C., and the fact that the physical properties of the metallic compound layer 2 do not vary even at these high temperatures is indicative of the superior heat resistance of the layer.

[Other Embodiments of the Present Invention]

As follows are further descriptions of examples of practical applications of the present invention. The metallic compound layers described in the embodiments below may be of the type comprising minute cracks, or the type comprising scaly protrusions. Excellent improvements in bonding strength are obtained with either type of compound layer.

Figure 45:
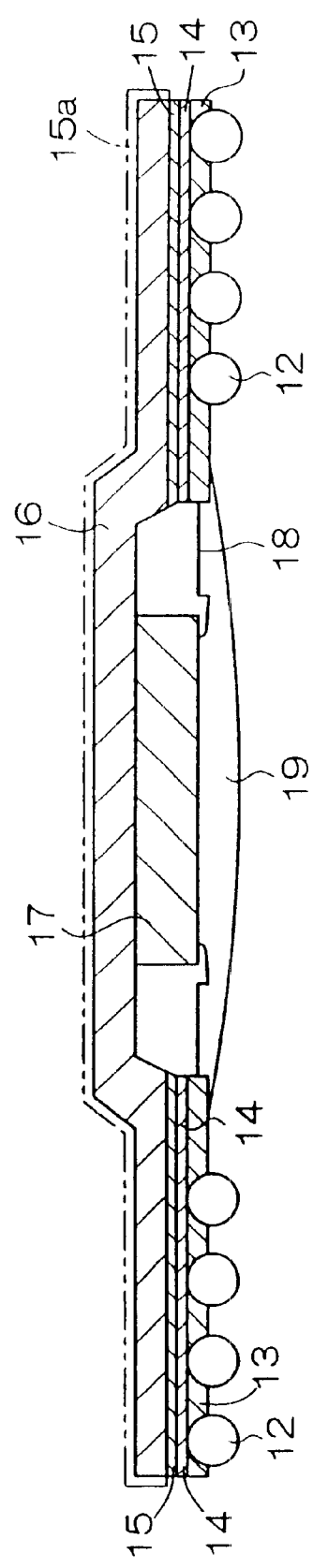
FIGS. 45~63 are diagrams which each show an additional embodiment of the present invention.

FIG. 45 shows a ball grid array (BGA) as yet another embodiment of an electronic or electrical component of the present invention. A metallic compound layer 15 and a resin layer 14 are formed sequentially on the lower surface of the outer perimeter portion of a heat sink 16, while a liquid resist 13 is formed on the lower surface of the resin layer 14. Holes are opened in the liquid resist 13 at predetermined locations, and solder balls 12 are formed to correspond with the holes. A semiconductor chip 17 is soldered to the central region of the lower surface of the heat sink 16. The plurality of terminals on the lower surface of the semiconductor chip 17 are connected to the internal edge of the resist 13 with bonding wire 18. The lower surface of the central region of the heat sink 16 is filled with a potting resin (sealing resin) 19 which seals the semiconductor chip 17. In this type of electronic or electrical component, as was the case with the embodiments above, by forming a metallic compound layer 15, the bonding strength of the resin adhesive layer 14 can be increased, making it possible to improve the reliability of the semiconductor element. In the semiconductor element shown in FIG. 45, a metallic compound layer 15a represented by the dashed line in FIG. 45 can also be formed on the upper surface and the outside edges of the heat sink 16. In such a case, the heat and moisture resistance of the entire semiconductor element improves, and laser marking can be carried out on the surface.

Figure 46:
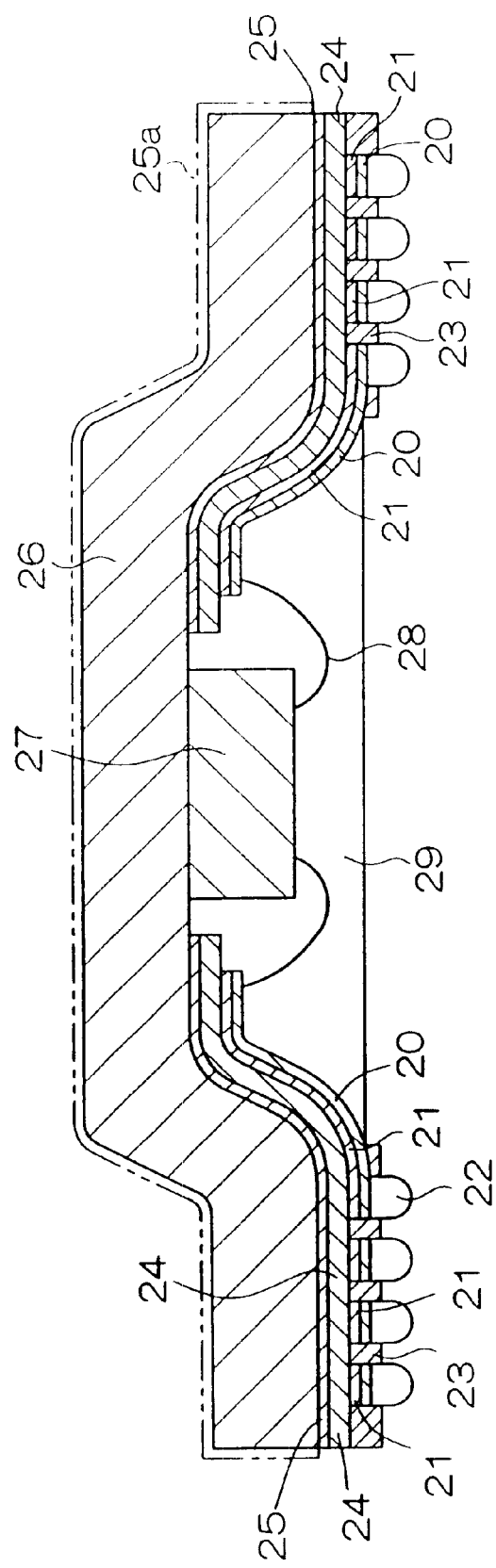

FIG. 46 shows a ball grid array (BGA) as yet another embodiment of the present invention. A metallic compound layer 25 and a resin layer 24 are formed sequentially on the lower surface of a heat sink 26, and follow the contour of the lower surface of the heat sink 26 covering all but the very central portion of the lower surface. A metallic foil 20, on which is provided a metallic compound layer 21, is formed on the lower surface of the resin layer 24 with the metallic compound layer 21 contacting the surface joining the resin layer 24. The metallic compound layer 21 and the metallic foil 20 are etched to give a predetermined wiring pattern. In the region located beneath the lower surface of the perimeter portion of the heat sink 26, a liquid resist 23 is formed on both the lower surface of the metallic foil 20, and the portions where the metallic compound layer 21 and the metallic foil 20 have been removed by etching. Holes are formed in the liquid resist 23 at predetermined locations and solder balls 22 are formed to correspond with the holes.

A semiconductor chip 27 is soldered to the center of the lower surface of the heat sink 26. A plurality of terminals on the lower surface of the semiconductor chip 27 are connected to the metallic foil 20 with bonding wire 28. By filling the lower surface of the central region of the heat sink 26 with a potting resin (sealing resin) 29 the semiconductor chip 27 is sealed.

In the semiconductor element shown in FIG. 46, in addition to the metallic compound layer formed on the lower surface of the outer perimeter of the heat sink 26, a metallic compound layer 25a represented by the dashed line in FIG. 46 can also be formed on the upper surface and the outside edges of the heat sink 26. In such a case, the heat and moisture resistance of the entire semiconductor element improves, and laser marking can be carried out on the surface. Furthermore, when the entire semiconductor element is sealed with a potting resin, the bonding strength between the heat sink 26 and the potting resin can be raised even further, making the component even more reliable. Moreover, the heat dissipation properties also improve.

Figure 47:
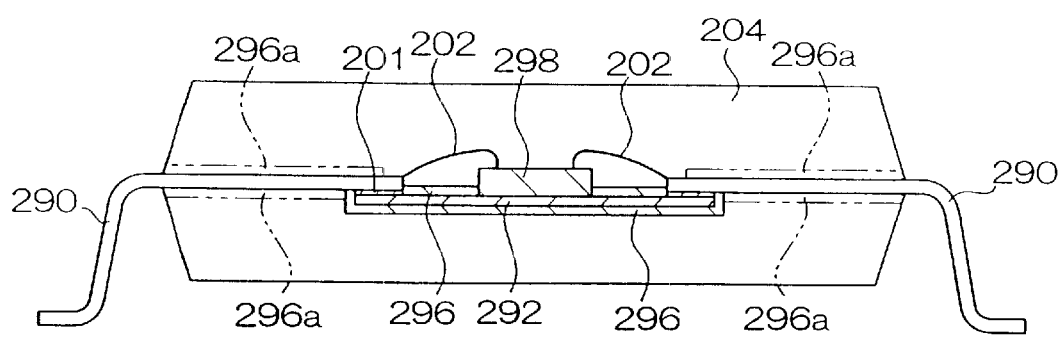
Figure 48:
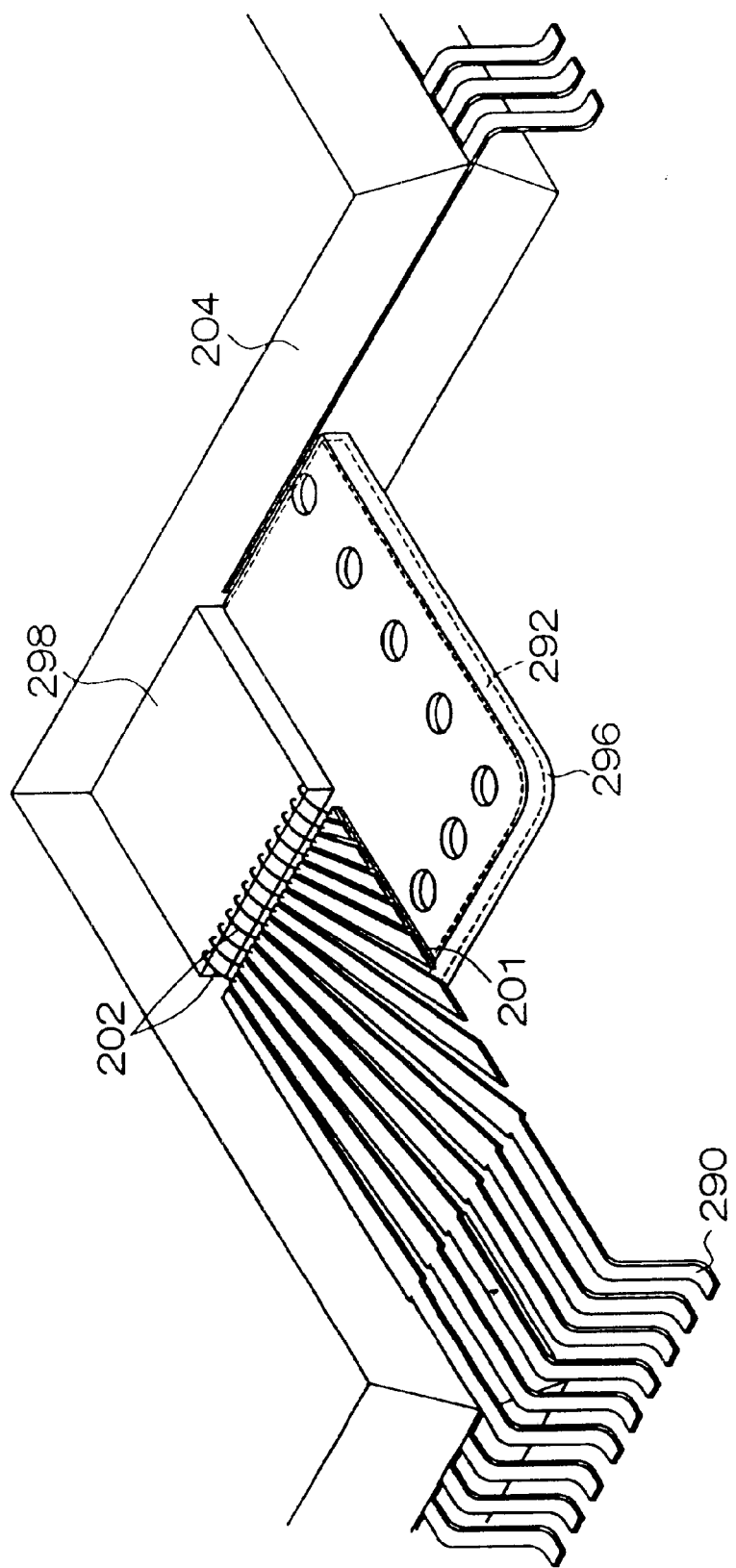

FIGS. 47 and 48 show an integrated circuit element (IC, LSI), wherein a heat sink (heat spreader) 292 equipped with through holes at the perimeter thereof, is attached via adhesive tape 201 to the lower surface of the inside edge of a series of metallic leads 290 which are made of the same material as the heat sink 292. A metallic compound layer 296 is formed on the upper and lower surfaces of, and around the edges of the heat sink 292. A semiconductor chip 298 is fixed to the upper surface of the heat sink 292, and bonding wire 202 is used to connect a plurality of terminals on the upper surface of the semiconductor chip 298 with the upper surface of the inner perimeter tip of each lead 290. Then, the entire construction is sealed with a sealing resin 204 leaving only the external terminal portions of the leads 290 exposed.

In integrated circuit elements of this type of construction, the resin adhesion can be improved markedly by forming a metallic compound layer 296 on the upper and lower surfaces of, and around the edges of the heat sink 292 where the heat sink contacts the sealing resin 204.

Furthermore with the integrated circuit element shown in FIGS. 47 and 48, by providing a metallic compound layer 296a which also covers the surface of each lead 290 which bonds to the sealing resin 204, as shown by the dashed line in FIG. 47, the adhesion of the resin can be increased even further.

Figure 49:
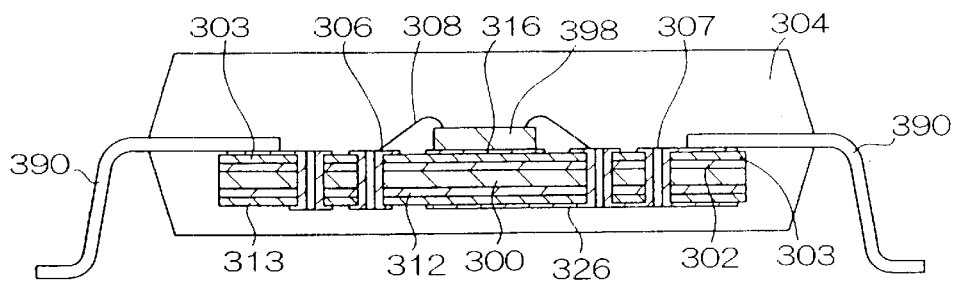

FIG. 49 shows an integrated circuit element (IC, LSI), wherein a metallic compound layer 302 and a resin layer 303 are formed sequentially on the upper surface of a metallic substrate 300. Metallic foil 306, 316 is provided on the upper surface of the resin layer 303. The metallic foil 306, 316 is etched to generate a predetermined wiring pattern.

A semiconductor chip 398 is fixed to the top of the centrally positioned metallic foil 316, and each of the terminals formed on the semiconductor chip 398 are wire bonded to the metallic foil 306 with bonding wire 308. Furthermore, leads 390 are provided on the upper surface of the outer perimeter section of the metallic foil 306.

In addition, a metallic compound layer 312 and a resin layer 313 are also formed sequentially on the lower surface of the substrate 300. A metallic foil 326 is provided on the lower surface of the resin layer 313. The metallic foil 326 is etched to generate a predetermined wiring pattern. Then, through holes 307 which penetrate through the substrate 300, the metallic compound layers 302, 312 and the resin layers 303, 313 are provided at predetermined positions. The entire construction is then sealed with a sealing resin 304 leaving only the external terminal portions of the leads 390 exposed.

In FIG. 49, metallic compound layers 302, 312 can also be provided on the surfaces of the metallic foil 306, 316, 326 which bond to the resin layers 303, 313, and on the surface of the leads 390 which bond to the sealing resin 304. In such a case the adhesion to the resin layers 303, 313 and the sealing resin 304 can be increased even further.

Figure 50:
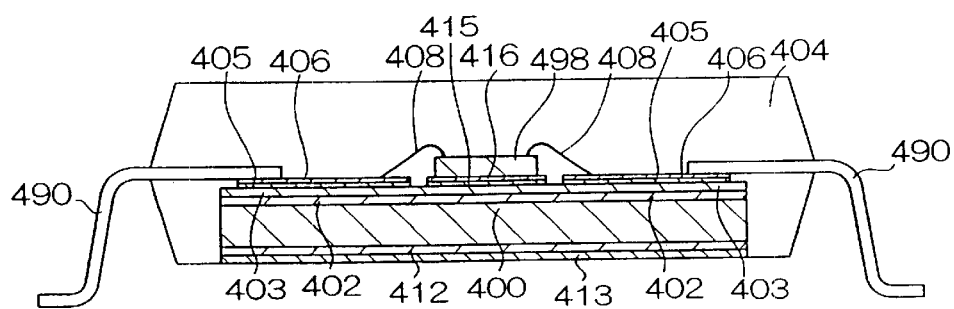

FIG. 50 is a cross-sectional view of an integrated circuit (IC, LSI) wherein a metallic compound layer 402 and a resin layer 403 are formed sequentially on the upper surface of a substrate 400. Metallic foil 406, 416, on which are formed metallic compound layers 405, 415, are provided on top of the resin layer 403. The metallic compound layers 405, 415 and the metallic foil 406, 416 are etched to generate a predetermined wiring pattern.

A semiconductor chip 498 is fixed to the top of the centrally positioned metallic foil 416, and each of the terminals formed on the semiconductor chip 498 are wire bonded to the metallic foil 406 with bonding wire 408. Furthermore, leads 490 are provided on the upper surface of the outer perimeter section of the metallic foil 406.

In addition, a metallic compound layer 412 and a resin layer 413 are also formed sequentially on the lower surface of the substrate 400. The entire construction is then sealed with a sealing resin 404 leaving the lower surface of the resin layer 413 and the external terminal portions of the leads 490 exposed.

In integrated circuit elements of this type of construction, adhesion with the resin layers 403, 413 can be improved by forming metallic compound layers 402, 412, 405, 415 on the upper and lower surfaces of the substrate 400, as well as on the metallic foil 406, 416 bonded to the resin layers 403, 413 respectively.

Figure 51:
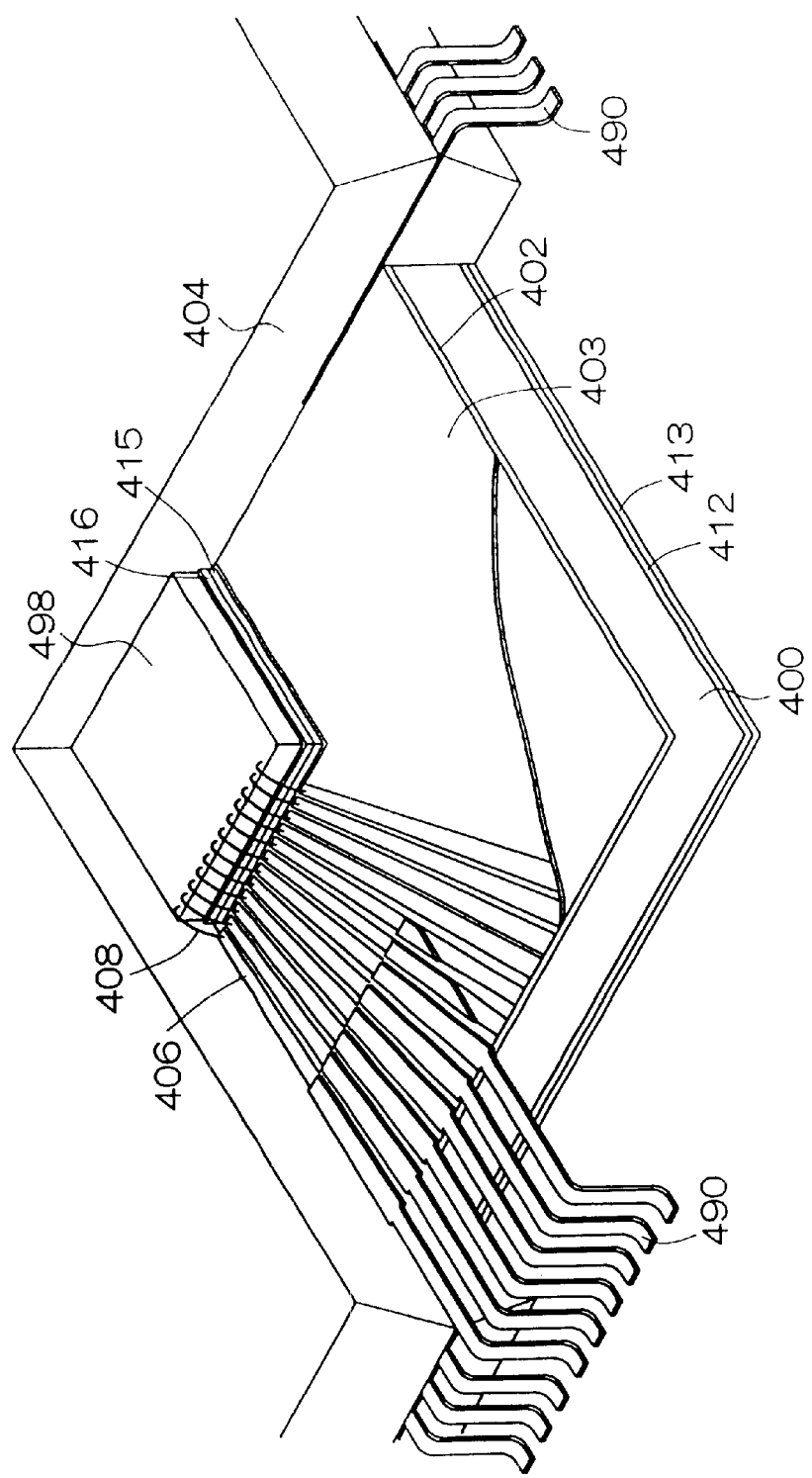

In the integrated circuit element shown in FIGS. 50 and 51, a metallic compound layer can also be formed on the surface of each lead 490 which contacts the sealing resin 404.

Figure 52:
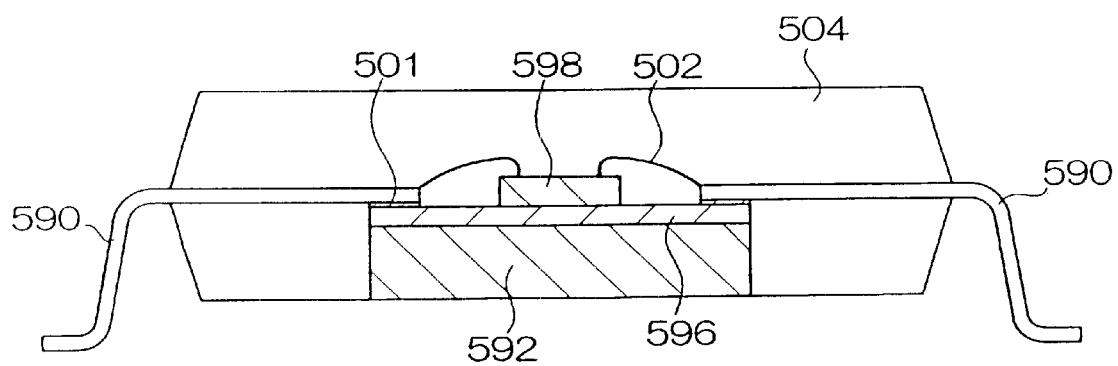

FIG. 52 is a cross-sectional view of an integrated circuit (IC, LSI) wherein a metallic heat sink 592, the upper surface of which is covered with a metallic compound layer 596, is attached via adhesive tape 501 to the lower surface of the inside edge of a series of leads 590 which are made of the same material as the heat sink 592. Furthermore, a semiconductor chip 598 is fixed to the central upper surface of the metallic compound layer 596, and a plurality of terminals on the upper surface of the semiconductor chip 598 are connected to the upper surfaces of the inner perimeter tips of the leads 590 with bonding wire 502. The entire construction is then sealed with a sealing resin 504 leaving the external terminal portions of the leads 590 and the lower surface of the heat sink 592 exposed.

In integrated circuit elements of this type of construction, adhesion with the resin is able to be improved by forming a metallic compound layer 596 on the upper surface of the heat sink 592 which bonds to the sealing resin 504.

Figure 53:
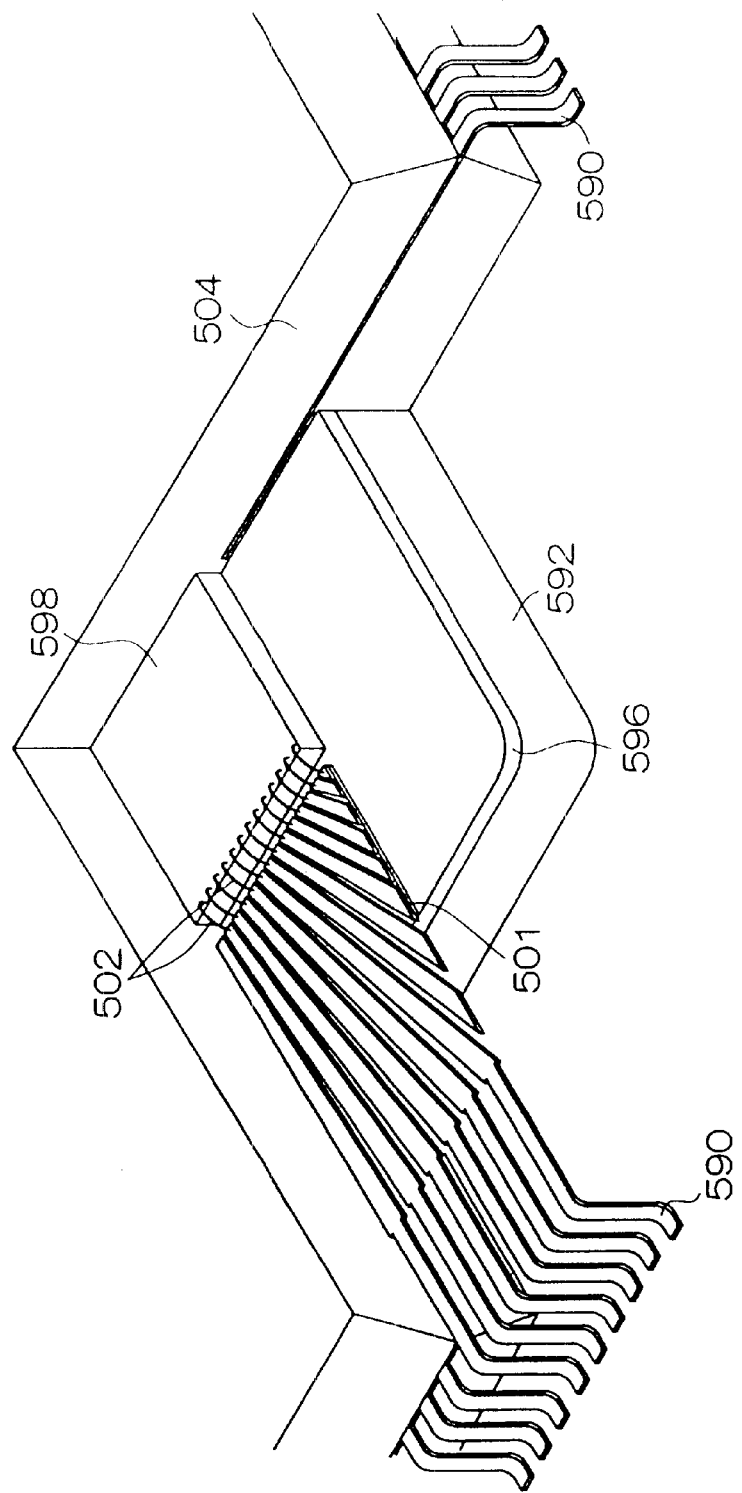

In the integrated circuit element shown in FIGS. 52 and 53, a metallic compound layer 596 can also be formed on the surface of each lead 590 which bonds to the sealing resin 504, as well as on the side surfaces of the heat sink 592. In such a case the resin adhesion can be improved even further. Moreover, by forming a metallic compound layer 596 on the lower surface of the heat sink 592, the heat and moisture resistance of the entire semiconductor element improves, and laser marking can be carried out on the surface.

Figure 54:
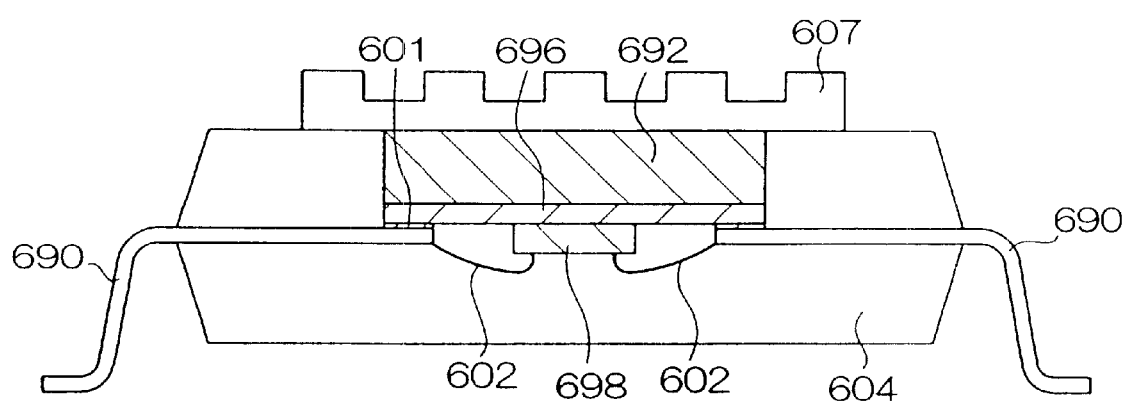

In the integrated circuit element (IC, LSI) of FIG. 54 a heat sink 692 is fixed to the upper surface of the inside edge of a series of leads 690 via adhesive tape 601, wherein the heat sink 692 is made of the same material as the leads 690, and has a metallic compound layer 696 formed on the lower surface thereof. A semiconductor chip 698 is fixed to the lower surface of the metallic compound layer 696, and a plurality of terminals on the lower surface of the semiconductor chip 698 are connected with bonding wire 602 to the lower surface of each of the inner perimeter tips of the leads 690. The entire construction is then sealed with a sealing resin 604 leaving the external terminal portions of the leads 690 and the upper surface of the heat sink 692 exposed. A heat dissipation fin 607 is the fitted to the exposed upper surface of the heat sink 692.

In integrated circuit elements of this type of construction, adhesion with the resin is able to be improved by forming a metallic compound layer 696 on the lower surface of the heat sink 692 which bonds to the sealing resin 604.

Furthermore in the integrated circuit element shown in FIG. 54, resin adhesion can be improved even further by also forming a metallic compound layer 696 on the surface of each lead 690 which bonds to the sealing resin 604, as well as on the side surfaces of the heat sink 692. Moreover, by also forming a metallic compound layer 696 on the upper surface of the heat sink 692, the adhesive strength of the adhesive during die bonding of the integrated circuit improves, and the adhesion of the heat sink 692 with the potting resin also improves.

Figure 55:
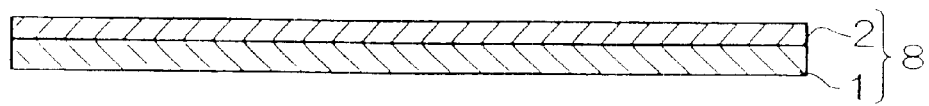

FIG. 55 shows a surface treated metallic foil 8 comprising a foil type substrate 1, and a metallic compound layer 2 formed by plating on the upper surface of the substrate 1. The surface treated metallic foil 8 can be used as the raw material for all manner of electronic components.

Figure 56:
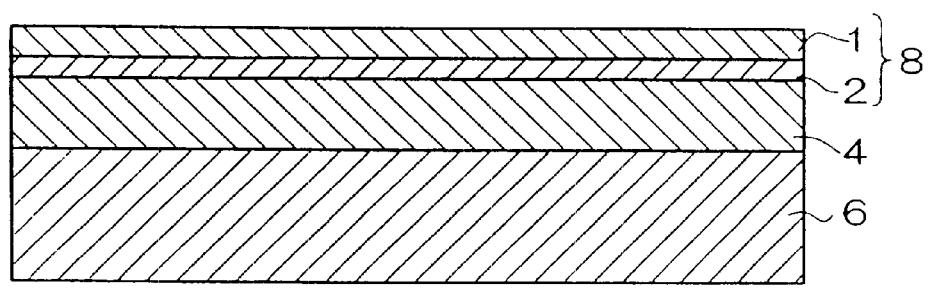
Figure 57:
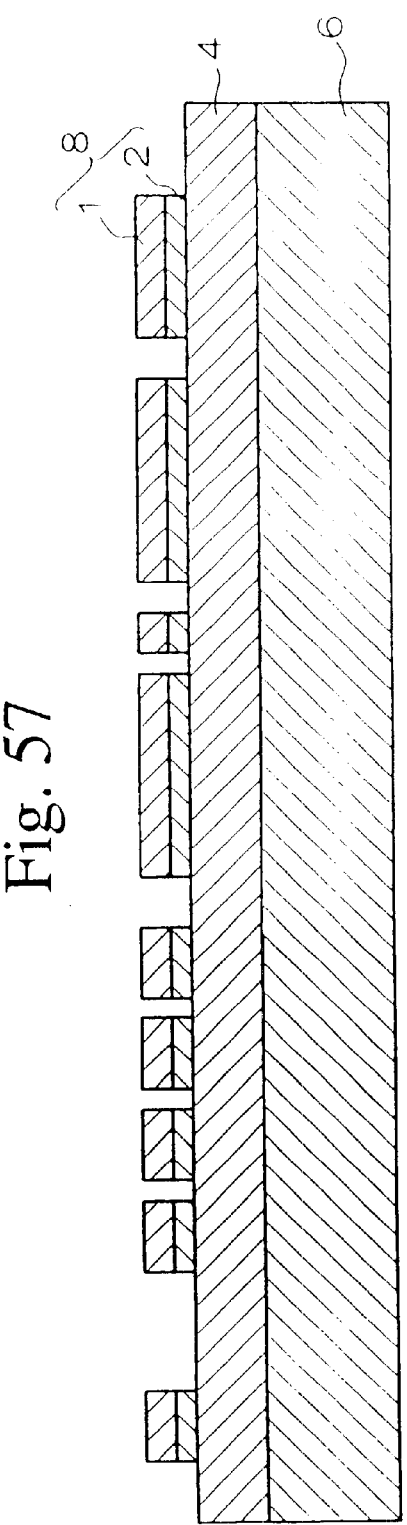

FIG. 56 shows a metallic substrate 6, on to which has been attached via a resin adhesive layer 4 the surface treated metallic foil 8 shown in FIG. 55. The thickness of the metallic foil substrate 1 should preferably be within the range 5~100 µm. FIG. 57 is a printed circuit board which utilizes the metallic laminate shown in FIG. 56, wherein the surface treated metallic foil 8 of the metallic laminate is partially etched to form a circuit pattern. Because a surface treated metallic foil 8 is used in this type of printed circuit board, the bonding strength between the surface treated metallic foil 8 and the resin adhesive layer 4 is able to be improved.

Figure 58:
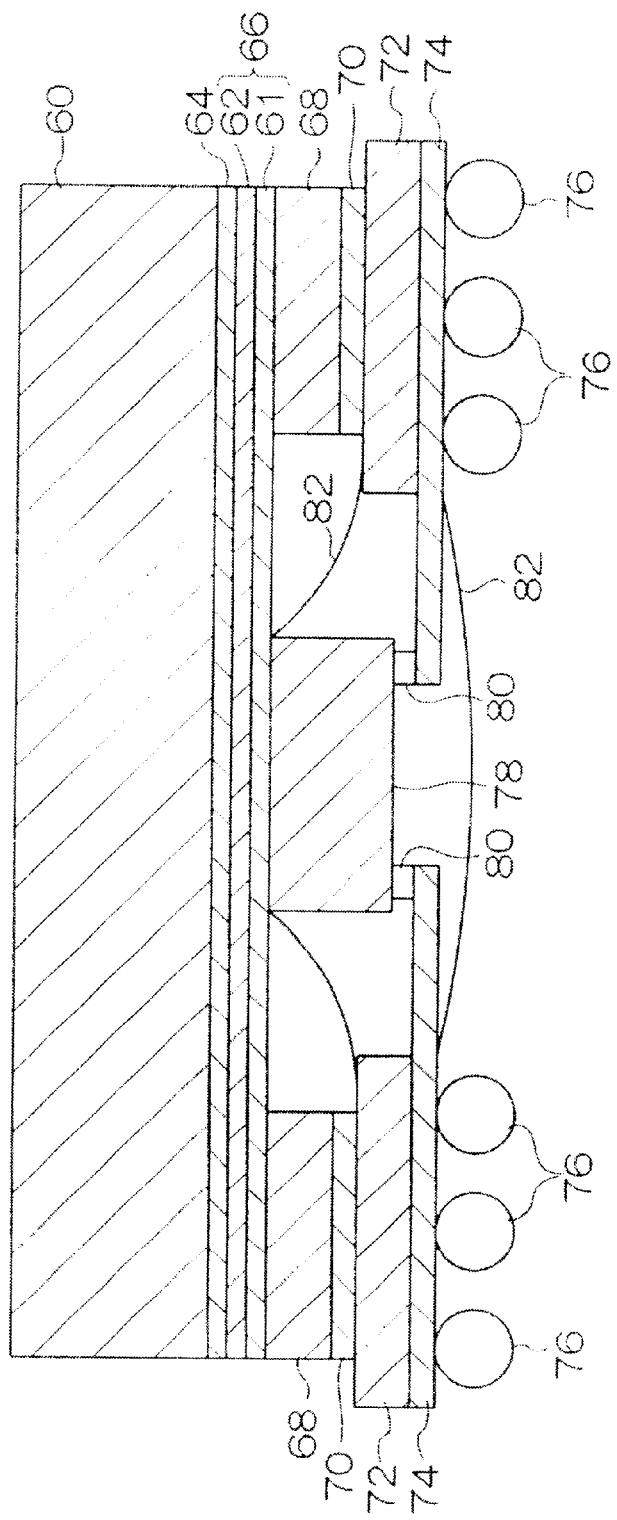

FIG. 58 is a single sided semiconductor element (ball gate array (BGA)). A resin adhesive layer 64 is formed on the lower surface of a metallic substrate 60, and a surface treated metallic foil 66' comprising a metallic compound layer 62 formed on a foil type substrate 61 is provided on the lower surface of the resin adhesive layer 64. A semiconductor chip 78 is soldered to the central region of the lower surface of the surface treated metallic foil 66', and a resin stiffener 68 is bonded to the outer perimeter portion of the surface treated metallic foil 66', while a TAB tape 72 is bonded with an adhesive 70 to the lower surface of the stiffener 68. A plurality of leads 74 made of copper foil are fixed to the lower surface of the TAB tape, and solder balls 76 are formed on each of the leads 74. The inner tips of the leads 74 are each bonded to one of the terminals of the semiconductor chip 78 via a bump 80. The semiconductor chip 78 is then sealed by filling the inside of the stiffener 68 with a potting resin (sealing resin) 82.

With this type of electronic or electrical component, the bonding strength between the surface treated metallic foil 66' and the resin adhesive layer 64 is able to be increased by formation of the metallic compound layer 62.

Figure 59:
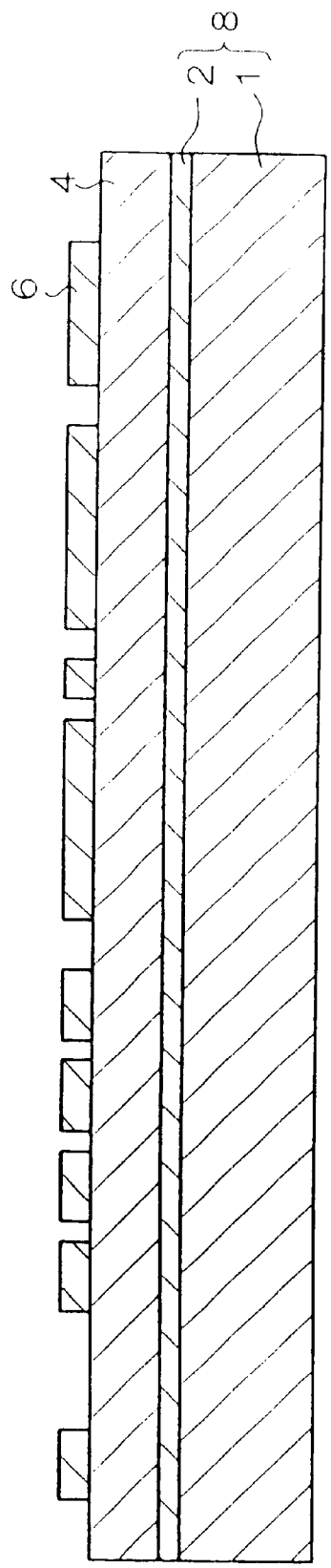

The printed circuit board shown in FIG. 59 was produced by using a resin layer 4 to bond a metallic foil 6 to a surface treated metallic material 8 comprising a substrate 1 and a metallic compound layer 2 formed on the upper surface of the substrate 1 by plating, and then partially etching the metallic foil 6 to generate a circuit pattern.

Figure 60:
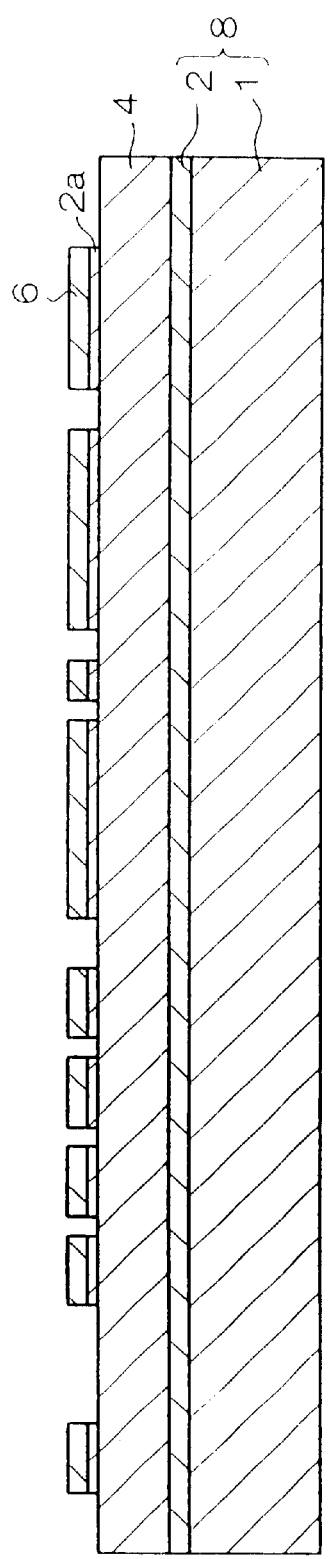

FIG. 60 shows another printed circuit board, and in this example a metallic foil 6, in which a metallic compound layer 2 is formed at least on the surfaces which contact the aforementioned resin 4, is bonded on to the resin layer 4, so that a metallic compound layer 2a is positioned between the metallic foil 6 and the resin layer 4.

Figure 61:
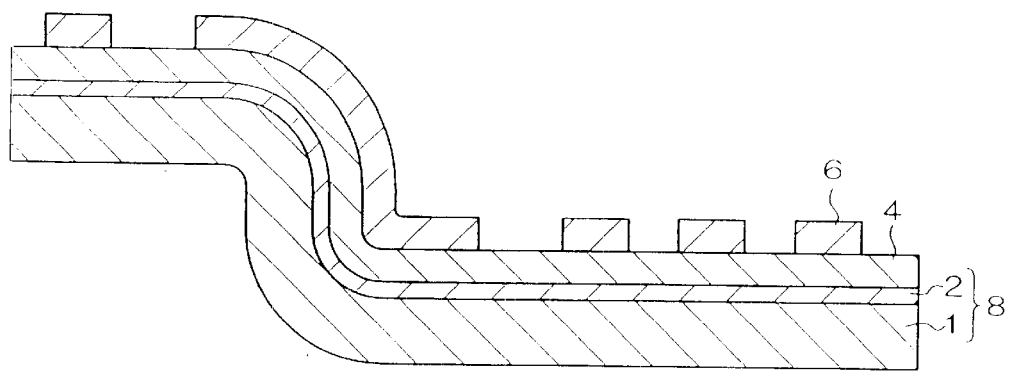

FIG. 61 shows yet another example of a printed circuit board, wherein bending and drawing processing has been performed on the printed circuit board shown in FIG. 59. Because a metallic compound layer 2 is provided between the substrate 1 and the resin layer 4, the bending and drawing processing is accomplished relatively easily.

Figure 62:
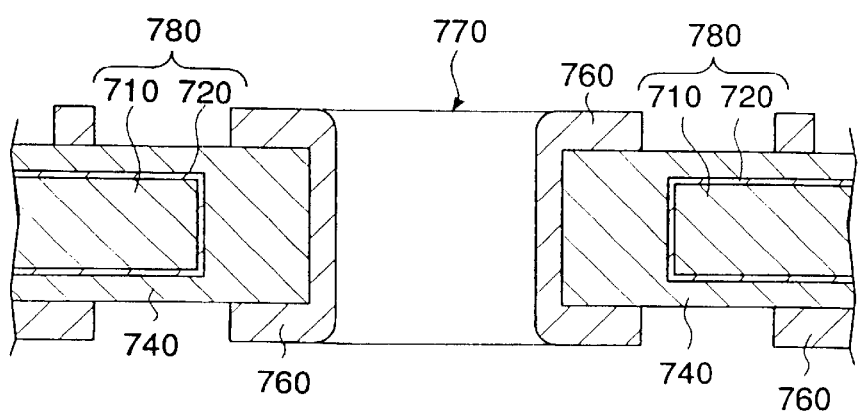

FIG. 62 shows yet another example of a printed circuit board, wherein a metallic foil 760 is bonded via a resin layer 740 to a surface treated metallic material 780 comprising a substrate 710 in which apertures which function as through holes 770 are provided and a metallic compound layer 720 which is formed by plating around the circumference of the substrate 710, with the metallic foil being bonded to the upper and lower surfaces of the surface treated metallic material 780 as well as to the inside of the apertures which function as through holes 770. The metallic foil 760 is then partially etched to form a circuit pattern and generate a double sided printed circuit board.

Figure 63:
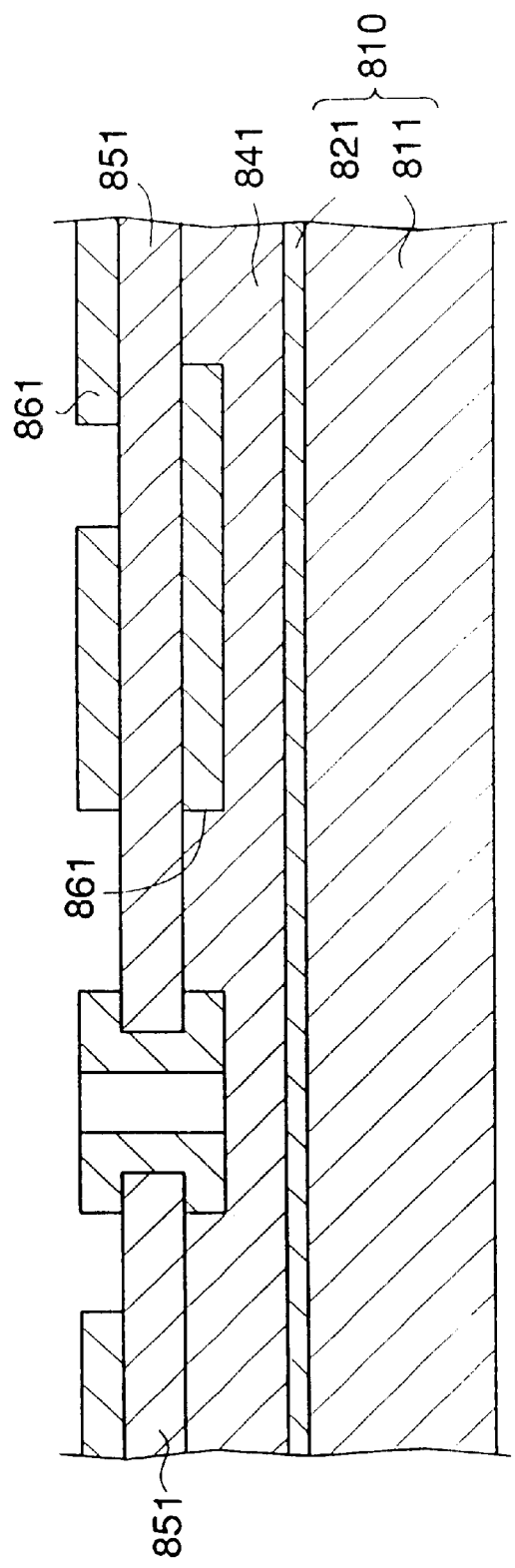

FIG. 63 shows yet another example of a printed circuit board of the present invention. This printed circuit board is a multi-layer printed circuit board in which a resin substrate 851 and a circuit pattern formed from a metallic foil 861 provided on the top and bottom of the resin substrate 851, are bonded via a resin layer 841 to the upper surface of a surface treated metallic material 810 comprising a substrate 811 and a metallic compound layer 821 formed on top of the substrate 811 by plating.

The present invention is in no way restricted to the embodiments described above, and embodiments of other configurations can be incorporated as is necessary.

EXPERIMENTAL EXAMPLES

Below, experimental data is provided to validate the effects of the present invention.

Experiment 1

A verification was made of the difference in the surface structure of plated layers generated from a chromium oxide plating solution to which strontium sulfate had been added (working example 1), and a chromium oxide plating solution with no added strontium sulfate (comparative example 1).

A chromium oxide plating solution of the composition shown below was prepared, and in the case of the working example 1 0.5 g/l of strontium sulfate was added, whereas in the case of the comparative example 1 no strontium sulfate was added.

anhydrous chromic acid: 400 g/l
acetic acid (99%): 50 ml/gl
sodium dichromate: 40 g/l
boric acid: 0.5 g/l
sodium nitrate: 2 g/l
sodium silicofluoride: 5 g/l A 10×15 cm pure copper sheet and a platinum anode were immersed in each of the two chromium oxide plating solutions, and the copper sheet was then connected to a power supply cathode and the platinum electrode to the power supply anode, and electroplating then conducted under the following conditions.

| | |
|---|---|
| cathode current density: | 10A/dm$^2$ |
| plating temperature: | 20° C. |
| plating time duration: | 180 seconds |
| plated layer thickness: | 0.4 µm (common) |

Figure 10:
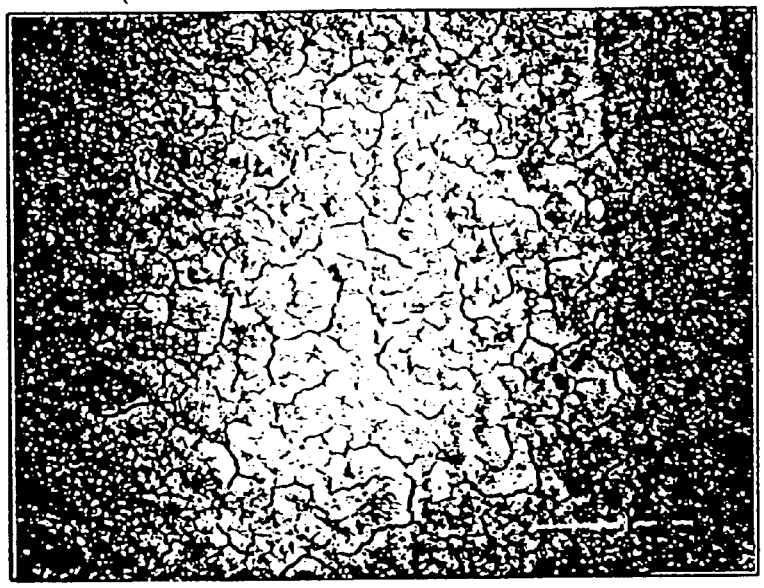
FIG. 10 is an electron microscope photograph of a working example 1 obtained using a plating solution containing strontium salt.
Figure 11:
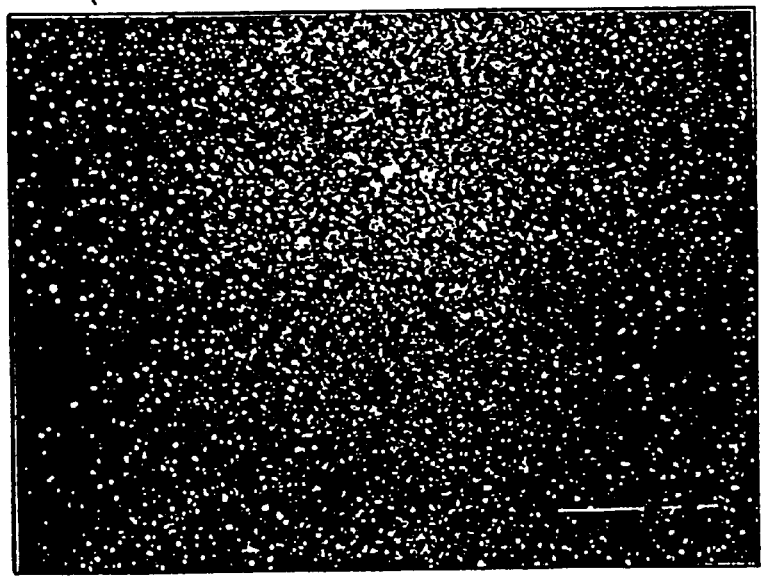
FIG. 11 is an electron microscope photograph of a comparative example 1 obtained using a plating solution containing no strontium salt.

The two copper sheets, having undergone plating under the above conditions, were dried by heating for four hours at 90° C., and a 1000 fold electron microscope photograph then taken of the surface of the plated layer. The photograph from the working example 1 is shown in FIG. 10, and that from the comparative example 1 in FIG. 11. As can be seen clearly in the photographs, in the working example 1 in which strontium sulfate was added, the surface of the plated layer is covered with a plurality of mesh like cracks, whereas in the comparative example 1 almost no cracks were generated.

Figure 12:
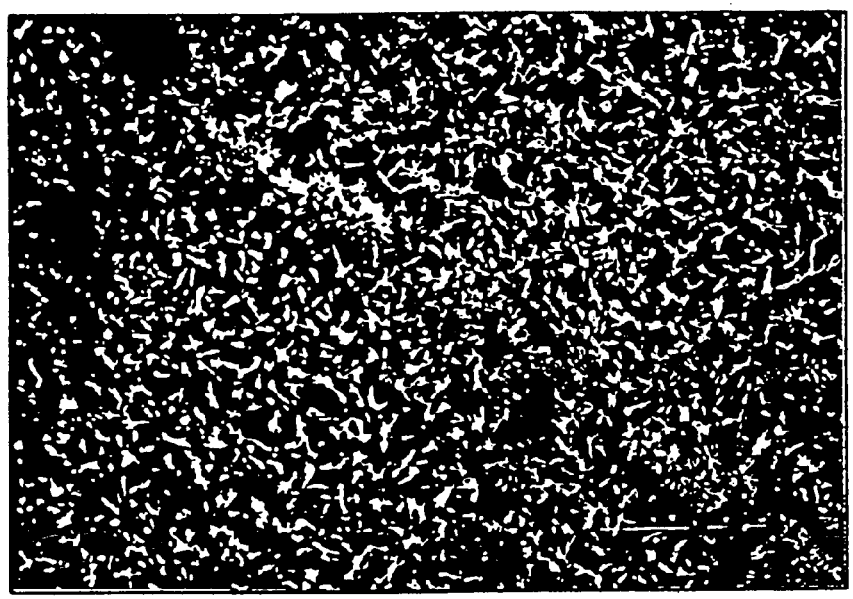
FIG. 12 is an electron microscope photograph of a comparative example 2 which has undergone black oxide finish treatment.

As a comparison, a copper sheet identical to that used in the working example 1 was coated with a conventional black oxide finish by immersing the sheet in a 200 ml/l aqueous solution of "Ebonol C-115" made by Meltech Corporation and boiling for three minutes. The black oxide finish treated item was then dried under the same conditions as the working example 1, and a 1000 fold electron microscope photograph taken to be used as a comparative example 2. As can be seen clearly in FIG. 12 the surface of the copper sheet of the comparative example 2 is covered with a plurality of fine needle like crystals, and displays clearly different surface conditions from those of the working example 1.

Experiment 2

Figure 13:
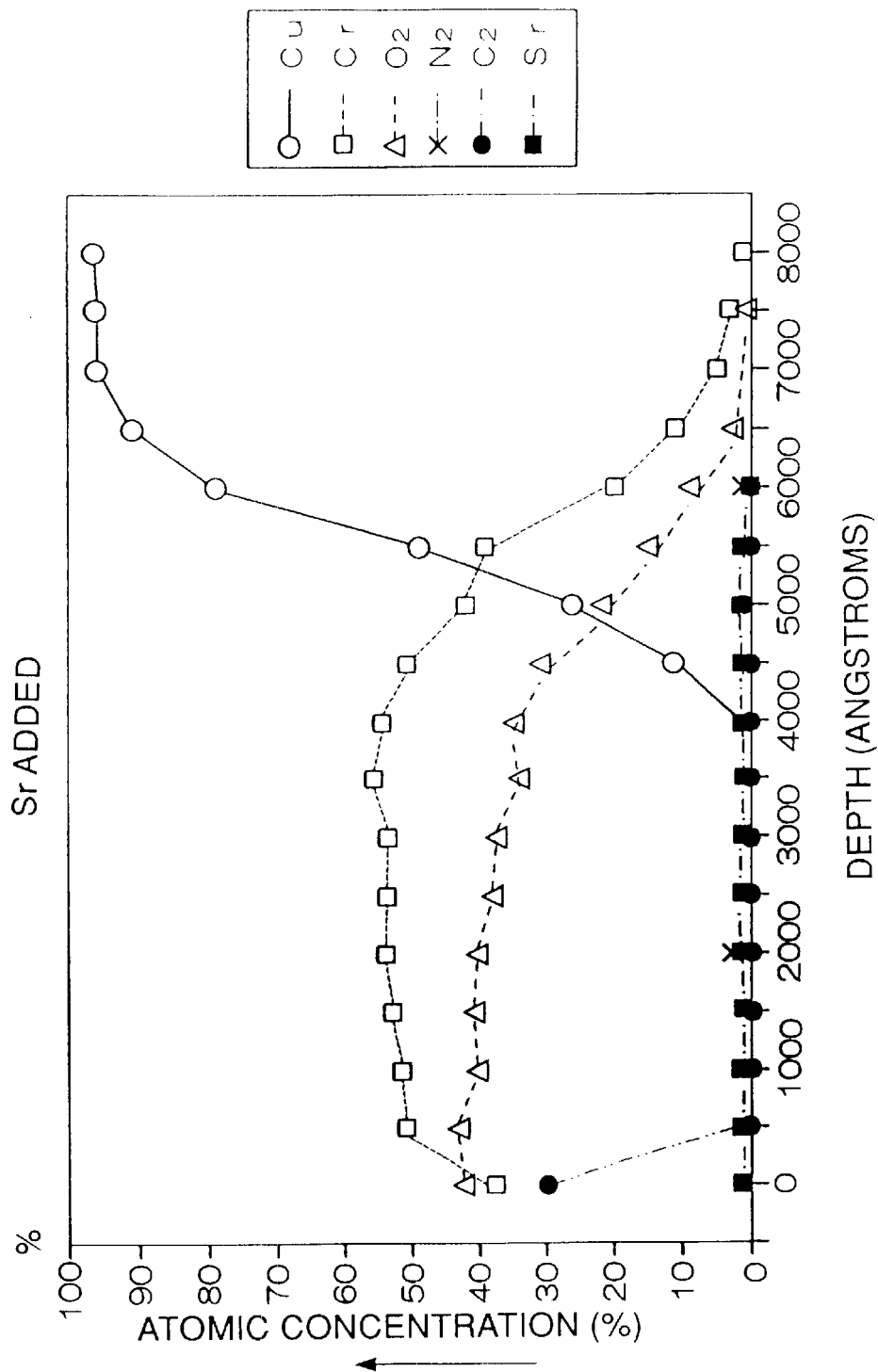
FIG. 13 is a graph showing the results of ESCA analysis of the working example 1.
Figure 14:
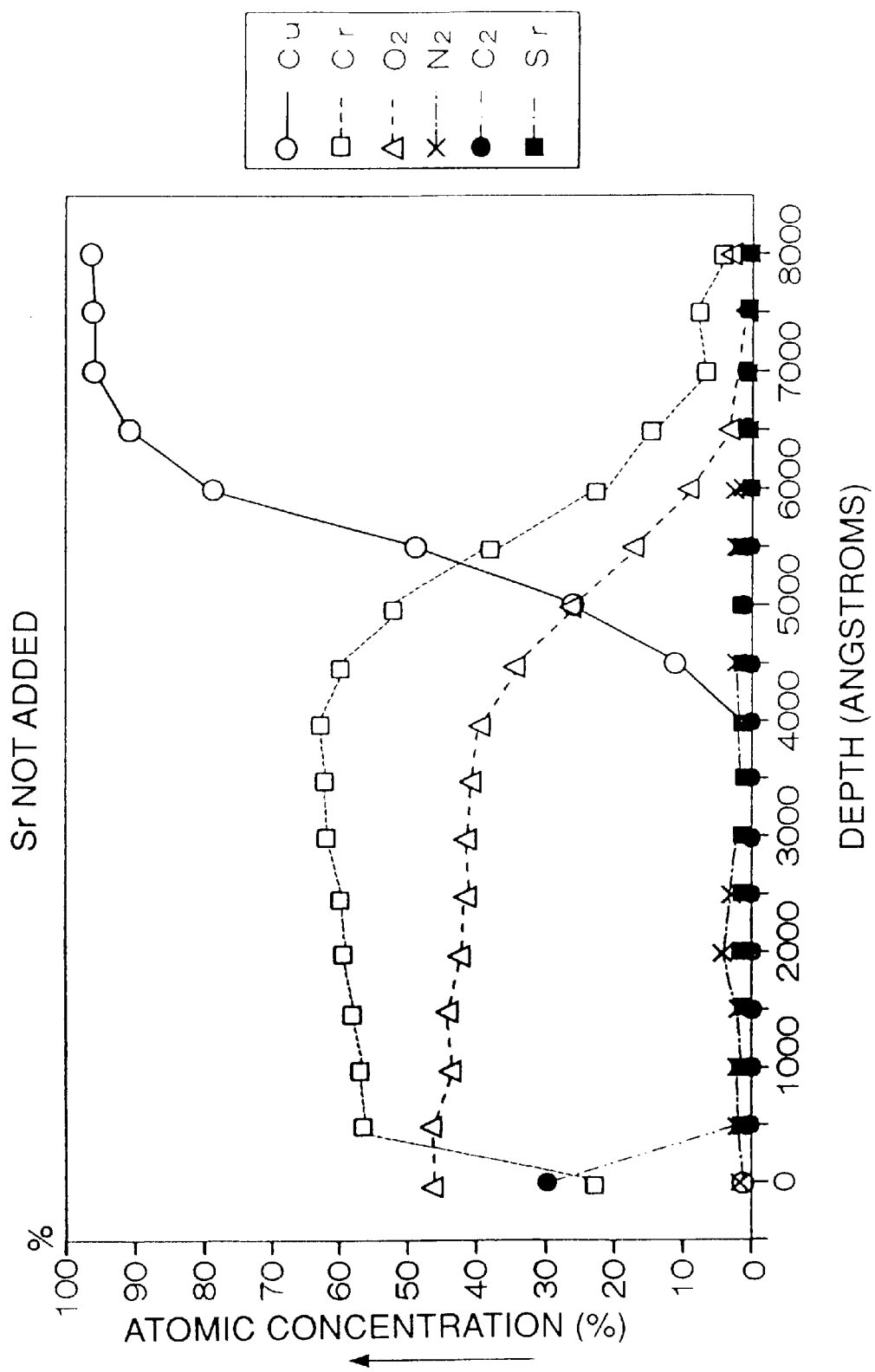
FIG. 14 is a graph showing the results of ESCA analysis of the comparative example 2.

Using the chrome oxide plated layers of the working example 1 and the comparative example 1, the surface of each plated layer was gradually shaved away and ESCA used to measure an elemental distribution in terms of the layer depth. The results of the measurements are shown in FIGS. 13 and 14 respectively. As can be seen clearly from the graphs, very small amounts of strontium were detected in the working example 1, but otherwise no significant differences were observed between the two samples. It is thought that the main constituent of the chrome oxide plated layers is $Cr_2O_3$.

Experiment 3

Six separate plated layers of the different thicknesses shown below were formed by using the same plating solution as that used for the working example 1, and conducting the plating procedure under the same conditions as those described for the working example 1, with the exception of the plating time duration which was varied in six steps of 30, 60, 90, 120, 180 and 240 seconds respectively.

| | |
|---|---|
| Working example 2: | less than 0.1 µm (average 0.08 µm) |
| Working example 3: | 0.1–0.2 µm (average 0.15 µm) |
| Working example 4: | 0.2–0.3 µm (average 0.25 µm) |
| Working example 5: | 0.3–0.4 µm (average 0.35 µm) |
| Working example 6: | 0.4–0.5 µm (average 0.45 µm) |
| Working example 7: | greater than 0.5 µm (average 0.65 µm) |

Figure 15:
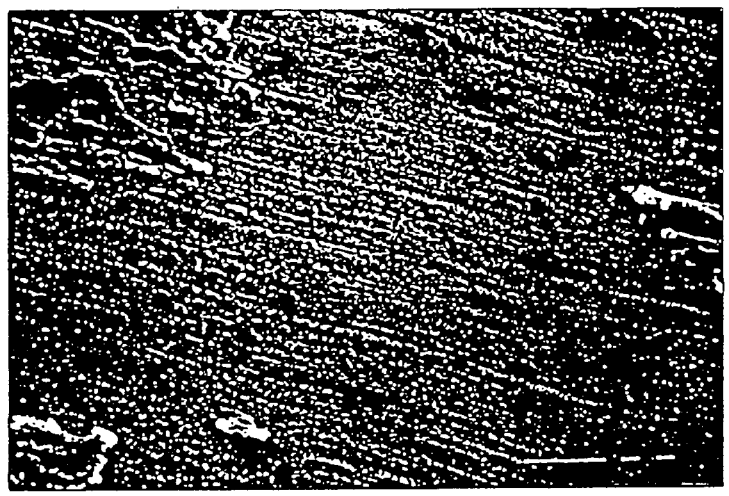
FIG. 15 is an electron microscope photograph showing a metallic compound layer in the case where the thickness of the plating layer is less than 0.1 µm.
Figure 16:
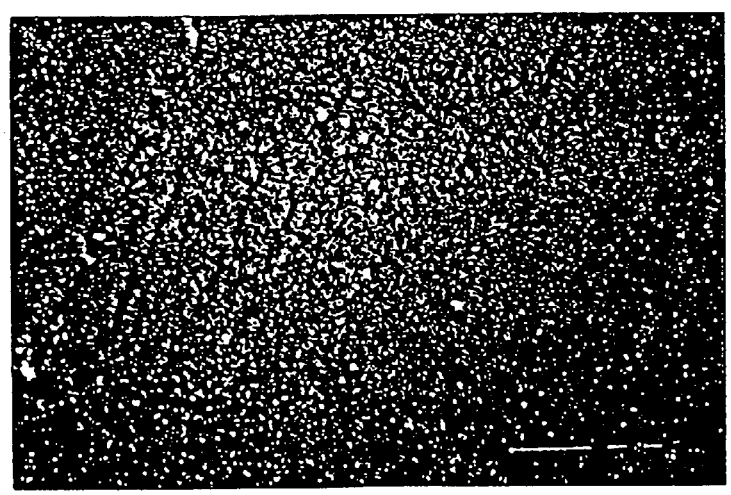
FIG. 16 is an electron microscope photograph showing a metallic compound layer in the case where the thickness of the plating layer is between 0.1~0.2 µm.
Figure 17:
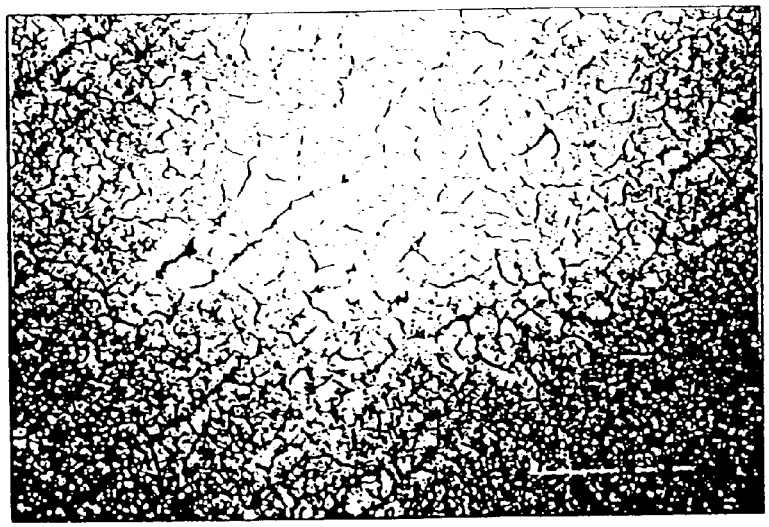
FIG. 17 is an electron microscope photograph showing a metallic compound layer in the case where the thickness of the plating layer is between 0.2~0.3 µm.
Figure 18:
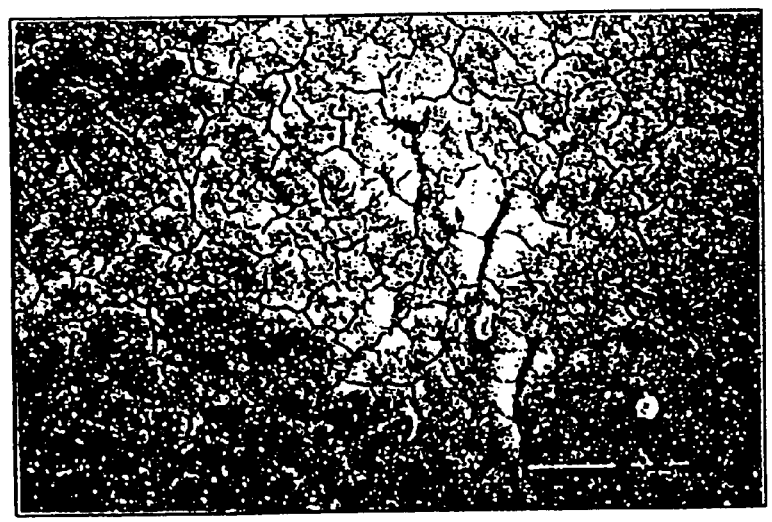
FIG. 18 is an electron microscope photograph showing a metallic compound layer in the case where the thickness of the plating layer is between 0.3~0.4 µm.
Figure 19:
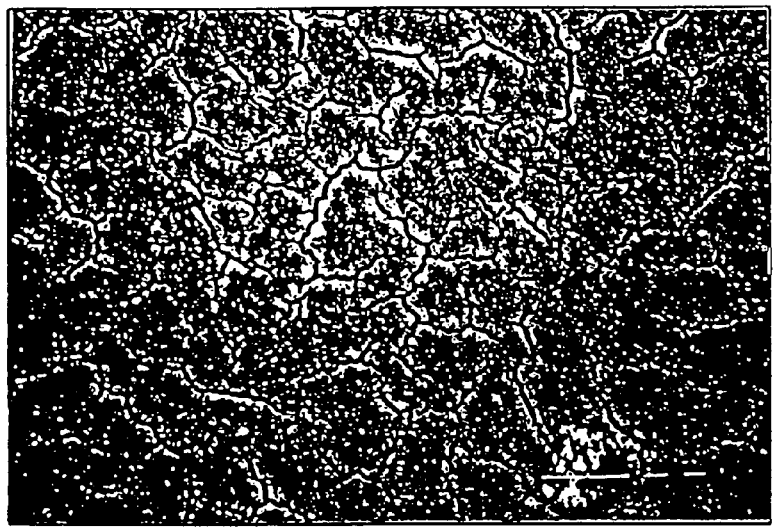
FIG. 19 is an electron microscope photograph showing a metallic compound layer in the case where the thickness of the plating layer is between 0.4~0.5 µm.
Figure 20:
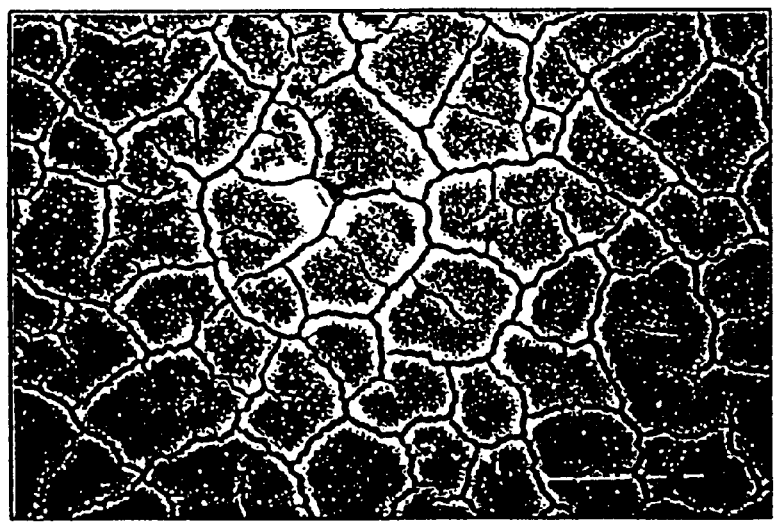
FIG. 20 is an electron microscope photograph showing a metallic compound layer in the case where the thickness of the plating layer is greater than 0.5 µm.

1000 fold electron microscope photographs of the plated layers of the working examples 2~7 are shown in FIGS. 15~20 respectively. As shown in FIG. 15, with chrome oxide layers of thickness less than 0.1 µm, irregularities exist in the condition of the plated film, and insufficient cracks have been formed. At film thickness values greater than 0.1 µm, the clarity of the cracks increases with increasing film thickness, as does the mesh average diameter.

Experiment 4

A 50 µm layer of a polyimide adhesive ("Neoflex" a brand name of Mitsui Chemicals Corporation) was pasted on to the plated layers of each of the working examples 2~7, and following the placement of a copper foil of thickness 0.035 mm on top of the adhesive, the adhesive was solidified by heat treatment under conditions of 50~90kg/cm$^2$ of press pressure, 250° C. heating temperature, and 2 hours of heating time. The thickness of the polyimide layers thus formed was 30 µm. Next, the peel strength of the copper foil was measured. The experimental method used was the JIS C-6481 standard. This method uses a copper foil of width 10 mm and length 100 mm which is bonded along the center line of a substrate of width 25 mm and length 100 mm, and the foil is then peeled from one end, away from the substrate, at an angle of 90 and with a velocity of 50 mm/min, and the force (kg/cm$^2$) required to achieve the peel measured.

Next, samples of the working examples 2~7 were set in a hot air dryer and heated for 3 hours at 180° C., with the peel strength of the copper foil then measured using the same method as that described above.

Figure 21:
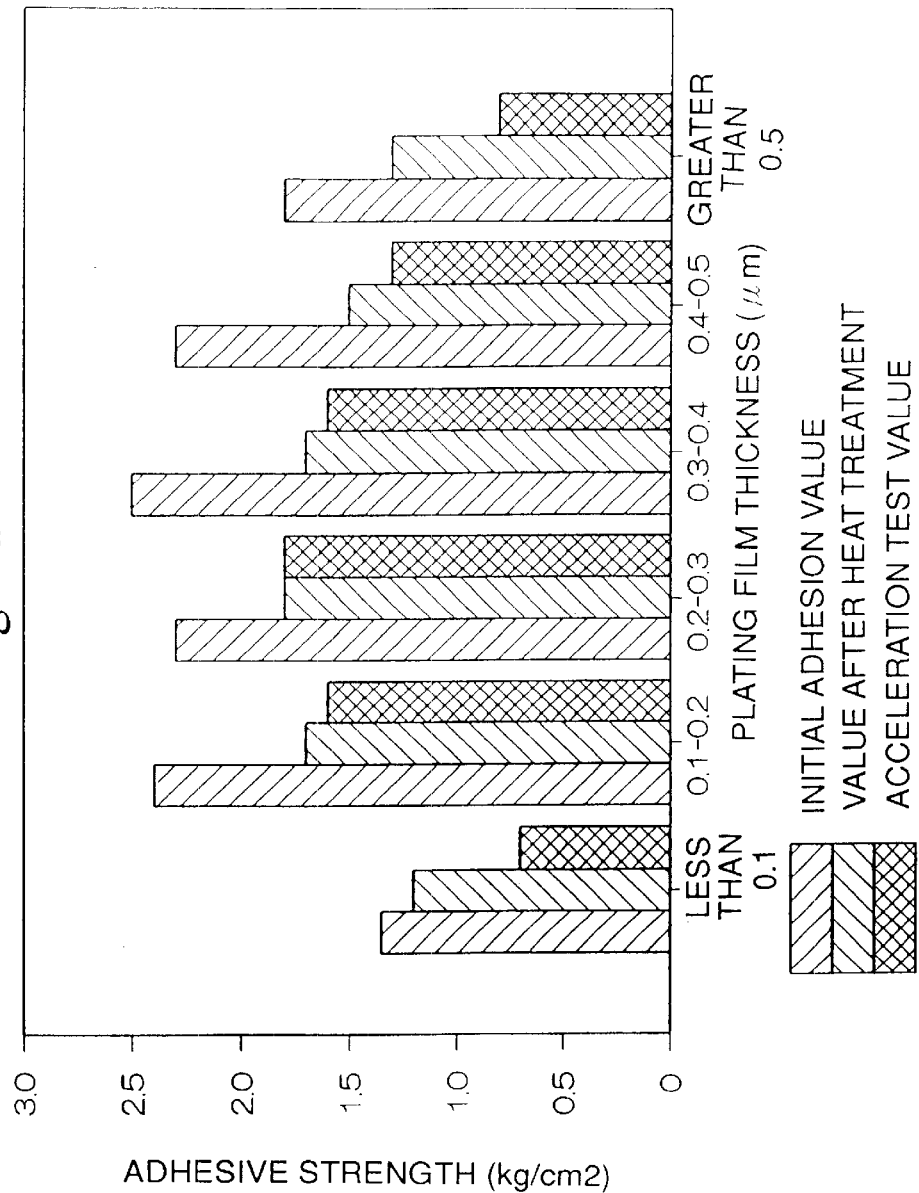
FIG. 21 is a graph showing the relationship between layer thickness and adhesive strength for the present invention.

In addition, samples of the working examples 2~7 were also subject to degradation acceleration treatment in a PCT (pressure cooker test; an advanced accelerated life span test) under conditions of 121° C. and 85% relative humidity for a duration of three hours, with the peel strength of the copper foil then being measured in the same manner as above. The results of all the measurements are shown in FIG. 21. As can be seen clearly from the graphs, although the peel strength following heat treatment or acceleration tests is lower than that observed immediately following bonding to the substrate, the cracks have resulted in a significant improvement in the bonding strength.

Figure 22:
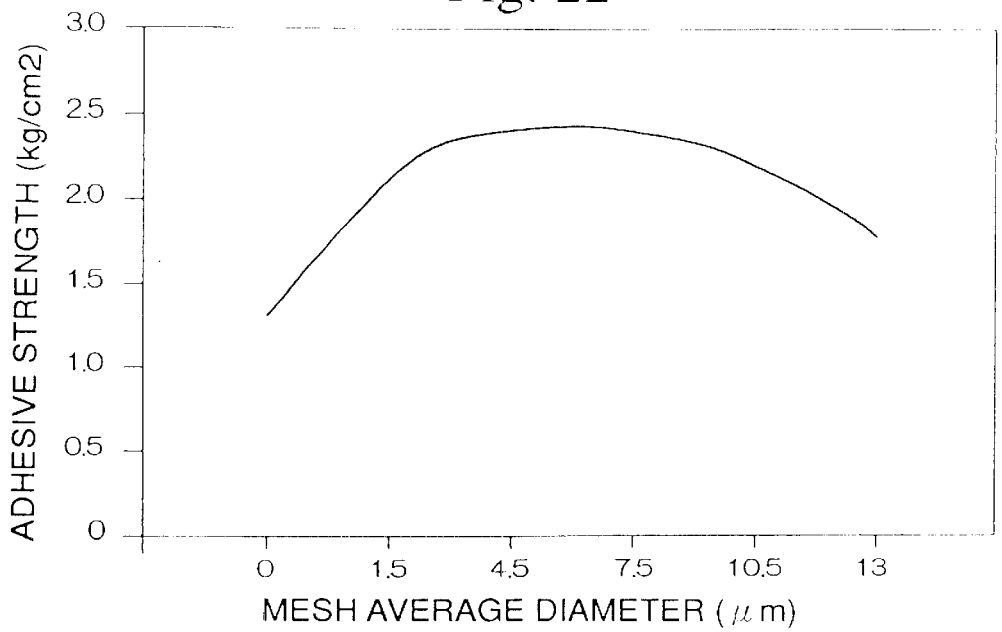
FIG. 22 is a graph showing the relationship between average mesh diameter and adhesive strength for the present invention.

FIG. 22 shows the results of plotting the relationship between the mesh average diameter (the method of measurement has been described above) of the cracks from the working examples 2~7 and the adhesive strength of the copper foil. It is clear from the graph that the adhesive strength is at a maximum value for mesh average diameters of 1.5~10.5 µm, or more specifically between 3~8µm.

Experiment 5

Figure 23:
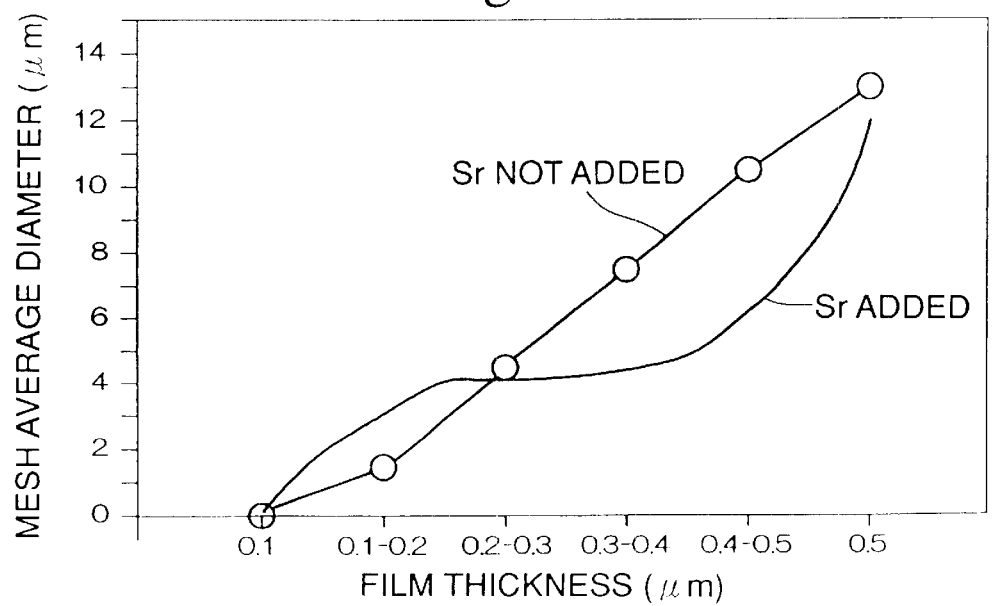
FIG. 23 is a graph showing the relationship between layer thickness and average mesh diameter for the present invention.

The results of the plotting of the relationship between plated film thickness in the working examples 2~7 and mesh average diameter of the cracks, were compared with results obtained using a plating solution to which strontium sulfate had not been added. The results are shown in FIG. 23. As can be seen clearly from the graph, the addition of strontium produces a region for plating thickness values in the range 0.1~0.5 μm in which the tendency for the mesh average diameter to increase is suppressed.

Experiment 6

A working example 8 was produced by using the same plating solution as the working example 1 to form a crack covered chromium oxide layer of thickness 0.3~0.4 μm on a copper substrate of thickness 0.5 mm, bonding a copper foil of thickness 0.035 mm on to the chromium oxide layer with a polyimide adhesive ("Neoflex" from Mitsui Chemicals Corporation), and then hardening the adhesive under conditions of 50~90 kg/cm² of press pressure, 250° C. heating temperature, and 2 hours of heating time. Furthermore, a working example 9 was produced by forming a chromium oxide layer similar to that of the working example 8 on a copper substrate of thickness 0.5 mm, bonding a copper foil of thickness 0.035 mm on to the chromium oxide layer with an epoxy adhesive ("16X-044" from Three Bond Corporation), and then following crimping with a laminator at 110° C.×0.6 m/min and with a pressure of 1.5 kg/cm², sequential treatment at 80° C.×3 hours, 110° C.×2 hours, 150° C.×2.5 hours and 165° C.×2.5 hours was carried out to harden the adhesive.

In contrast, a comparative example 3 was produced by bonding a copper foil of thickness 0.035 mm directly to a copper substrate of thickness 0.5 mm with a polyimide adhesive ("Neoflex" from Mitsui Chemicals Corporation), and then hardening the adhesive under the same conditions as the working example 8. Furthermore, a comparative example 4 was produced by bonding a copper foil of thickness 0.035 mm directly to a copper substrate of thickness 0.5 mm with an epoxy adhesive ("16X-044" from Three Bond Corporation), and then following crimping with a laminator at 110° C.×0.6 m/min and with a pressure of 1.5 kg/cm², hardening the adhesive at 80° C.×3 hours, 110° C.×2 hours, 150° C.×2.5 hours and 165° C.×2.5 hours.

A comparative example 5 was generated by black oxide finish treating a copper substrate of thickness 0.5 mm for three minutes at 30° C. in a 200 ml/black oxide finish solution of "Ebonol C-115" made by Meltech Corporation, then using the same conditions as those used for the working example 8 for bonding a copper foil of thickness 0.035 mm on to the black treated surface with a polyimide adhesive ("Neoflex" made by Mitsui Chemicals Corporation), and then hardening the adhesive under conditions of 50~90 kg/cm² of press pressure, 250° C. heating temperature, and 2 hours of heating time. Furthermore, a comparative example 6 was produced by forming a chromium oxide layer identical with that of the working example 8 on a copper substrate of thickness 0.5 mm, then bonding a copper foil of thickness 0.035 mm on to the chromium oxide layer with an epoxy adhesive ("16X-044" from Three Bond Corporation), and then following crimping with a laminator at 110° C.×0.6 m/min and with a pressure of 1.5 kg/cm², hardening the adhesive at 80° C.×3 hours, 110° C.×2 hours, 150° C.×2.5 hours and 165° C.×2.5 hours.

Figure 24:
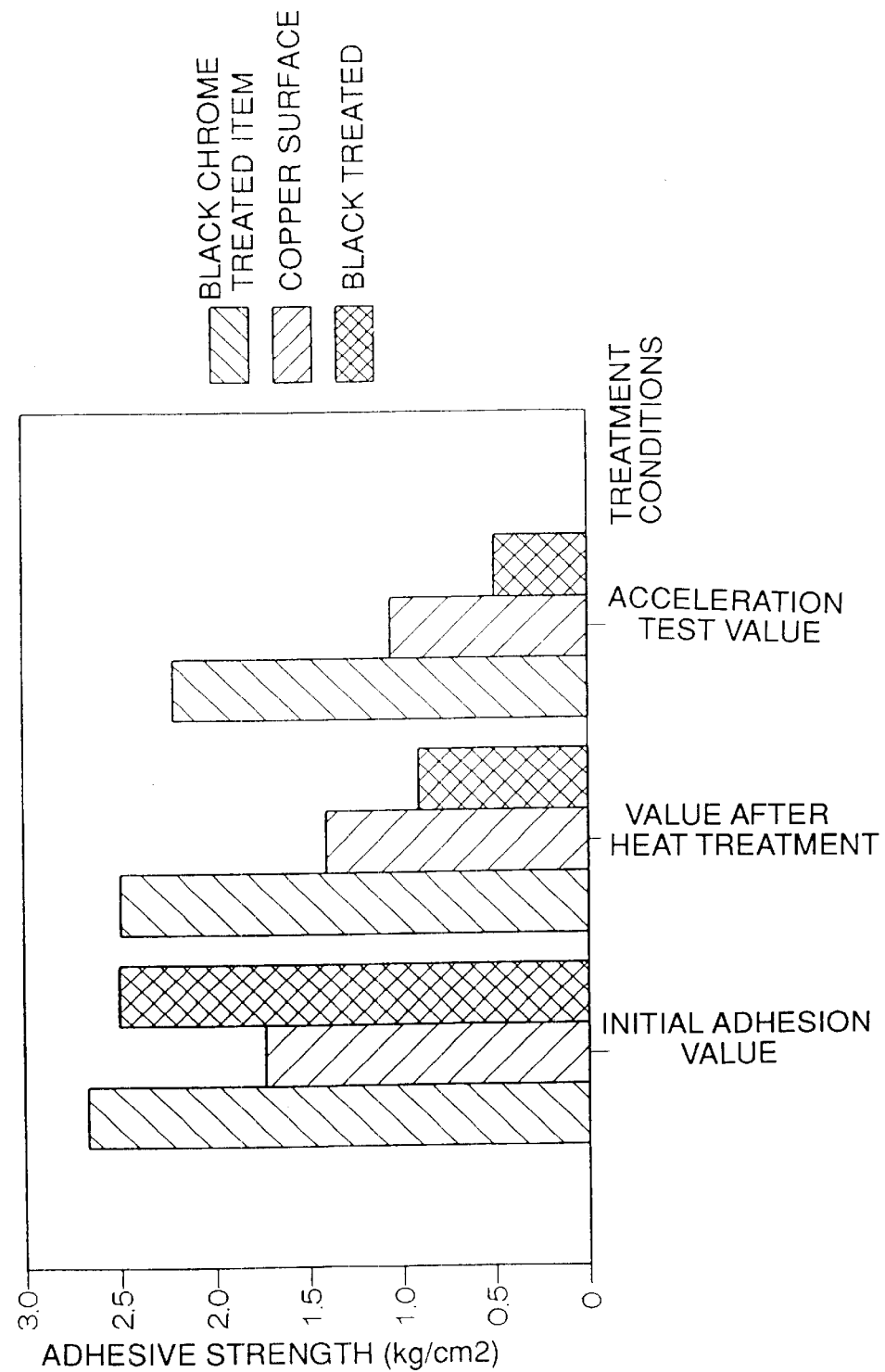
FIG. 24 is a graph showing the adhesive strength for a copper clad laminate when a polyimide type adhesive is used.
Figure 25:
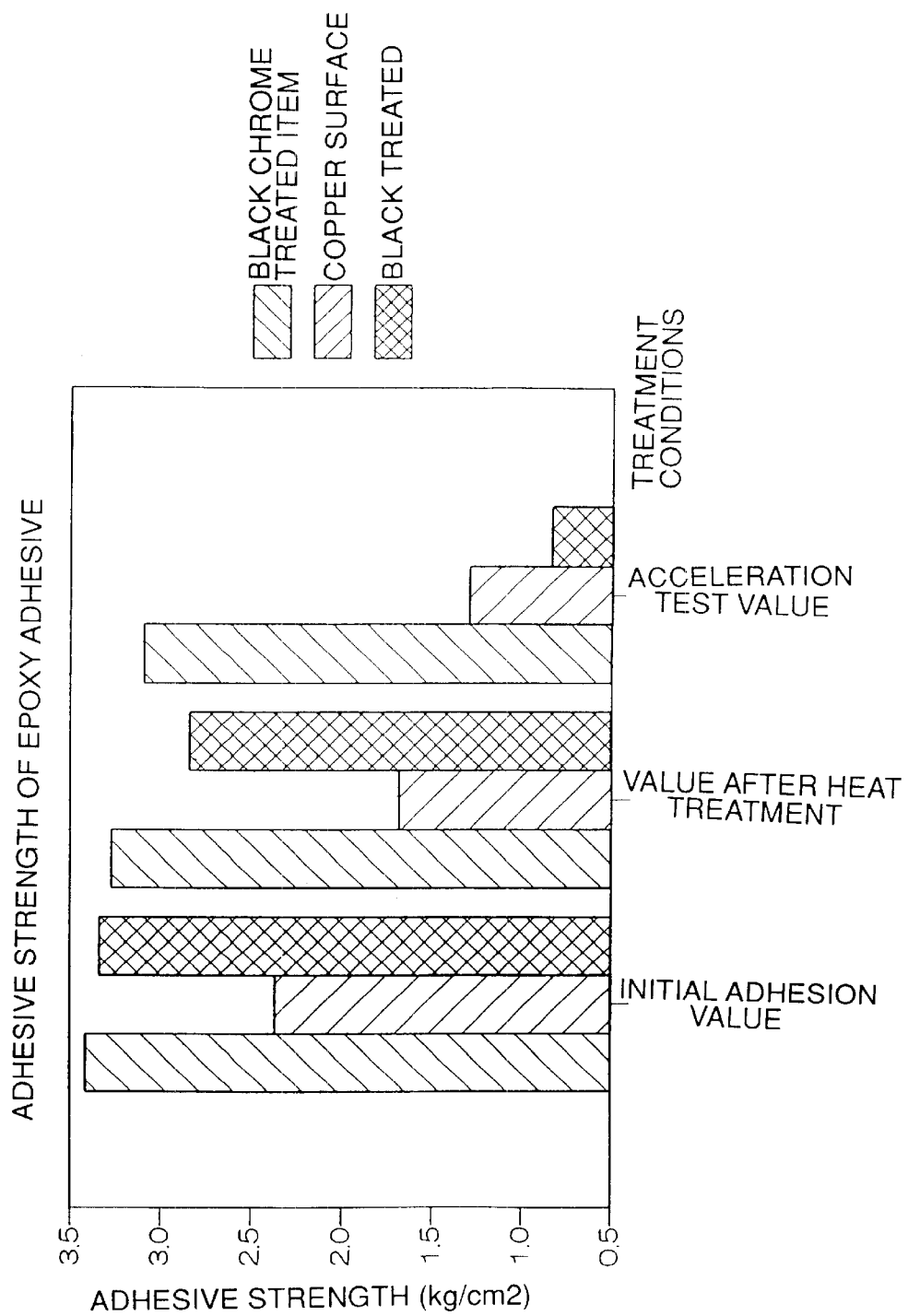
FIG. 25 is a graph showing the adhesive strength for a copper clad laminate when an epoxy type adhesive is used.

The laminated plates of the working examples 8, 9 and the comparative examples 3~6 were subjected to peel strength measurements immediately following bonding to the substrate, following heat treatment, and following accelerated degradation treatment, in the same manner as experiment 4. The results are shown in table 1 and FIGS. 24 and 25. As can be seen clearly from table 1 and each of the graphs, black oxide treated items displayed good initial adhesive strength, but the bonding strength diminishes considerably following heat treatment or accelerated degradation treatment, and actually falls below the strength observed in the case of resin layer formation directly on to the copper surface.

In contrast, the working examples 8, 9 of the present invention display good adhesive strength even following heat treatment or accelerated degradation treatment.

TABLE 1

| Sample | Type of Adhesive | Bonding strength immediately after bonding (kg/cm²) | Bonding strength following heating (kg/cm²) | Bonding strength following accelerated degradation (kg/cm²) |
| --- | --- | --- | --- | --- |
| Working example 8 | Polyimide adhesive | 2.68 | 2.44 | 2.16 |
| Comparative example 3 | | 1.70 | 1.36 | 1.01 |
| Comparative example 4 | | 2.44 | 0.87 | 0.47 |
| Working example 9 | Epoxy adhesive | 3.42 | 3.22 | 3.02 |
| Comparative example 5 | | 2.32 | 1.65 | 1.28 |
| Comparative example 6 | | 3.30 | 2.78 | 0.79 |
| Working example 10 | Polyimide adhesive | 2.35 | 1.82 | 1.79 |
| Comparative example 7 | | 1.40 | 1.05 | 0.54 |
| Comparative example 8 | | 2.24 | 2.01 | 0.83 |
| Working example 11 | Epoxy adhesive | 2.40 | 1.98 | 1.85 |
| Comparative example 9 | | 1.83 | 1.15 | 0.78 |
| Comparative example 10 | | 2.14 | 1.56 | 0.75 |

Experiment 7

A working example 10 was produced by using the same plating solution as the working example 1 to form a crack covered chromium oxide layer of thickness 0.3~0.4 μm on one side of a copper foil of thickness 0.035 mm, bonding a polyimide film of thickness 0.075 mm on to the chromium oxide layer with a polyimide adhesive ("Neoflex" from Mitsui Chemicals Corporation), and then hardening the adhesive under conditions of 50~90 kg/cm$^2$ of press pressure, 250° C. heating temperature, and 2 hours of heating time.

Furthermore, a working example 11 was produced by forming a chromium oxide layer similar to that of the working example 8 on a copper foil of thickness 0.035 mm, bonding a polyimide film of thickness 0.075 mm on to the chromium oxide layer with an epoxy adhesive ("16X-044" from Three Bond Corporation), and then following crimping with a laminator at 110° C.×0.6 m/min and with a pressure of 1.5 kg/cm$^2$, sequential treatment at 80° C.×3 hours, 110° C.×2 hours, 150° C.×2.5 hours and 165° C.×2.5 hours was carried out to harden the adhesive.

In contrast, a comparative example 7 was produced by bonding a polyimide film of thickness 0.075 mm directly to a copper foil of thickness 0.035 mm with a polyimide adhesive ("Neoflex" from Mitsui Chemicals Corporation), and then hardening the adhesive under the same conditions as the working example 8. Furthermore, a comparative example 8 was produced by bonding a copper foil of thickness 0.035 mm directly to a copper foil of thickness 0.035 mm with an epoxy adhesive ("16X-044" from Three Bond Corporation), and then following crimping with a laminator at 110° C.×0.6 m/min and with a pressure of 1.5 kg/cm$^2$, hardening the adhesive at 80° C.×3 hours, 110° C×2 hours, 150° C.×2.5 hours and 165° C.×2.5 hours.

A comparative example 9 was generated by black oxide finish treating a copper foil of thickness 0.035 mm for three minutes at 30° C. in a 200 ml/l black oxide finish solution of "Ebonol C-115" made by Meltech Corporation, then using the same conditions as those used for the working example 8 to bond a polyimide film of thickness 0.075 mm on to the black treated surface with a polyimide adhesive ("Neoflex" made by Mitsui Chemicals Corporation), and then hardening the adhesive under conditions of 50~90 kg/cm$^2$ of press pressure, 250° C. heating temperature, and 2 hours of heating time.

Furthermore, a comparative example 10 was generated by black oxide finish treating a copper foil of thickness 0.035 mm for three minutes at 30° C. in a 200 ml/l black oxide finish solution of "Ebonol C-115" made by Meltech Corporation, then bonding a polyimide film of thickness 0.075 mm on to the black oxide finish treated surface with an epoxy adhesive ("16X-044" from Three Bond Corporation), and then following crimping with a laminator at 110° C.×0.6 m/min and with a pressure of 1.5 kg/cm$^2$, hardening the adhesive at 80° C.×3 hours, 110° C.×2 hours, 150° C.×2.5 hours and 165° C.×2.5 hours.

Figure 26:
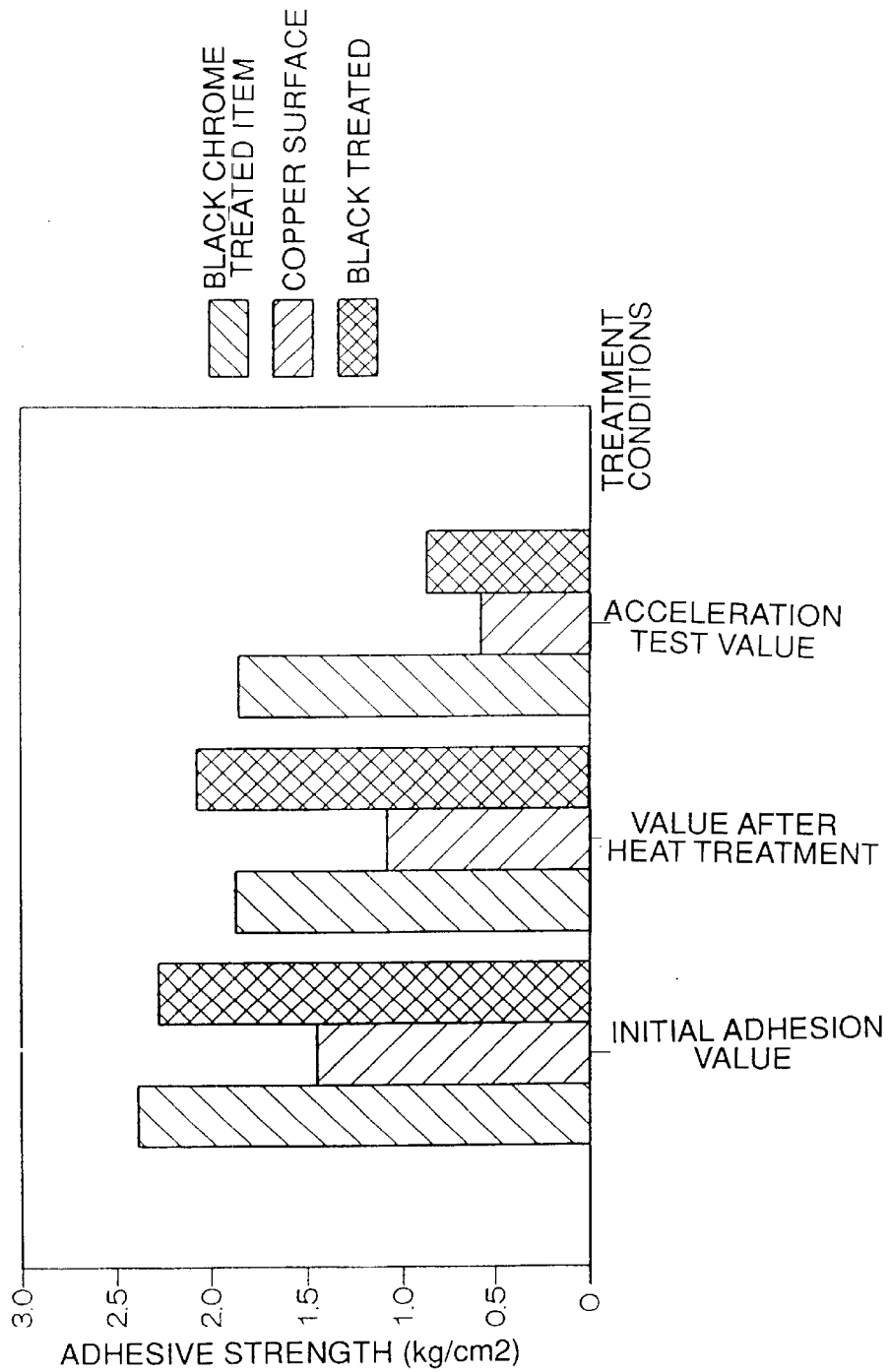
FIG. 26 is a graph showing the adhesive strength when a polyimide film is used with a polyimide type adhesive.
Figure 27:
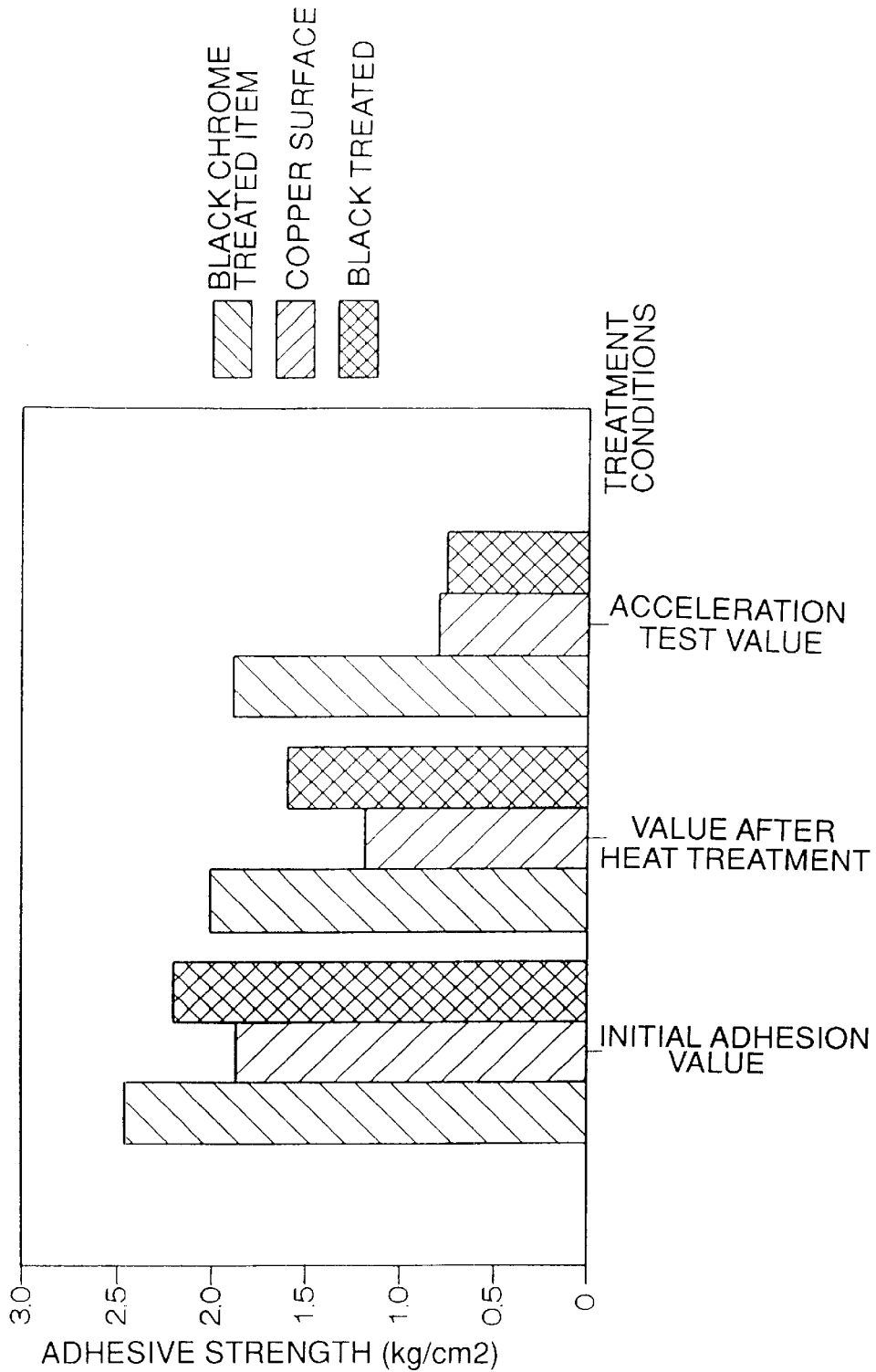
FIG. 27 is a graph showing the adhesive strength when a polyimide film is used with an epoxy type adhesive.

The laminated plates of the working examples 10, 11 and the comparative examples 7~10 were subjected to peel strength measurements immediately following bonding to the substrate, following heat treatment, and following accelerated degradation treatment, in the same manner as experiment 4. The results are shown in table 1 and FIGS. 26 and 27. As can be seen clearly from the table and graphs, black oxide treated items displayed good initial adhesive strength, but the bonding strength diminishes considerably following heat treatment or accelerated degradation treatment. In contrast, the working examples 10, 11 of the present invention displayed good adhesive strength even following heat treatment or accelerated degradation treatment.

Experiment 8

Using a chromium oxide plating solution, a comparative example 12 was formed by conducting plating under conditions of typically low cathode current density, while working examples 12~16 wherein the surfaces thereof comprise scaly protrusions were obtained by conducting plating under conditions of high cathode current density. Furthermore, a comparative example 13 was produced by conventional black oxide finish treatment. Electron microscope photographs were then taken of the samples and subsequently compared. The experimental method is described below.

Figure 35:
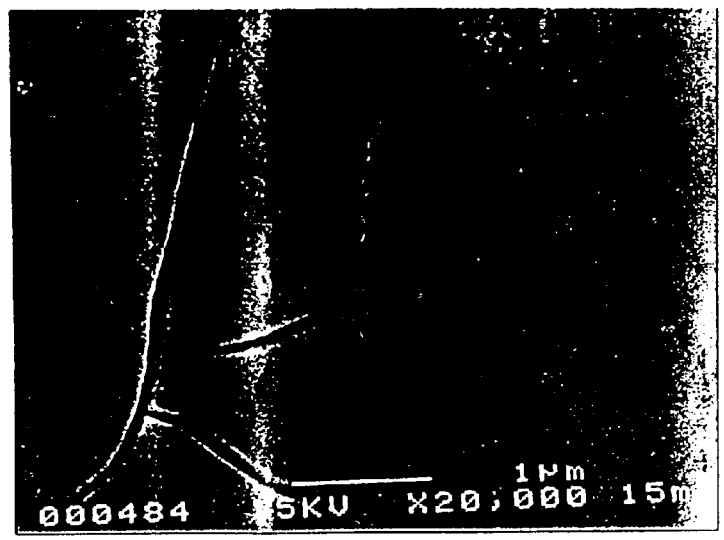
FIG. 35 is an electron microscope photograph (×20,000) showing the surface conditions of the metallic compound layer of a comparative example 12.

A chromium oxide plating solution of the composition shown below was prepared.

anhydrous chromic acid: 400 g/l
acetic acid (99%): 50 ml/l
sodium dichromate: 40 g/l
boric acid: 0.5 g/l
sodium nitrate: 2 g/l
sodium silicofluoride: 5 g/l A 10×5 cm pure copper sheet and a lead anode were immersed in the chromium oxide plating solution, and the copper sheet was then connected to a power supply cathode and the lead electrode to the power supply anode, and electroplating then conducted under the following conditions.

plating temperature: 20° C.
Comparative example 12: cathode current density 4 A/dm$^2$
plating time duration: 180 seconds
Working examples 12~16: cathode current density 10 A/dm$^2$
plating time duration:
Working example 12: 105 seconds
Working example 13: 120 seconds
Working example 14: 135 seconds
Working example 15: 150 seconds
Working example 16: 180 seconds Each of the copper sheets, having undergone plating under the above conditions, was dried by heating for four hours at 90° C., and a 20,000 fold electron microscope photograph then taken of the surface of the plated layer. The photographs from the working examples 12~16 are shown in FIGS. 30–34, and that from the comparative example 12 in FIG. 35. As can be seen clearly in the photographs, in the working examples 12~16 where the plating was conducted with a large cathode current density, the surface of the plated layer is covered with a plurality of scaly protrusions, whereas in the comparative example 12 almost no scaly protrusions were generated. Furthermore, measurement with an electrolytic thickness tester of the average film thickness of the black chrome layers on the working examples 12~16 generated results of 0.12 μm, 0.18 μm, 0.22 μm, 0.26 μm and 0.36 μm respectively.

Figure 36:
FIG. 36 is an electron microscope photograph (×5,000) of a comparative example 13 which has undergone black oxide finish treatment.

As a comparison, a copper sheet identical to that used in the working examples above was coated with a conventional black oxide finish by immersing the sheet in a 200 ml/l aqueous solution of "Ebonol C-115" made by Meltech Corporation and boiling for three minutes. The black oxide finish treated item was then dried under the same conditions as the working example 1, and a 5000 fold electron microscope photograph taken to be used as a comparative example 13. As can be seen clearly in FIG. 36 the surface of the copper sheet of the comparative example 13 is covered with a plurality of fine needle like crystals, and displays clearly different surface conditions from those of the working examples 12~16.

Working example 9

A 50 μm layer of a polyimide adhesive ("Neoflex", a brand name of Mitsui Chemicals Corporation) was pasted on to the metallic compound layers of each of the working examples 12~16 and the comparative examples 12, 13, and following the placement of a copper foil of thickness 0.035 mm on top of the adhesive, the adhesive was solidified by heat treatment under conditions of 50~90 kg/cm of press pressure, 250° C. heating temperature, and 2 hours of heating time. The thickness of the polyimide layers thus formed was 30 μm. Next, the peel strength of the copper foil was measured. The experimental method used was the JIS C-6481 standard. This method uses a copper foil of width 10 mm and length 100 mm which is bonded along the center line of a substrate of width 25 mm and length 100 mm, and the foil is then peeled from one end, away from the substrate, at an angle of 90 and with a velocity of 50 mm/min, and the force (kg/cm$^2$) required to achieve the peel measured.

Next, each sample was set in a hot air dryer and heated for 3 hours at 180° C., with the peel strength of the copper foil then measured using the same method as that described above.

Figure 37:
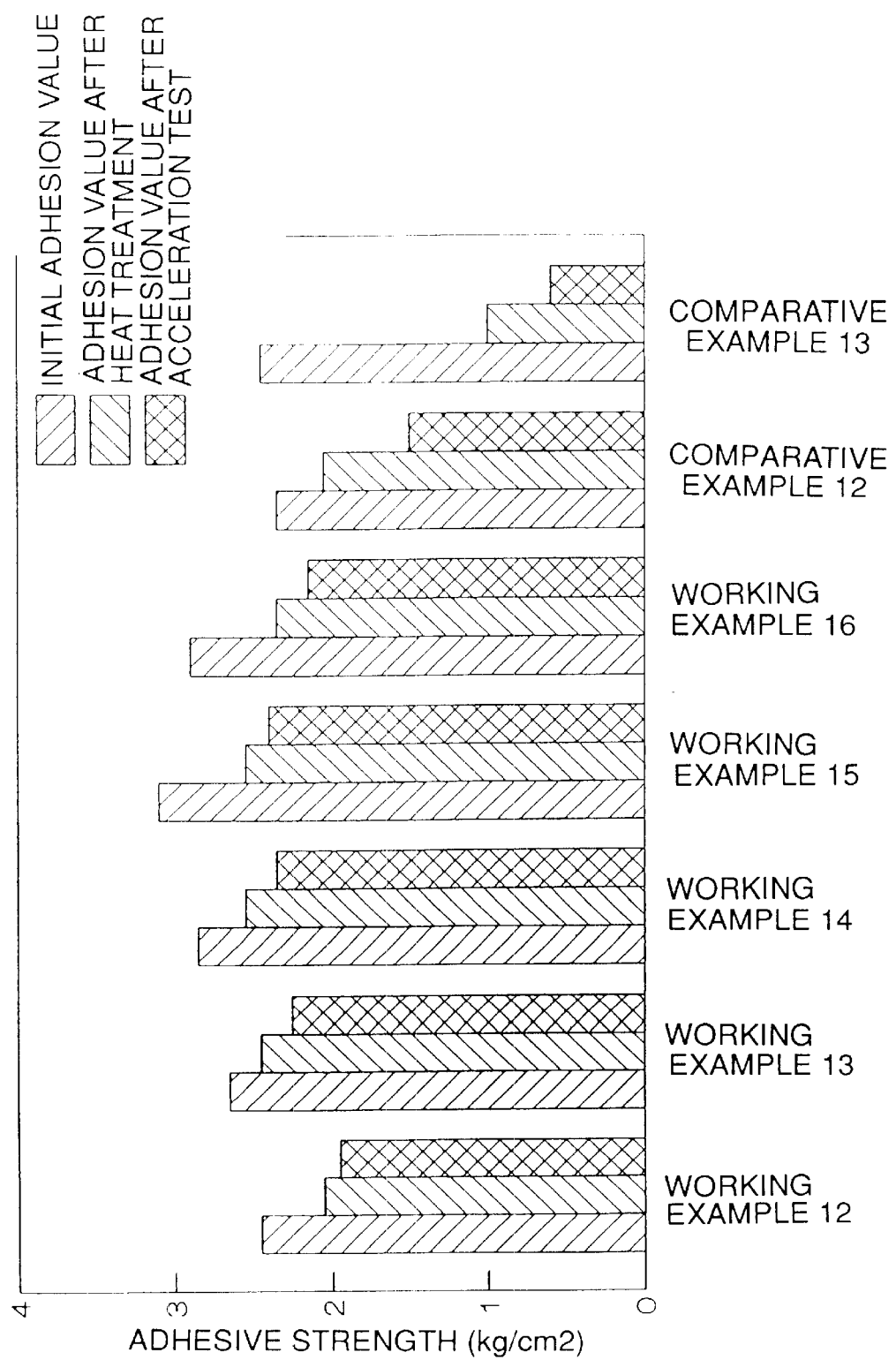
FIG. 37 is a graph showing the results of adhesive strength experiments conducted on the working examples 12~16 and the comparative examples 12 and 13.

In addition, samples were also subject to degradation acceleration treatment in a PCT (pressure cooker test; an advanced accelerated life span test) under conditions of 121° C. and 85% relative humidity for a duration of three hours, with the peel strength of the copper foil then being measured in the same manner as above. The results of all the measurements are shown in FIG. 37. As can be seen clearly from the graphs, although the peel strength following heat treatment or acceleration tests is lower than that observed immediately following bonding to the substrate, the scaly protrusions have resulted in a significant improvement in the bonding strength.

Experiment 10

Figure 38:
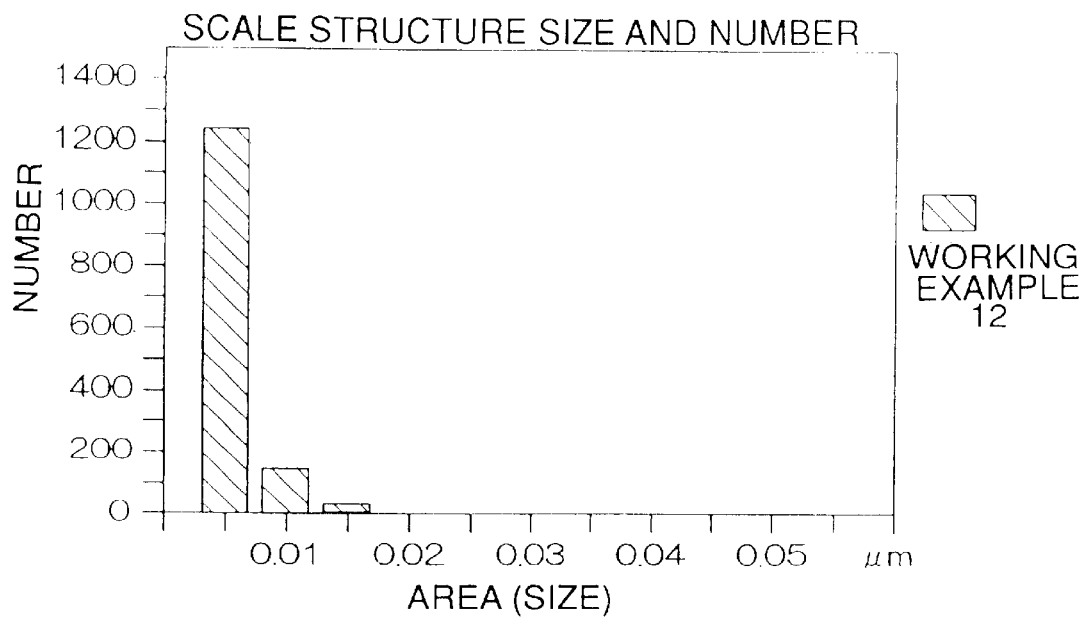
FIGS. 38~42 are graphs showing the distribution of the size of the protrusions for the working examples 12~16.
Figure 39:
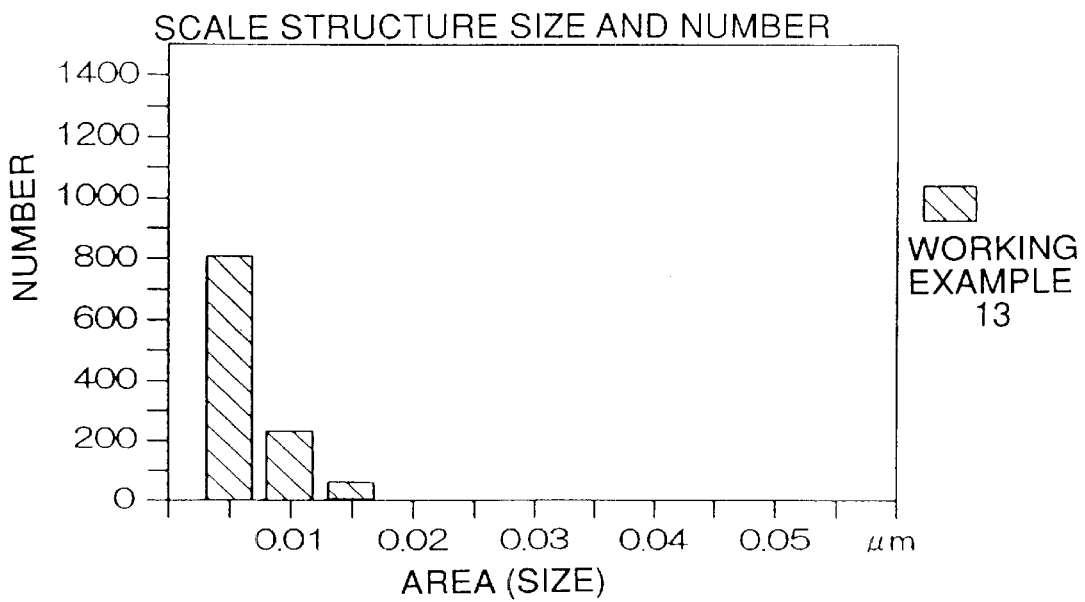
Figure 40:
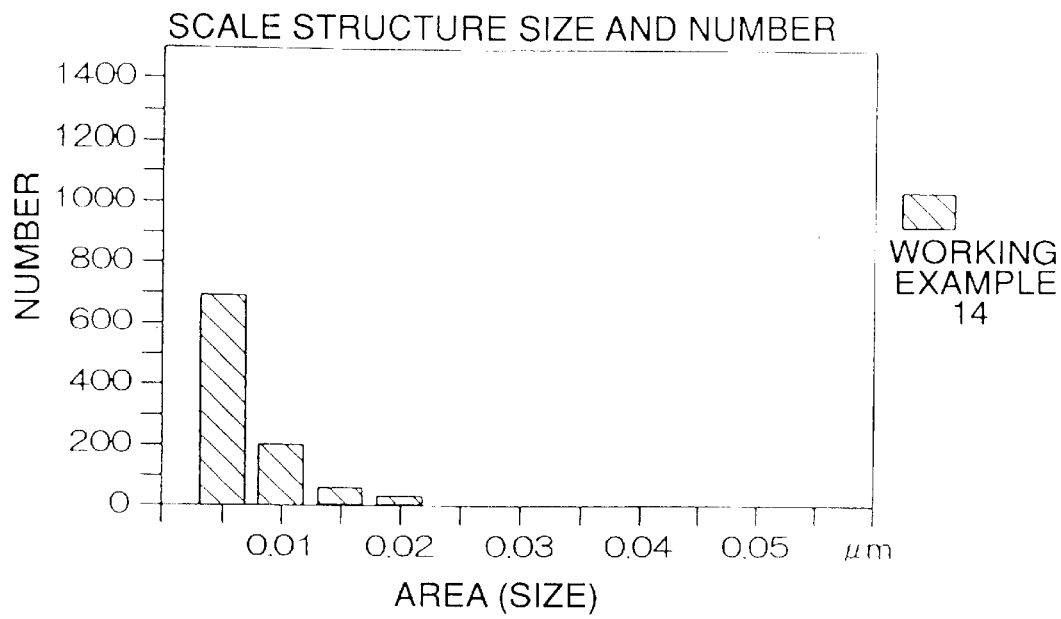
Figure 41:
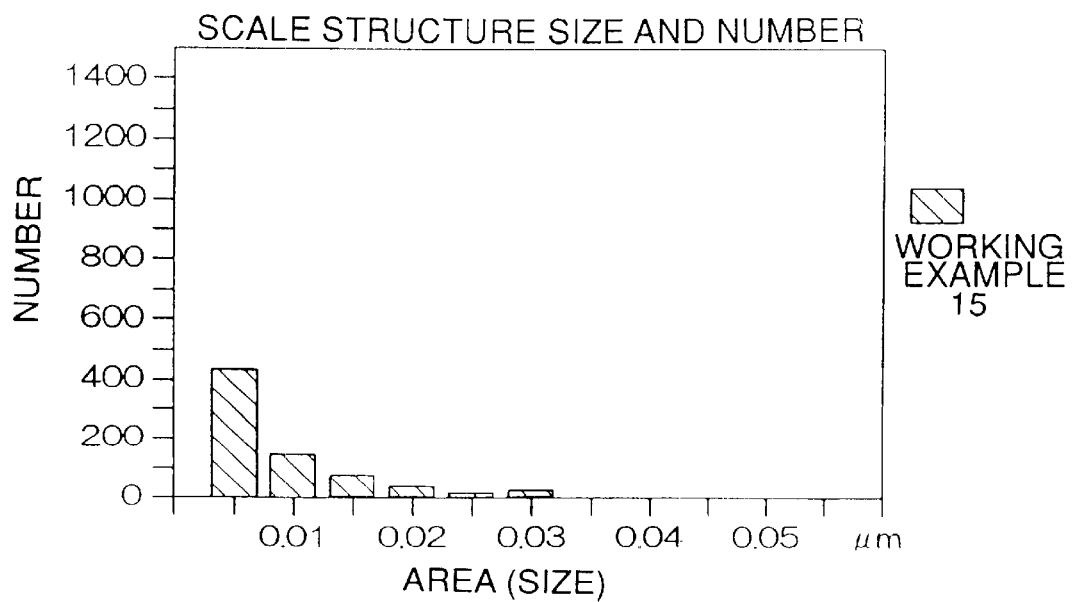
Figure 42:
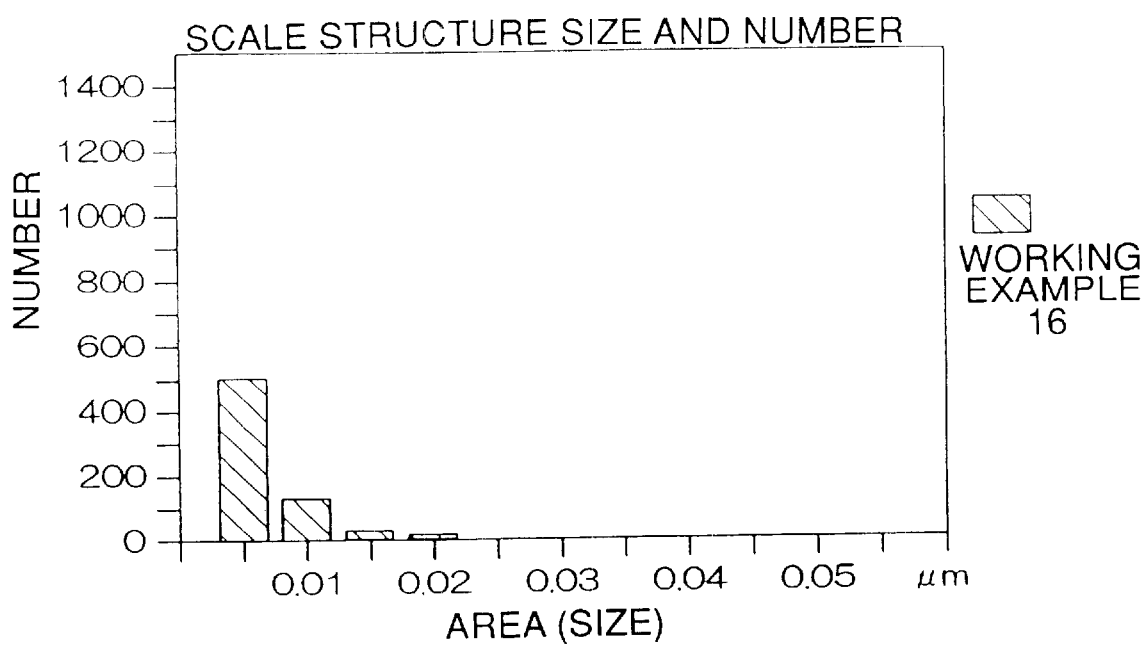

The electron microscope photographs (FIGS. 30~34) of each of the working examples 12~16 were scanned by a scanner, and following an equalization of the contrast, an image analysis was conducted by computer, and a measurement taken of the distribution of the major axial dimensions of the protrusions shown in the photograph. The results are shown in FIG. 38 (working example 12)~FIG. 42 (working example 16). As can be seen clearly from the graphs, as the plating time is increased the dimensions of the protrusions also increase.

Experiment 11

Using the same chromium oxide plating solution as that of experiment 8, working examples 17 and 18 were prepared by electroplating using the following materials, and under the following conditions.

Working example 17: material: C1020 (OFC)-½H
    plating temperature: 20° C.
    cathode current density: 9 A/dm$^2$
    plating time duration: 180 seconds Working example 18: material: T1940-SH
    plating temperature: 20° C.
    cathode current density: 9 A/dm$^2$
    plating time duration: 160 seconds The samples obtained by plating under the conditions listed above were dried in the same manner as that described in experiment 8, and the average film thickness of the metallic compound layer then measured using an electrolytic thickness tester, yielding results of 0.35 μm for the working example 17 and 0.26 μm for the working example 18.

Next, an elemental distribution in terms of the layer depth was measured for the metallic compound layers of the working examples 17 and 18, by using ESCA and gradually shaving away the surface at a rate of 60 Å/min for a period of 10 minutes.

Figure 43:
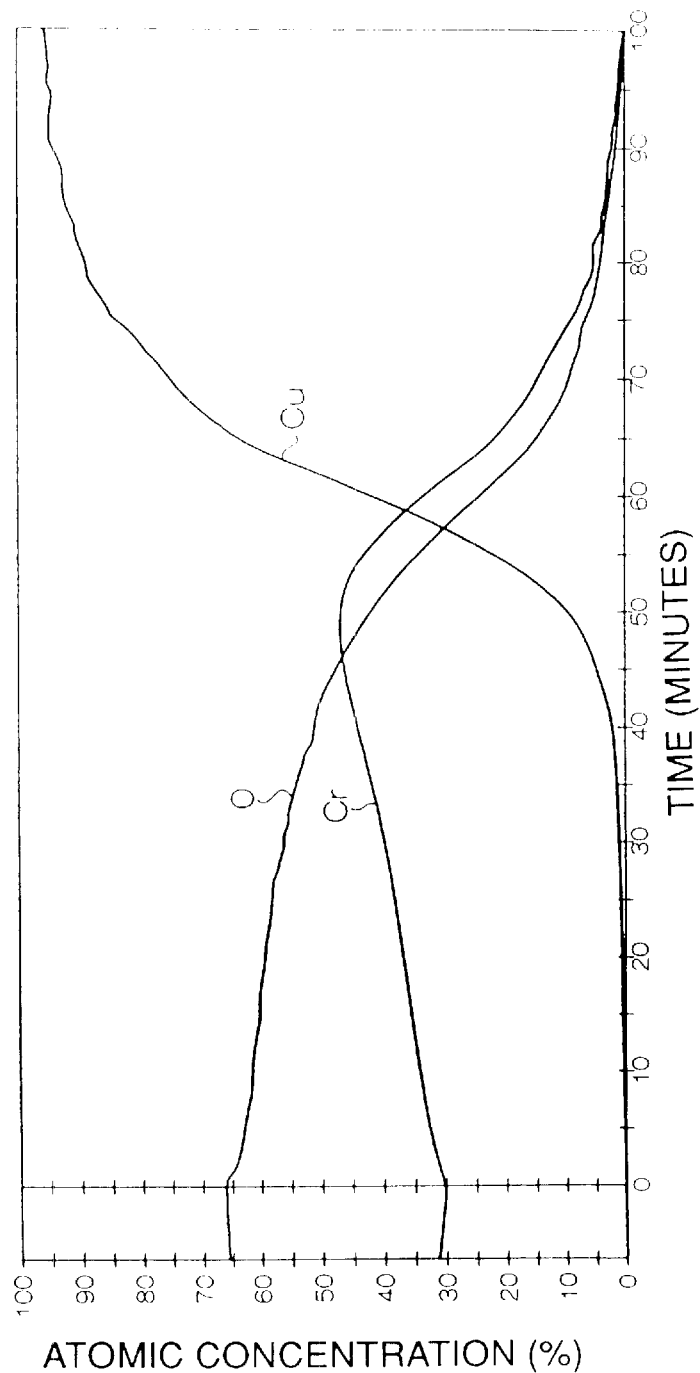
FIGS. 43 and 44 are graphs showing the elemental distribution measured in the direction of the depth of the chromium compound layer for working examples 17 and 18.
Figure 44:
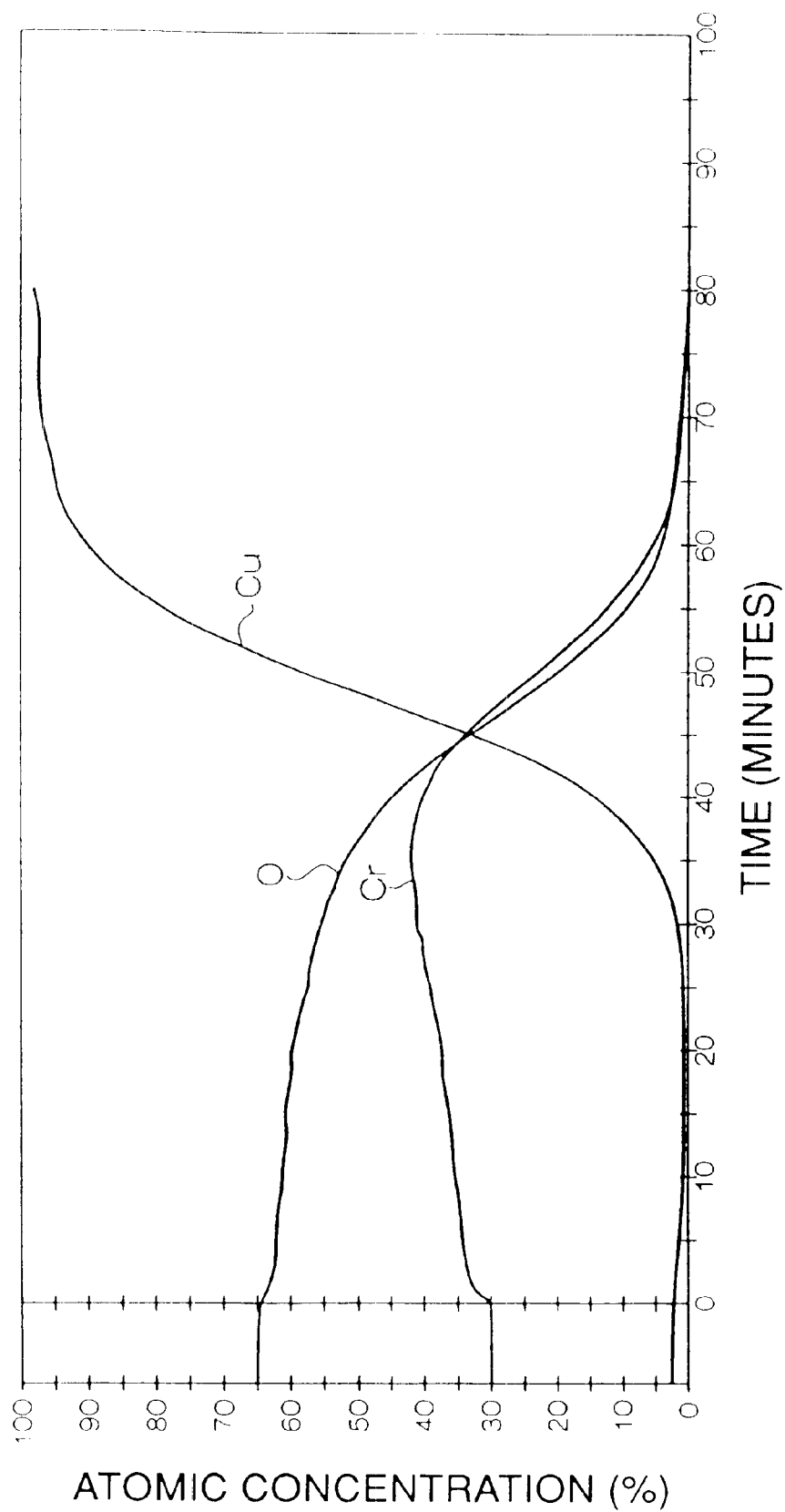

The results for the working example 17 are shown in FIG. 43 and the results for the working example 18 in FIG. 44. FIGS. 43 and 44 confirm that the elemental ratio of oxygen/chromium incorporated in the metallic compound layer increases in moving out from the copper substrate through to the surface.

What is claimed is:

1. A surface treated metallic material comprising a substrate in which at least the surface thereof is made of metal, and a metallic compound layer which is formed on at least a portion of said substrate surface, wherein a mesh pattern of minute cracks is formed across the entire surface of said metallic compound layer, wherein the average diameter of said mesh pattern formed by said cracks is no more than 20 μm and the cracks do not penetrate through the thickness of said metallic compound layer, and moreover wherein the thickness of said metallic compound layer is between 0.1~3.0 μm.

2. A surface treated metallic material comprising a substrate in which at least the surface thereof is made of metal, and a metallic compound layer which is formed on at least a portion of said substrate surface, wherein a mesh pattern of minute cracks is formed across the entire surface of said metallic compound layer, wherein said metallic compound layer incorporates strontium and either one, or two or more of, the materials selected from the group consisting of chromium oxide, chromium hydroxide, niobium oxide, niobium hydroxide, rhodium oxide, rhodium hydroxide, vanadium oxide, vanadium hydroxide, palladium oxide, palladium hydroxide, nickel oxide, and nickel hydroxide.

3. A surface treated metallic material according to claim 2, wherein the average diameter of said mesh pattern formed by said cracks is no more than 20 μm and the cracks do not penetrate through the thickness of said metallic compound layer, and moreover wherein the thickness of said metallic compound layer is between 0.1~3.0 μm.

4. A surface treated metallic material comprising a substrate in which at least the surface thereof is made of metal, and a metallic compound layer which is formed on at least a portion of said substrate surface, wherein a scale like pattern of a plurality of upright protrusions is formed on the surface of said metallic compound layer, wherein the width in the major axial direction of said protrusions is between 0.05~0.5 μm, the thickness of said protrusions in a direction orthogonal to the major axis is between 0.1~0.4 μm, and the thickness of said metallic compound layer is between 0.1~1.0 μm, and wherein said metallic compound layer incorporates one, or two or more of, the materials selected from the group consisting of chromium oxide, chromium hydroxide, niobium oxide, niobium hydroxide, rhodium oxide, rhodium hydroxide, vanadium oxide, vanadium hydroxide, palladium oxide, and palladium hydroxide.

5. A surface treated metallic material comprising a substrate in which at least the surface thereof is made of metal, and a metallic compound layer which is formed on at least a portion of said substrate surface, wherein a scale like pattern of a plurality of upright protrusions is formed on the surface of said metallic compound layer, wherein the width in the major axial direction of said protrusions is between 0.05~0.1 μm, the thickness of said protrusions in a direction orthogonal to the major axis is between 0.01~0.03 μm, and the thickness of said metallic compound layer is between 0.05~0.3 μm, and wherein said metallic compound layer incorporates one, or both of, the materials chromium oxide and chromium hydroxide.

6. A surface treated metallic material comprising a substrate in which at least the surface thereof is made of copper or a copper alloy, a chromium compound layer which is formed on at least a portion of said substrate surface, and an intermediate layer incorporating copper and chromium which is formed between said chromium compound layer and said substrate, wherein a scale like pattern of a plurality of upright protrusions of said chromium compound is formed on the surface of said chromium compound layer.

7. An electronic or electrical component which is provided with a member, for which at least the exterior surface thereof is made of metal, a chromium compound layer which is formed on at least a portion of the external surface of said member, and a resin layer which is formed on top of said chromium compound layer, wherein a plurality of minute scaly protrusions are formed on the surface of said chromium layer which bonds with said resin layer, and wherein the elemental ratio of oxygen/chromium incorporated in said chromium layer increases in moving out from the bonding interface with said member to the bonding interface with said resin layer.

8. An electronic or electrical component according to claim 7, wherein the thickness of said chromium compound layer is between 0.05~3.0 μm, the oxygen/chromium elemental ratio within said chromium compound layer at the bonding interface with said member is between 70:30~30:70, and the oxygen/chromium elemental ratio within said chromium compound layer at the bonding interface with said resin is between 90:10~50:50.

9. An electronic or electrical component according to claim 7, wherein the thickness of said chromium compound layer is between 0.05~3.0 μm, the atomic fractions of oxygen and chromium within 0.1 μm of the bonding interface with said member are between 35~75% and 65~25% respectively, and the atomic fractions of oxygen and chromium within 0.1 μm of the bonding interface with said resin layer are between 45~85% and 55~15% respectively.

10. An electronic or electrical component which is provided with a surface treated metallic material, comprising a substrate in which at least the surface thereof is made of metal and a metallic compound layer which is formed on at least a portion of said substrate surface, and in which a mesh pattern of fine cracks is formed across the entire surface thereof, and with a resin layer which is formed on top of said metallic compound layer, wherein the average diameter of said mesh pattern formed by said cracks is no more than 20 μm and the cracks do not penetrate through the thickness of said metallic compound layer, and moreover wherein the thickness of said metallic compound layer is between 0.1~13.0 μm.

11. An electronic or electrical component which is provided with a surface treated metallic material, comprising a substrate in which at least the surface thereof is made of metal and a metallic compound layer which is formed on at least a portion of said substrate surface, and in which a mesh pattern of fine cracks is formed across the entire surface thereof, and with a resin layer which is formed on top of said metallic compound layer, wherein said metallic compound layer incorporates strontium and either one, or two or more of, the materials selected from the group consisting of chromium oxide, chromium hydroxide, niobium oxide, niobium hydroxide, rhodium oxide, rhodium hydroxide, vanadium oxide, vanadium hydroxide, palladium oxide, palladium hydroxide, nickel oxide, and nickel hydroxide.

12. An electronic or electrical component which is provided with a surface treated metallic material according to claim 11, wherein the average diameter of said mesh pattern formed by said cracks is no more than 20 μm and the cracks do not penetrate through the thickness of said metallic compound layer, and moreover wherein the thickness of said metallic compound layer is between 0.1~3.0 μm.

13. An electronic or electrical component which is provided with a surface treated metallic material, comprising a substrate in which at least the surface thereof is made of metal and a metallic compound layer which is formed on at least a portion of said substrate surface, and in which a scale like pattern of a plurality of upright protrusions is formed across the surface thereof, and with a resin layer which is formed on top of said metallic compound layer, wherein the width in the major axial direction of said protrusions is between 0.05~0.5 μm, the thickness of said protrusions in a direction orthogonal to the major axis is between 0.1~0.4 μm, and the thickness of said metallic compound layer is between 0.1~1.0 μm, and wherein said metallic compound layer incorporates one, or two or more of, the materials selected from the group consisting of chromium oxide, chromium hydroxide, niobium oxide, niobium hydroxide, rhodium oxide, rhodium hydroxide, vanadium oxide, vanadium hydroxide, palladium oxide, and palladium hydroxide.

14. An electronic or electrical component which is provided with a surface treated metallic material, comprising a substrate in which at least the surface thereof is made of metal and a metallic compound layer which is formed on at least a portion of said substrate surface, and in which a scale like pattern of a plurality of upright protrusions is formed across the surface thereof, and with a resin layer which is formed on top of said metallic compound layer, wherein the width in the major axial direction of said protrusions is between 0.05~0.1 μm, the thickness of said protrusions in a direction orthogonal to the major axis is between 0.01~0.03 μm, and the thickness of said metallic compound layer is between 0.05~0.3 μm, and wherein said metallic compound layer incorporates one, or both of, the materials chromium oxide and chromium hydroxide.

* * * * *